(12) United States Patent
Cheng et al.

(10) Patent No.: US 12,707,713 B2
(45) Date of Patent: Aug. 11, 2026

(54) STACKED DEVICE STRUCTURES AND METHODS FOR FORMING THE SAME

(71) Applicant: Taiwan Semiconductor Manufacturing Company Limited, Hsinchu (TW)

(72) Inventors: Chung-Liang Cheng, Hsinchu (TW); Ying-Hsun Chen, Taoyuan City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 72 days.

(21) Appl. No.: 18/771,031

(22) Filed: Jul. 12, 2024

(65) Prior Publication Data

US 2024/0363631 A1 Oct. 31, 2024

Related U.S. Application Data

(63) Continuation of application No. 17/242,756, filed on Apr. 28, 2021, now Pat. No. 12,119,348.

(51) Int. Cl.

| | |
|---|---|
| ***H10D 84/85*** | (2025.01) |
| ***H10D 30/67*** | (2025.01) |
| ***H10D 84/01*** | (2026.01) |
| ***H10D 84/03*** | (2025.01) |

(52) U.S. Cl.

CPC ......... *H10D 84/85* (2025.01); *H10D 30/6735* (2025.01); *H10D 84/0186* (2025.01); *H10D 84/038* (2025.01)

(58) Field of Classification Search

CPC ............... H10D 84/85; H10D 30/6735; H10D 84/0186; H10D 84/038

See application file for complete search history.

(56) References Cited

U.S. PATENT DOCUMENTS

| | | | | |
|---|---|---|---|---|
| 2020/0006478 | A1 | 1/2020 | Hsu et al. | |
| 2020/0126987 | A1* | 4/2020 | Rubin | H10D 84/0186 |
| 2020/0144264 | A1 | 5/2020 | Li et al. | |
| 2021/0091080 | A1 | 3/2021 | Dewey et al. | |
| 2022/0052203 | A1 | 2/2022 | More | |

* cited by examiner

*Primary Examiner* — Jay C Kim
*Assistant Examiner* — Woo K Lee
(74) *Attorney, Agent, or Firm* — The Marbury Law Group, PLLC

(57) ABSTRACT

A complementary metal oxide semiconductor (CMOS) device includes a transistor of a first type formed over a first substrate, and a transistor of a second type formed over a second substrate. The CMOS device is formed when the transistor of the first type formed on the first substrate is bonded to the transistor of the second type formed over the second substrate.

20 Claims, 77 Drawing Sheets

PMOS FINFET

PMOS FINFET

300
Bond Interface
180
100a
200

602
1502
Memory
200
Bond
Interface
200

180
100a
200
Logic
1600
SRAM

STACKED DEVICE STRUCTURES AND METHODS FOR FORMING THE SAME

RELATED APPLICATIONS

This application is a continuation application of U.S. patent application Ser. No. 17/242,756 entitled "Stacked Device Structures and Methods for Forming the Same" filed on Apr. 28, 2021, the entire contents of which are hereby incorporated by reference for all purposes.

BACKGROUND

Steady and constant improvements and advances in technology place additional demands on semiconductor fabrication techniques to increase the density of transistors in an integrated semiconductor devices. However, as technology advances, using dimension shrink to increase transistor density becomes more and more challenging due to the physical and material limitations on dimension shrink. Thus, novel configurations are needed to further increase transistor density. The use of complementary metal oxide semiconductor (CMOS) transistors is popular for integrated circuits because they are energy efficient. CMOS transistors typically comprise adjacent n-type field effect transistors (NMOS) and p-type field effect transistors (PMOS) transistors in located in the same horizontal plane. Thus, typical CMOS devices have a lower transistor density than devices using only PMOS or NMOS transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 22 is a vertical cross-sectional view illustrating a step of flipping the device illustrated in FIG. 21 in accordance with various embodiments of the disclosure.

FIG. 30 is a vertical cross-sectional view illustrating a step of depositing a photoresist on the device structure illustrated in FIG. 29 in accordance with various embodiments of the disclosure.

DETAILED DESCRIPTION

Figure 1:
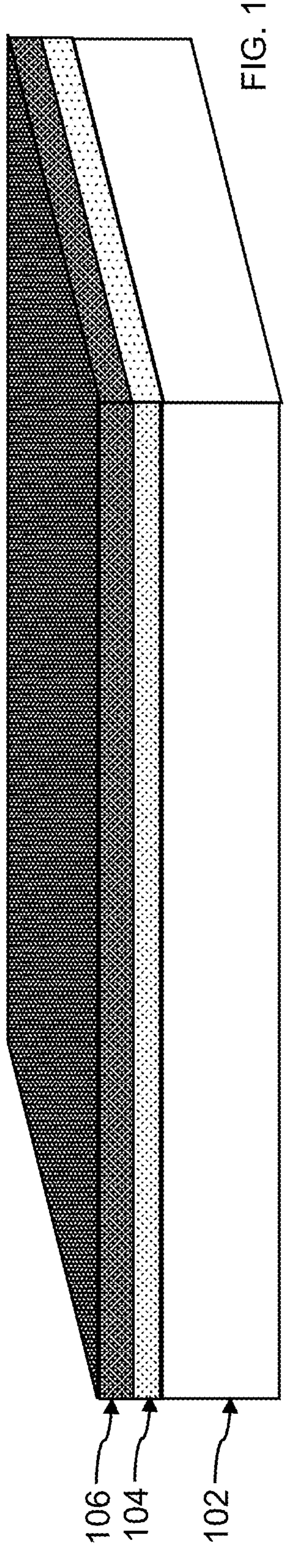
FIG. 1 is a perspective view illustrating a step of providing a substrate having an etch stop layer and a silicon layer on the etch stop layer in accordance with various embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For advanced technology, using dimension shrink to increase transistor density become more and more challenging due to physical and material limitations. Hence, a stacked device structure may provide a significantly better approach to increase transistor density in a device. The embodiments disclosed herein provide a semiconductor device structure and method to perform stacked device structure for increased transistor device density. The various embodiment methods may include: (1) using semiconductor on insulator (SOI) (or SiGe/Si EPI) as a substrate for n-type metal oxide semiconductor (nMOS) gate-all-around (GAA) process and complete front end of line (FEOL) and middle end of line (MEOL) processes (2) bond the formed nMOS GAA transistor with carrier wafer and flip them for backside Si thin down and stop on SOI OX (or SiGe) layer (3) backside contact patterning and contact silicide/plug formation (4) use Bulk Si as second substrate for p-type metal oxide semiconductor (pMOS) GAA (or Fin) FET process and complete FEOL & MEOL process (5) use nMOS GAA as top wafer to bond with pMOS GAA as bottom wafer (6) remove temporary carrier wafer and complete back end-of-line (BEOL) processes.

Generally, the structures and methods of the present disclosure can be used to form complimentary metal-oxide semiconductor field effect transistor (CMOS) semiconductor devices, e.g. integrated circuit CMOS devices, with an increased transistor density. The increase in transistor density of the CMOS devices of the present disclosure may be achieved by vertically stacking NMOS transistors above PMOS transistors or vice versa to form the CMOS devices.

In various embodiments, the NMOS transistors and the PMOS transistors may be separately fabricated on respective substrates and then bonded to each other to form CMOS devices. The resulting CMOS devices may have a higher transistor density as compared to CMOS devices in which the NMOS and PMOS transistors may be fabricated in a side by side manner on the same substrate in the same plane. Other devices, such as metal-insulator-metal memory devices may be formed on either of the substrates containing the NMOS or PMOS transistors and then may be incorporated into the finished integrated CMOS devices. As discussed in more detail below, the NMOS and PMOS transistors may include gate all around (GAA) transistors which have gate electrodes that may be formed on four sides (i.e. surround) of at least a portion of the channel of the transistor. In addition, or alternatively, the NMOS and PMOS transistors may include fin field effect transistors (FinFETS), which include fin shaped electrodes which may be formed on at least two, and often, three sides of a least a portion of the channel of the transistor.

Referring to the figures below, methods for making an exemplary structure according to an embodiment of the present disclosure are illustrated. Referring to FIG. 1, an embodiment method includes providing a substrate 102, depositing an insulating layer 104 on the substrate 102 and depositing a silicon epitaxial layer 106 on the insulating layer 104. The substrate 102 can be a semiconductor substrate such as a commercially available silicon substrate. The substrate 102 may be a bulk silicon substrate, silicon on insulator (SOI), silicon germanium (SiGe) or an epitaxial wafer (SiEPI) wafer. The etch stop material may be any suitable material which etches more slowly than the substrate material. Exemplary materials for the insulating layer 104 include B doped SiGe, an oxide or a nitride. The insulating layer 104 may be made by any suitable method such as chemical vapor deposition (CVD) or plasma enhanced chemical vapor deposition (PECVD). The silicon layer 106 may be deposited by any suitable method, such as chemical vapor deposition (CVD) or plasma enhanced chemical vapor deposition (PECVD). In some embodiments, the silicon layer 106 may a thickness of approximately 8 to 15 nm.

Figure 2:
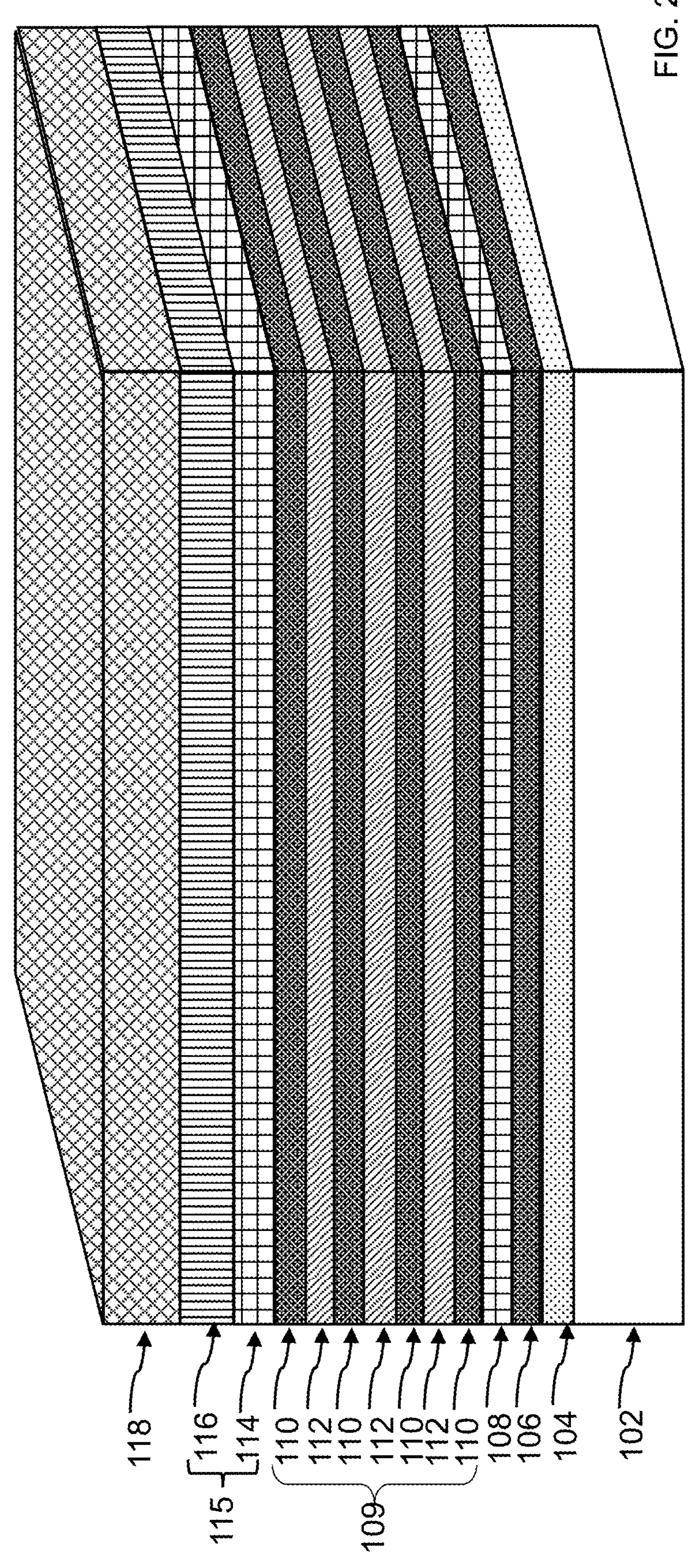
FIG. 2 is a perspective view illustrating a step of depositing an insulating layer over the silicon layer, depositing a silicon layer over insulating layer, depositing a stack of alternating sacrificial and silicon layers over the insulating layer, depositing a hard mask layer over the stack of alternating sacrificial and silicon layers and depositing a photoresist layer over the hard mask layer in accordance with various embodiments of the disclosure.

Referring to FIG. 2, the method includes depositing an insulating layer 108 over the silicon epitaxial layer 106, a stack 109 of alternating silicon layers 110 and sacrificial layers 112 over the insulating layer 108, depositing a hard mask layer 115 over the stack 109 of alternating silicon layers 110 and sacrificial layers 112 and depositing a photoresist layer 118 over the hard mask layer 115. In some embodiments, the hard mask layer 115 may include one or more silicon nitride layers 114 and/or one or more silicon oxide layers 116. The sacrificial layers 112 may be made of any material that may be selectively etched relative to silicon used in silicon layers 110. Exemplary sacrificial layer materials may include oxides or SiGe alloys. In various embodiments, the alternating sacrificial and silicon layers 110 and sacrificial layers 112 may be epitaxially grown. As illustrated in the figures for purposes of illustration only, the stack 109 of alternating silicon layers 110 and sacrificial layers 112 may include four layers each of alternating silicon layers 110 and sacrificial layers 112. Any number of layers, such as 1-16 layers each, such as 4-8 layers may be provided. The stack 109 of alternating silicon layers 110 and sacrificial layers 112 may be grown by molecular beam epitaxy, metalorganic chemical vapor deposition or any other suitable epitaxial process that are within the contemplated scope of disclosure.

In some embodiments, either of the silicon layers 110 and sacrificial layers 112 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. Other suitable materials are within the contemplated scope of disclosure. As discussed above, the materials of the silicon layers 110 and sacrificial layers 112 may be chosen to provide varying oxidation and etch selectivity properties. In various embodiments, the silicon layers 110 and sacrificial layers 112 may be substantially dopant-free (i.e., having an extrinsic dopant concentration from about 0 $cm^{-3}$ to about $1\times10^{15}$ $cm^{-3}$), where for example, no intentional doping is performed during the epitaxial growth process.

The alternating silicon layers 110 and sacrificial layers 112 may be substantially uniform in thickness. In some embodiments, the silicon layers 110 and sacrificial layers 112 may have a thickness range of about 6-12 nm. As described in more detail below, the silicon layers 110 may serve as channel region(s) for a subsequently formed multi-gate device and the thickness of the silicon layers 110 may be chosen based on device performance considerations. The sacrificial layers 112 may serve to define a gap distance between adjacent channel region(s) for a subsequently-formed multi-gate device and the thickness of the sacrificial layers 112 may be chosen based on device performance considerations.

Figure 3:
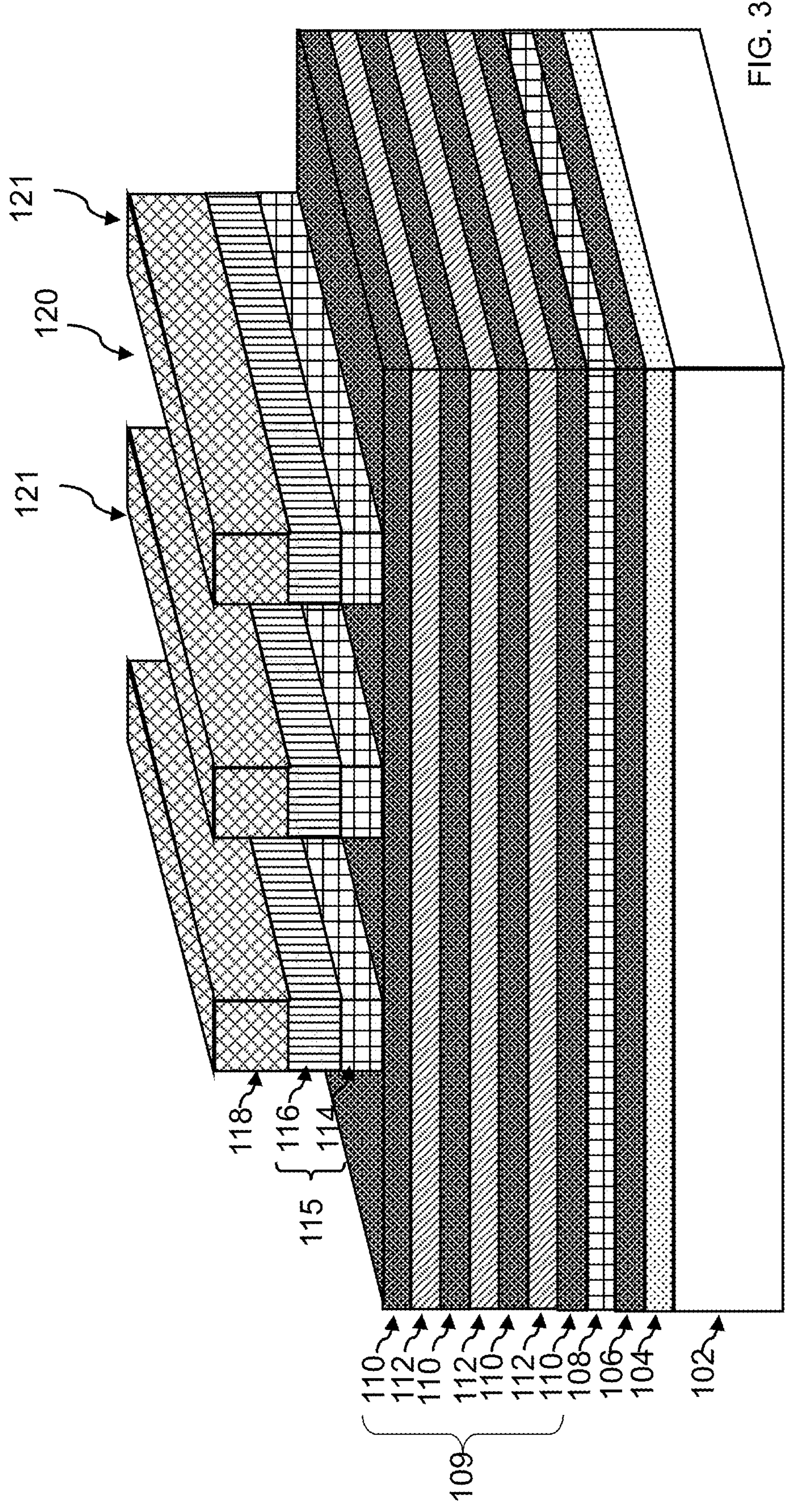
FIG. 3 is a perspective view illustrating a step of patterning the photoresist and hard mask layer(s) in accordance with various embodiments of the disclosure.

Referring to FIG. 3, the photoresist layer 118 may be patterned and used to form rails 121, wherein the rails 121 include the hard mask layer(s) 115. As discussed above, in some embodiments as illustrated in the figures, the hard mask layer 115 may include one or more silicon nitride layers 114 and/or one or more silicon oxide layers 116. As a result of the patterning and formation of rails 121, trenches 120 may be formed between the rails 121. The rails may have a width of 1-10 nm, and more preferably in a range of 1-5 nm, although greater or narrower width may be used. After forming the rails 121 and trenches 120, the photoresist layer 118 may be removed. The photoresist layer 118 may be removed by ashing or by dissolving with a solvent.

Figure 4:
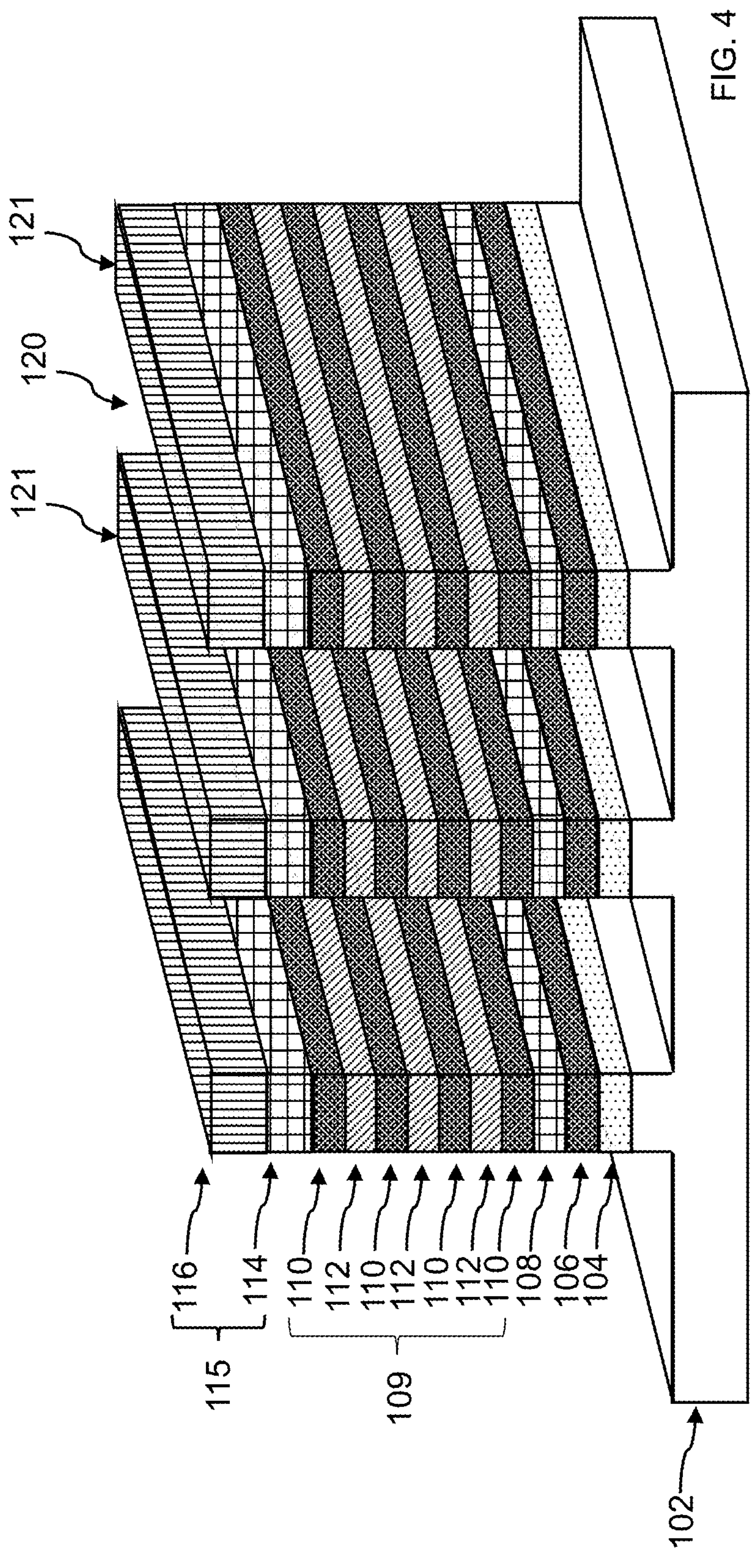
FIG. 4 is a perspective view illustrating a step of using the patterned hard mask layer(s) to form rails in the underlying layers in accordance with various embodiments of the disclosure.

Referring to FIG. 4, the hard mask(s) 115 may be used to pattern the stack 109 of alternating silicon layers 110 and sacrificial layers 112 as well as the insulating layer 108, the silicon epitaxial layer 106 and the insulating layer 104. Thus, rails 121 may be formed from the hard mask layer 115 (including one or more silicon nitride layers 114 and/or one or more silicon oxide layers 116), alternating on silicon layers 110 and sacrificial layers 112 as well as the insulating layer 108, the silicon epitaxial layer 106 and the insulating layer 104. In an embodiment, a portion of the substrate 102 may also be etched. Etching may performed by dry etching, e.g. reactive ion etching, wet etching or a combination of dry etching and wet etching.

Figure 5:
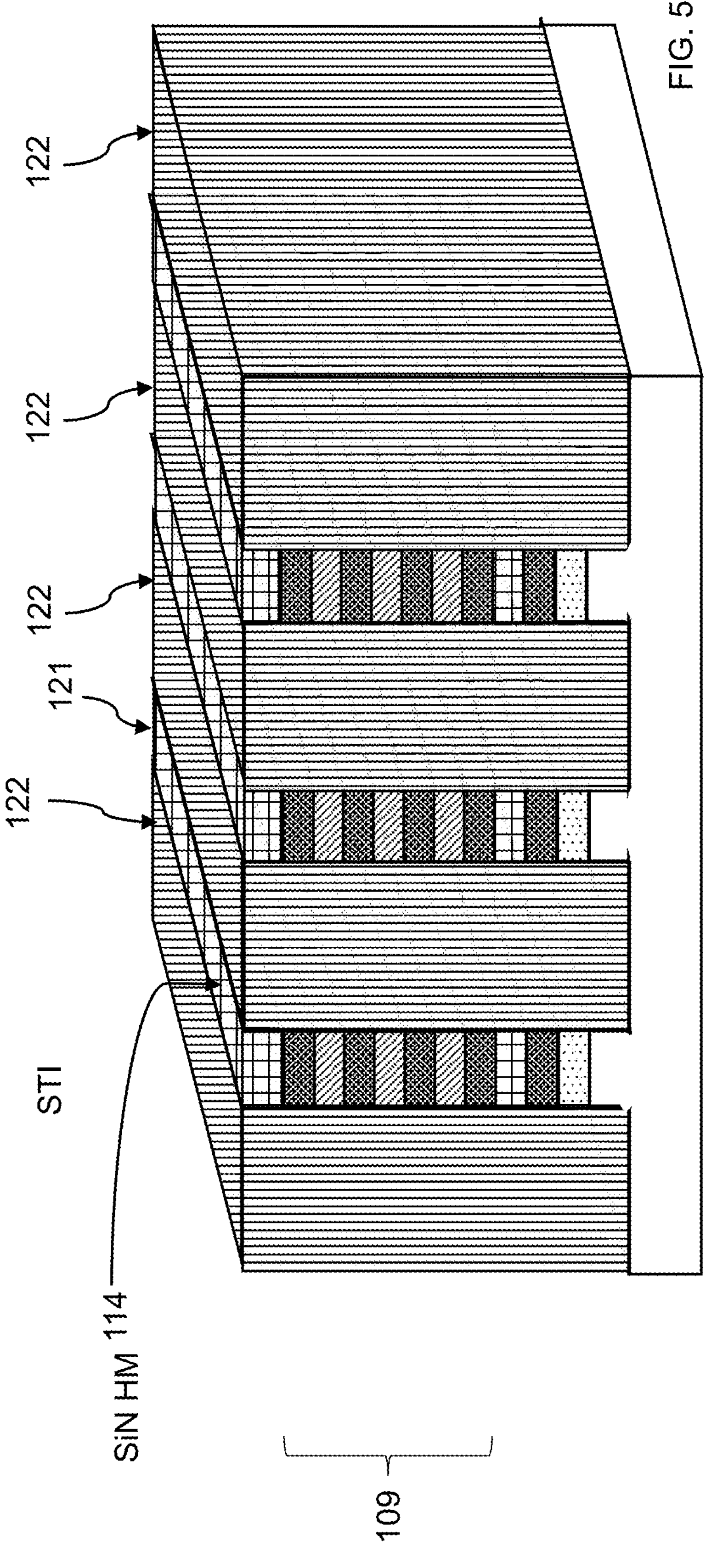
FIG. 5 is a perspective view illustrating a step of filling in trenches between the rails with a dielectric fill in accordance with various embodiments of the disclosure.

Referring to FIG. 5, a dielectric fill material 122 may be formed in the trenches 120 located between rails 121. In some embodiments, the dielectric fill material 122 may be deposited in the trenches 120. In alternative embodiments, the dielectric fill material 122 may be formed by oxidizing the sidewalls of the rails 121. The lower portion of the dielectric fill material 122 may for shallow trench isolation (STI) features in the substrate 102.

Figure 6:
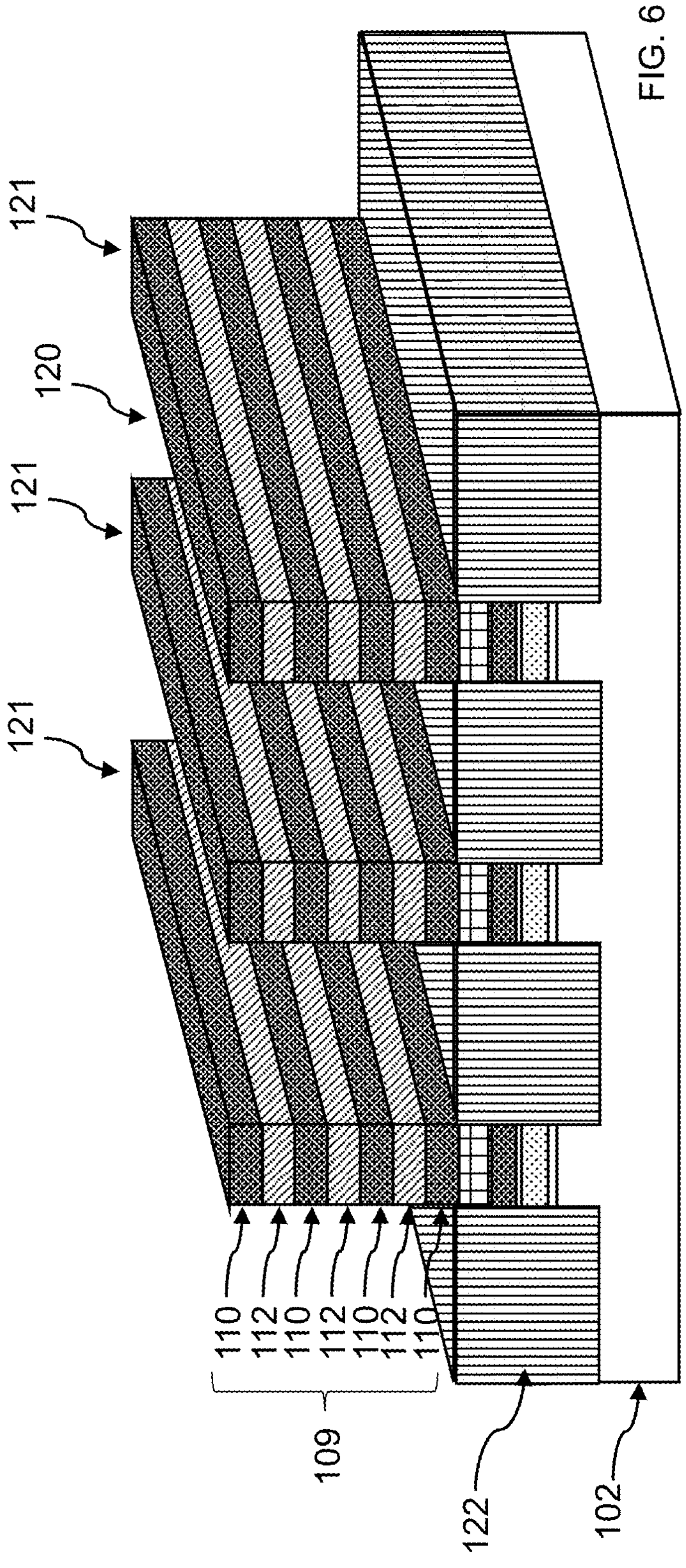
FIG. 6 is a perspective view illustrating a step of removing portions of the fill between the rails to expose rails of alternating sacrificial and silicon layers forming shallow trench insulation features in accordance with various embodiments of the disclosure in accordance with various embodiments of the disclosure.

Referring to FIG. 6, the dielectric fill material 122 may be recessed to expose sidewalls of the rails 121 of the stack 109 of alternating silicon layers 110 and sacrificial layers 112. The dielectric fill material 122 may be recessed by dry etching or wet etching. A photoresist layer (not shown) may first be deposited and patterned to protect the rails 121 of the stack 109 of alternating sacrificial and silicon layers 110, 112 during etching. The recessed dielectric fill material 122 forms the shallow trench isolation features discussed above.

Figure 7:
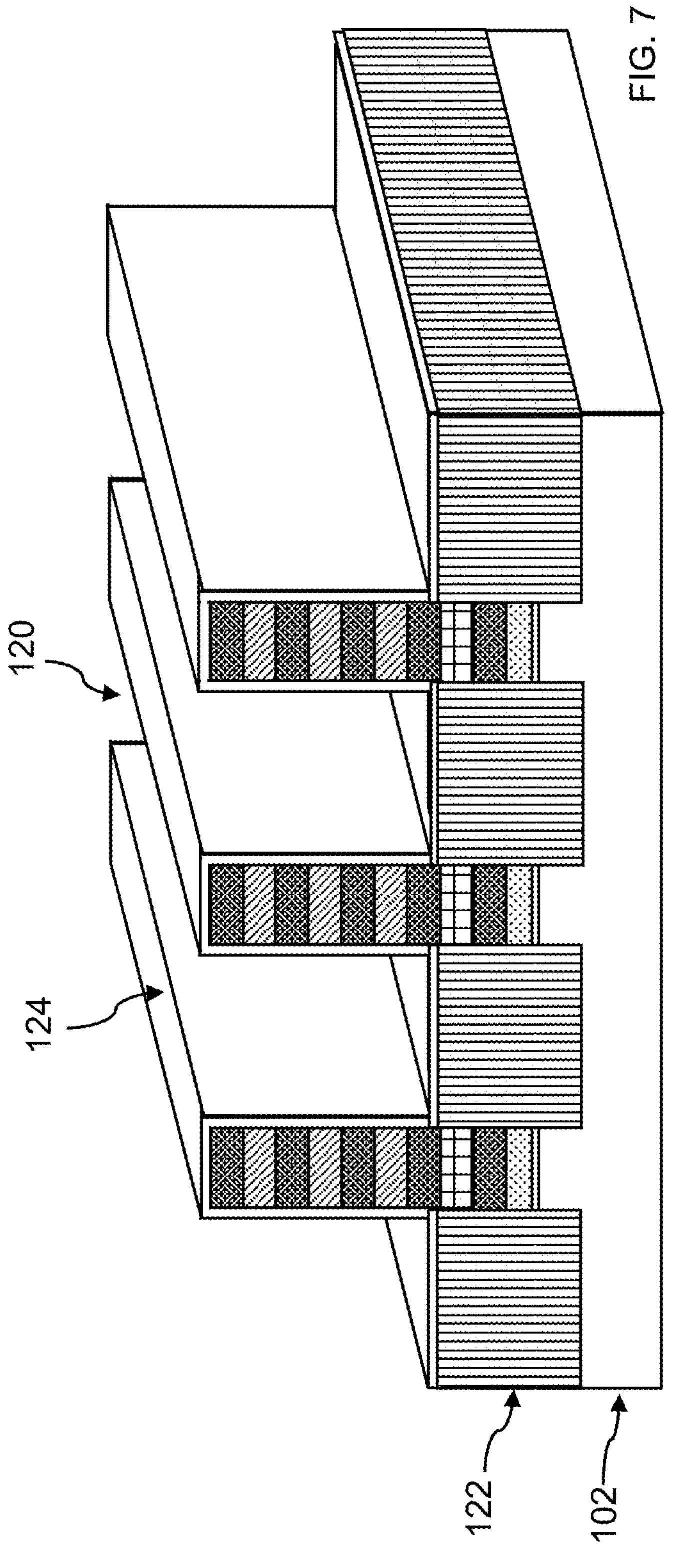
FIG. 7 is a perspective view illustrating a step of covering the rails of alternating sacrificial and silicon layers with a conformal dielectric layer in accordance with various embodiments of the disclosure.

Referring to FIG. 7, a dielectric layer 124 may formed over the top and sidewalls of the rails 121 and the exposed top surface of the shallow trench isolation features 122. In some embodiments, the dielectric layer 124 may include any of $SiO_2$, silicon nitride, a high-k dielectric material or other suitable material. In various embodiments, the dielectric layer 124 may be deposited by a CVD process, sub-atmospheric CVD (SACVD) process, a flowable CVD process, an atomic layer deposition (ALD) process, a physical vapor deposition (PVD) process, or other suitable process. By way of example, the dielectric layer 124 may be used to prevent damage to the rails 121 by subsequent processing (e.g., subsequent formation of the dummy gate stack discussed in more detail below).

Figure 8:
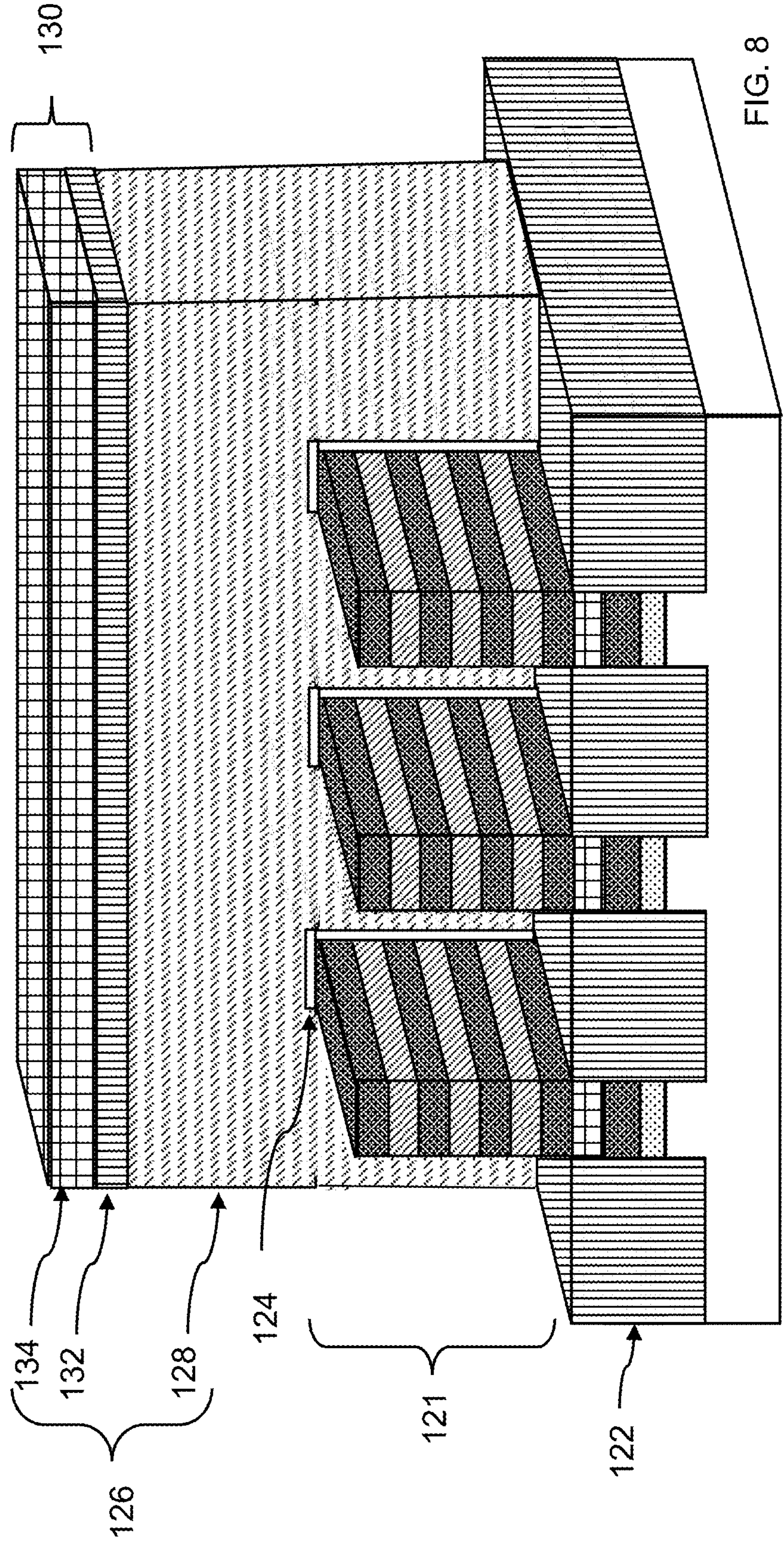
FIG. 8 is a perspective view illustrating a step of depositing a dummy gate stack over a portion of the rails of sacrificial and silicon layers in accordance with various embodiments of the disclosure.

Referring to FIG. 8, a dummy gate stack 126 may be formed over a central portion of the rails 121. The dummy gate stack 126 may include an electrode layer 128 and a hard mask layer 130, which may include an oxide hard mask 132 and a nitride hard mask 134. The dummy gate stack 126 may be replaced in later steps with a final gate stack. The dummy gate stack 126 protects a channel while processing non-channel portions of the device. In some embodiments, the dummy gate stack 126 may be formed by various process steps such as layer deposition, patterning, etching, as well as other suitable processing steps. Exemplary layer deposition processes includes CVD (including both low pressure CVD and plasma-enhanced CVD), PVD, ALD, thermal oxidation, e-beam evaporation, or other suitable deposition techniques, or combinations thereof. As illustrated in FIG. 8, exposed portions of the dielectric layer 124 that cover rails 121 may be removed after forming the dummy gate stack 126. In this manner portions of the dielectric layer 124 covered by the dummy gate stack 126 remain.

Figure 9:
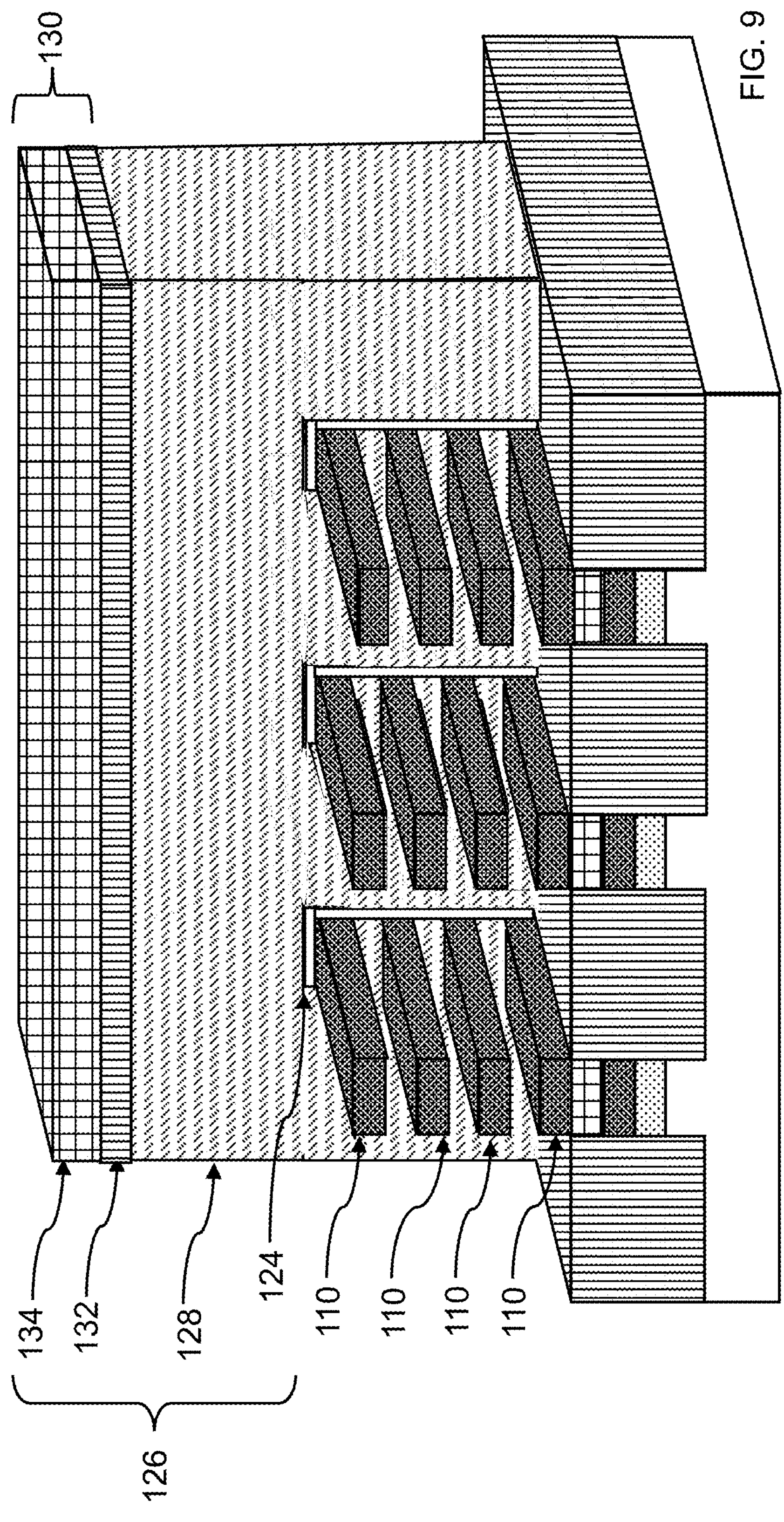
FIG. 9 is a perspective view illustrating a step of removing exposed portions of the sacrificial layers in accordance with various embodiments of the disclosure.

Referring to FIG. 9, the exposed portions of the sacrificial layers 112 in the rails 121 may be removed to subsequently form active (i.e. source and drain) regions of the gate all around device. In an embodiment, the sacrificial layers 112 may be removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by an $O_3$ clean and then SiGeOx removed by an etchant such as $NH_4OH$. In an embodiment, the sacrificial layers 112 may be SiGe, which may allow for the selective removal of the sacrificial layers 112.

Figure 10:
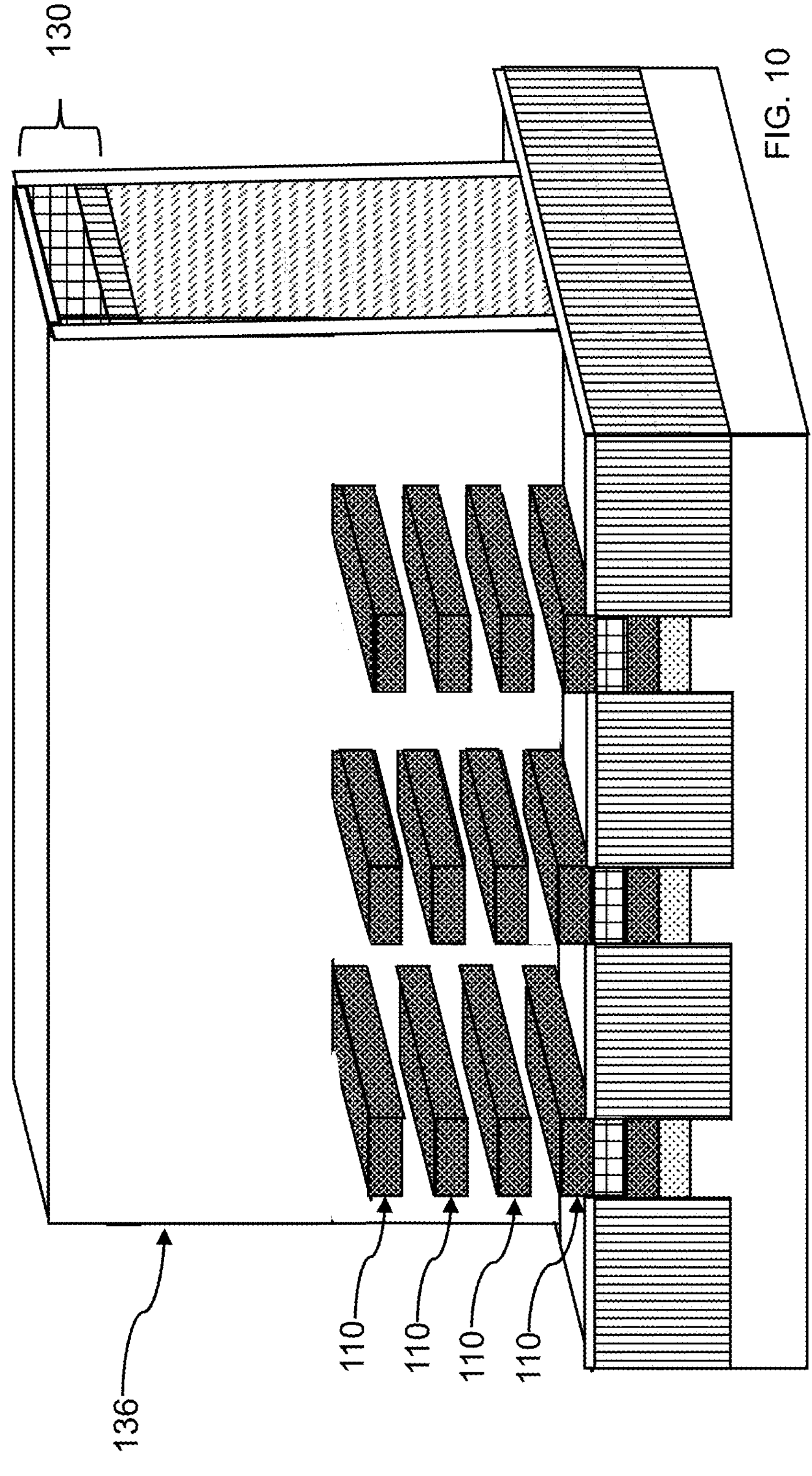
FIG. 10 is a perspective view illustrating a step of covering the dummy gate stack and the exposed surface of the shallow trench isolation features with an inner spacer material layer.
Figure 11:
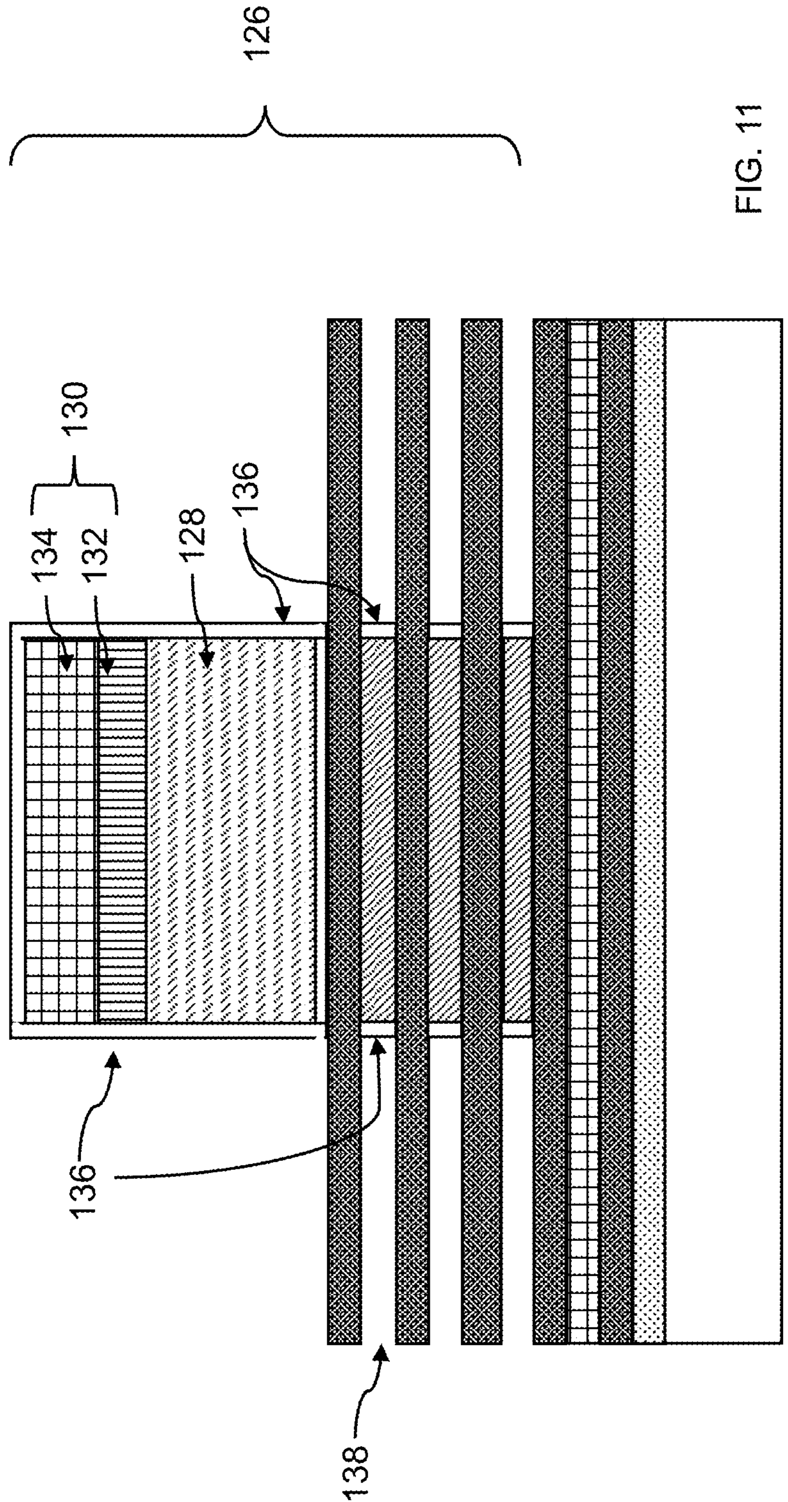
FIG. 11 is a vertical cross-sectional view of the structure of FIG. 10 illustrating a cross-section of the dummy gate stack and the rails of silicon in accordance with various embodiments of the disclosure.

Referring to FIG. 10, a dielectric spacer layer 136 may be deposited over the dummy gate stack 126. As discussed in more detail below, the dielectric spacer layer 136 separates the gate electrode from the active regions. The dielectric spacer layer 136 may be made of any suitable dielectric material, for example SiCN. Other suitable dielectric materials are within the contemplated scope of disclosure. FIG. 11 is a vertical cross-sectional view of the structure of FIG. 10. illustrating a vertical cross-section of the dummy gate stack 126 and the remaining rails 121 of silicon layers 110. As illustrated in FIG. 10, the removal of the sacrificial layers 112 leaves gaps 138 between the rails 121 of silicon layer 110 material.

Figure 12:
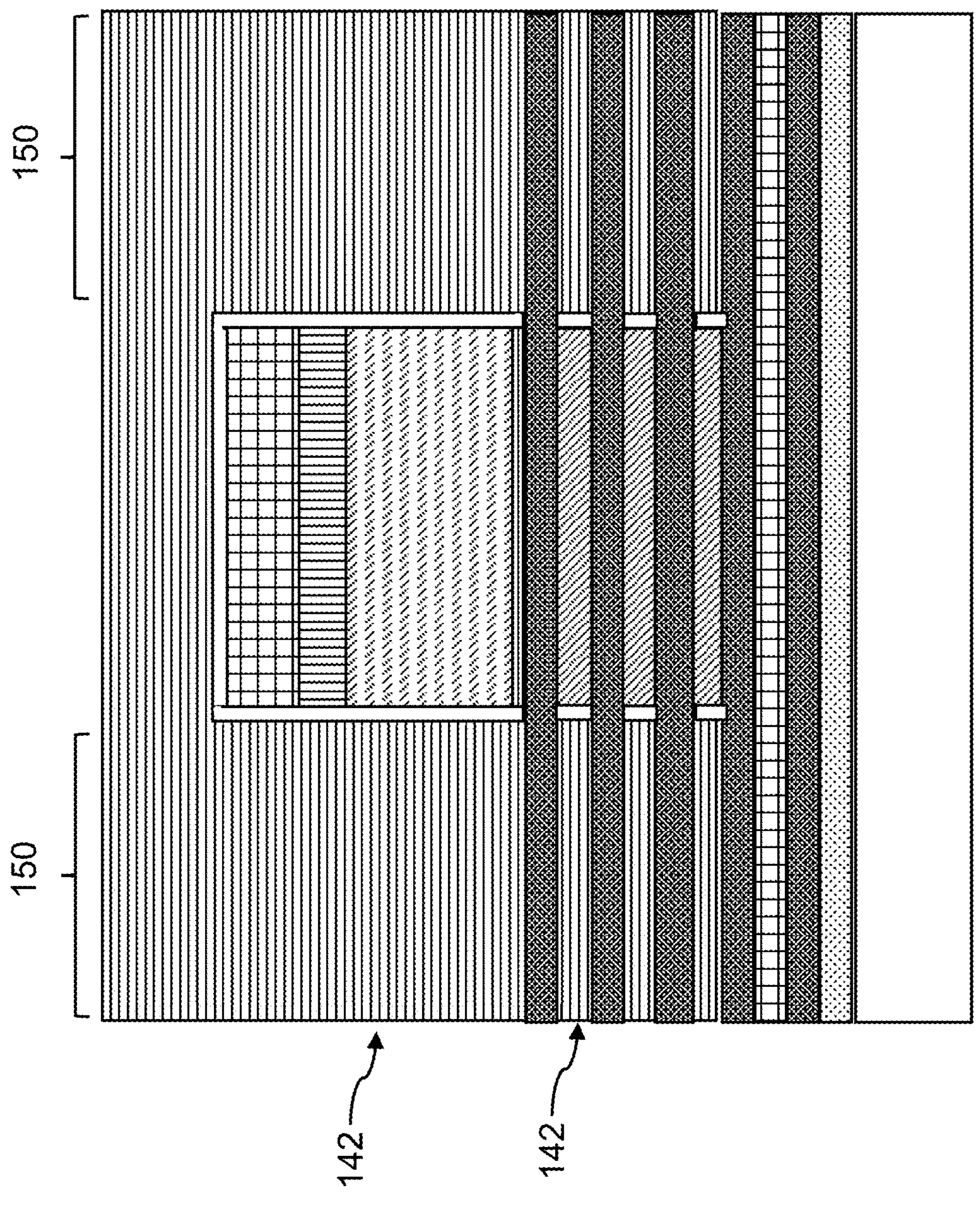
FIG. 12 is a vertical cross-sectional view illustrating a step of depositing a dielectric material over the exposed portions of the rails with a dielectric layer.
Figure 13:
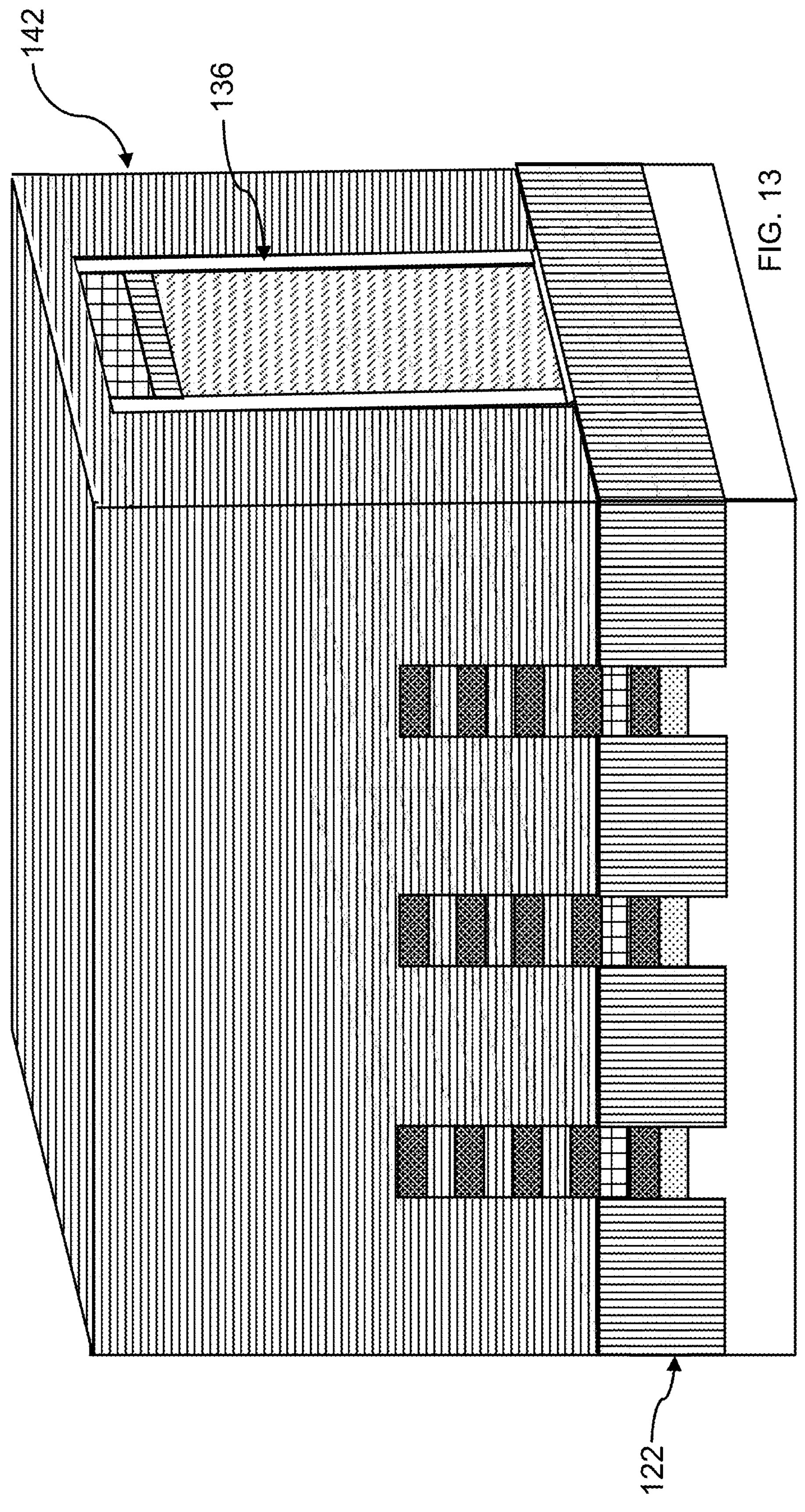
FIG. 13 is a perspective view of the intermediate structure of FIG. 12 in accordance with various embodiments of the disclosure.

Referring to FIG. 12, a dielectric material 142 may be deposited over the intermediate structure illustrated in FIG. 11. The dielectric material 142 may serve to protect the portions of the device where the active regions 150 are to be subsequently formed while the dummy gate stack 126 may be removed and the gate stack 148 formed in subsequent processing operations. FIG. 13 illustrates a perspective view of the intermediate structure illustrated in FIG. 12. The dielectric material 142 may be made of any suitable material, such as an oxide or nitride. However, other suitable dielectric materials are within the contemplated scope of disclosure.

Figure 14:
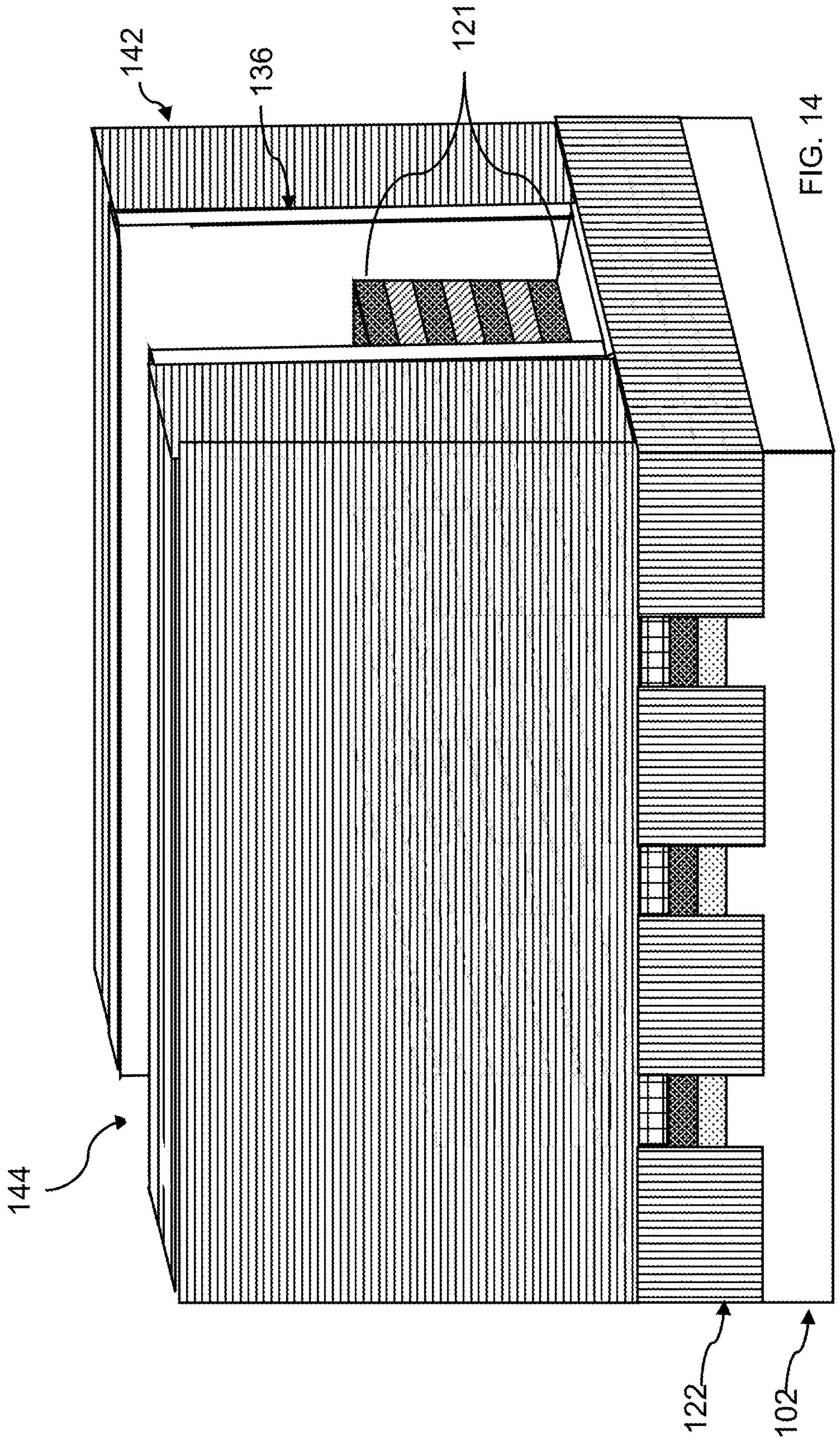
FIG. 14 is a perspective view illustrating a step of removing the dummy stack in accordance with various embodiments of the disclosure.

Referring to FIG. 14, the hard mask layer 130, which may include oxide hard mask 132 and a nitride hard mask 134, may be removed, for example, by performing a chemical mechanical (CMP) polishing step. Thus, a trench 144 may be formed between dielectric spacer layers 136 by removing the electrode material 128. As illustrated in FIG. 14, rails 121 of stacks 109 that include alternating silicon layers 110 and sacrificial layers 112 remain. The trench 144 may be formed by a selective wet etch, a selective dry etch or a combination of selective wet and dry etching.

Figure 15:
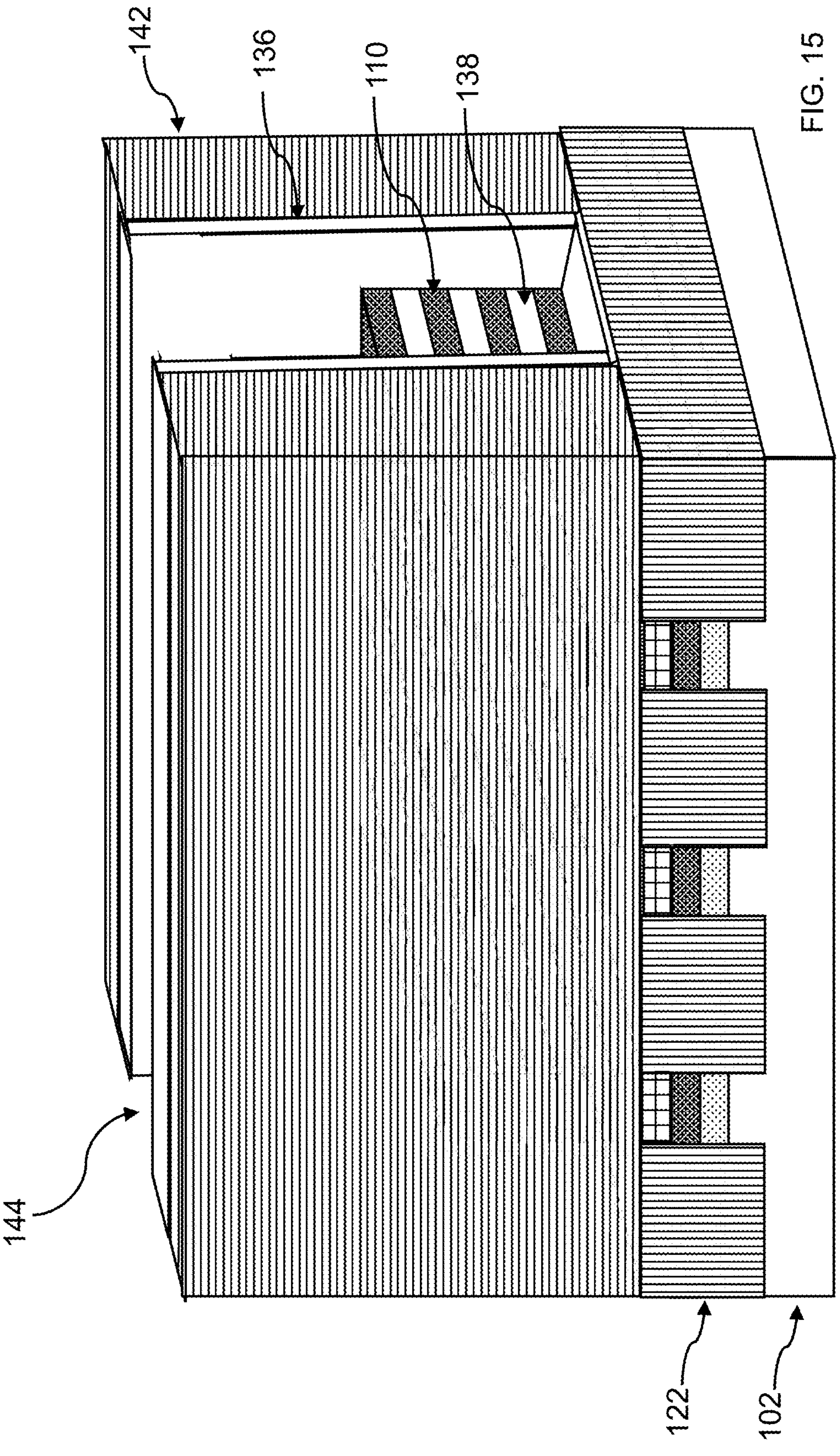
FIG. 15 is a perspective view illustrating a step of removing the sacrificial material from rails exposed in a channel portion of the rails in accordance with various embodiments of the disclosure.

Referring to FIG. 15, the sacrificial layers 112 may be removed from the rails 121 of stacks 109 of alternating silicon layers 110 and sacrificial layers 112. In this manner, the remaining silicon layers 110 may form individual nanowires between gaps 138 formed in the trench 144. The sacrificial layers 112 may be removed to form gaps 138 by a selective wet etch, a selective dry etch or a combination of selective wet and dry etching. In some embodiments, the selective wet etching includes HF. In an embodiment, the sacrificial layers 112 may be SiGe allowing for the selective removal of the SiGe sacrificial layers 112.

Figure 16:
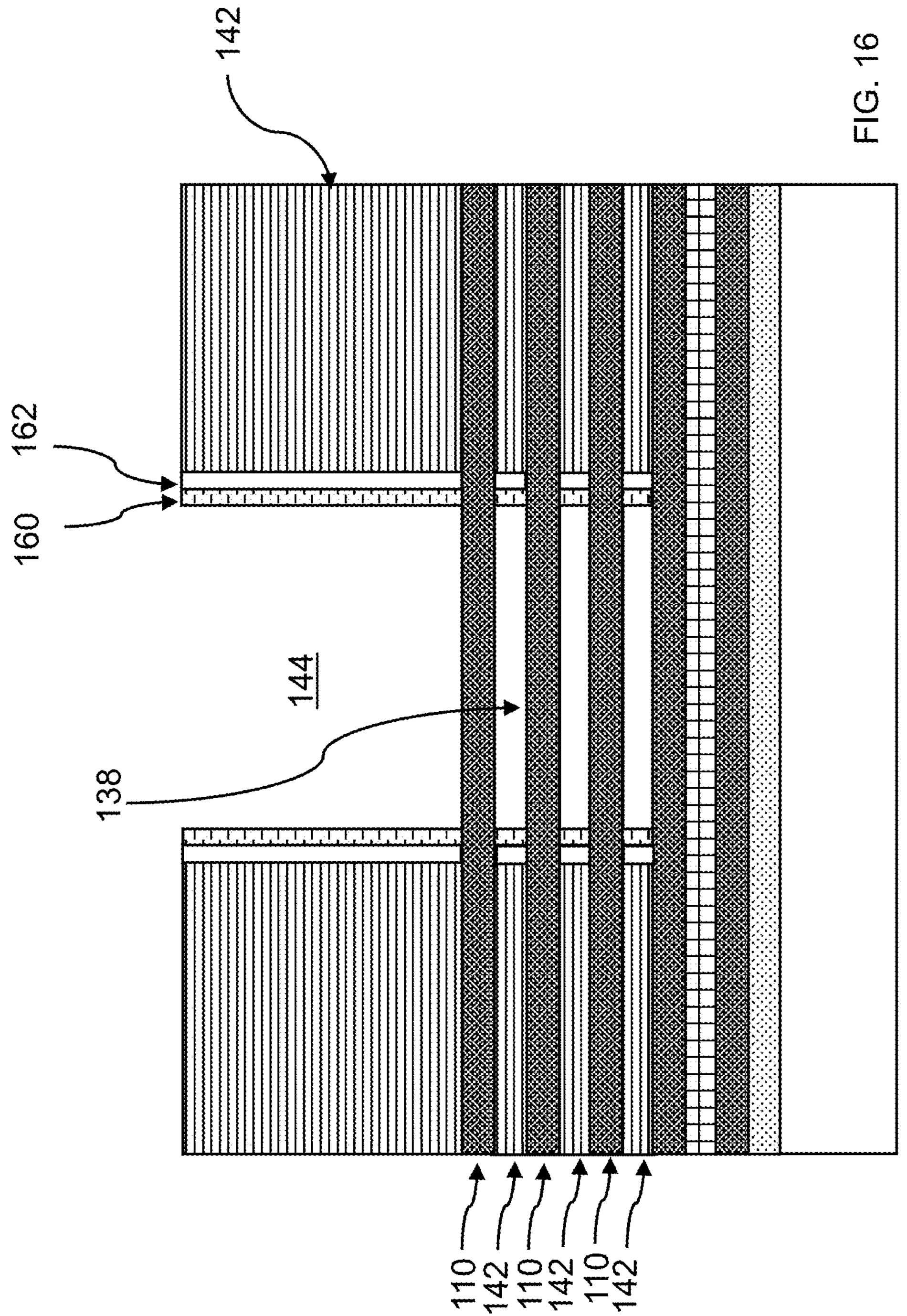
FIG. 16 is a vertical cross-sectional view illustrating a step of removing the dielectric spacer layer and depositing a conformal spacer layer and a conformal high-k dielectric layer in the trench in accordance with various embodiments of the disclosure.

Referring to FIG. 16, the dielectric spacer layer 136 may be removed, such as by selective etching. Next, a spacer layer 162 may be conformally deposited on the sidewalls of the trench 144. Then, a high-k dielectric layer 160 may be conformally deposited on the spacer layer 162. High-k gate dielectrics, as used and described herein, include dielectric materials having a high dielectric constant, for example, greater than that of thermal silicon oxide (3.9). The spacer layer 162 may be made of any suitable material, for example, SiCN, although other suitable materials are within the contemplated scope of disclosure. In various embodiments, the dielectric spacer layer 136 may be retained rather than removed and the high-k dielectric layer conformally deposited on the dielectric spacer layer 136.

Figure 17:
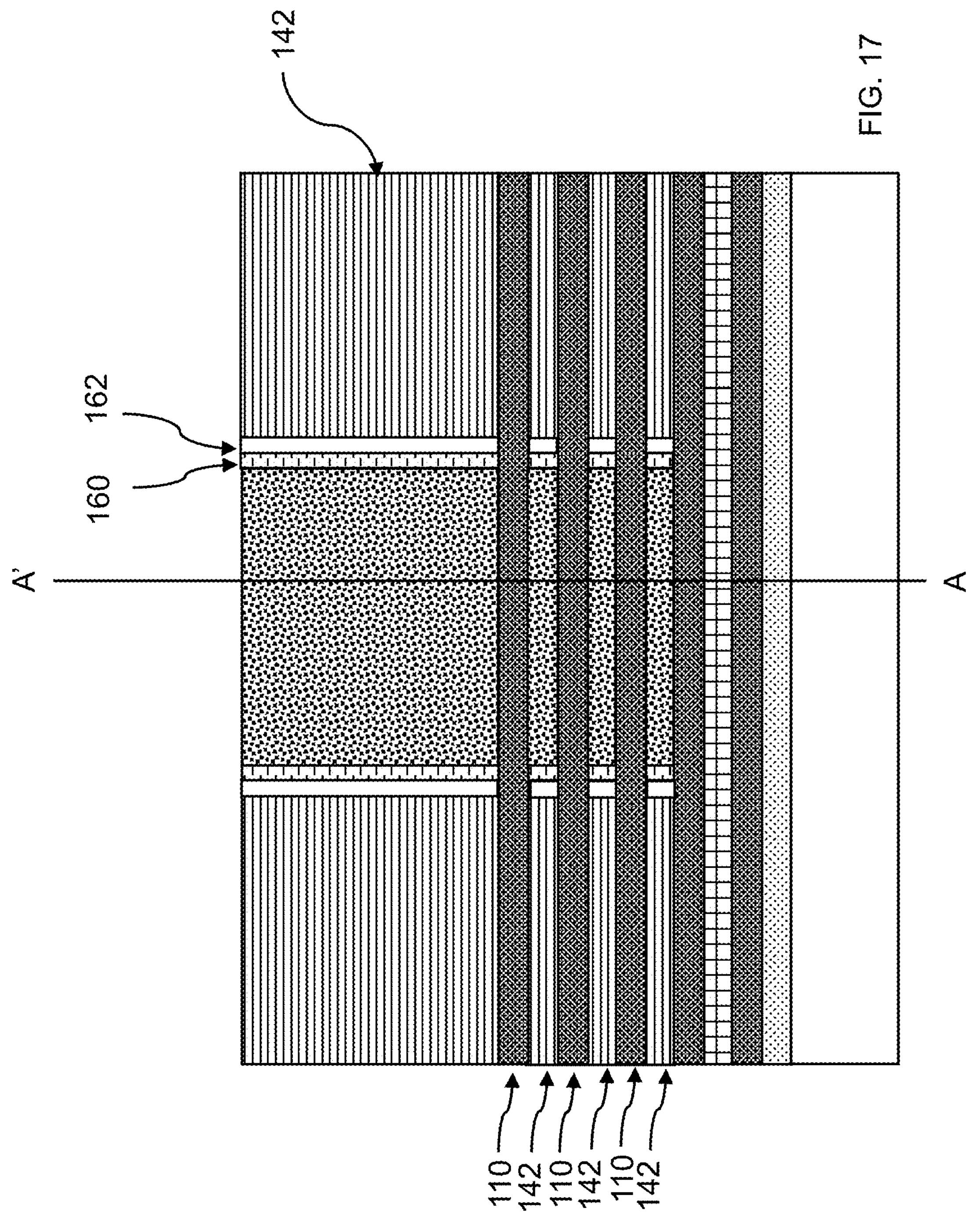
FIG. 17 is a vertical cross-sectional view illustrating a step of depositing gate material between the rails of silicon material and filling the trench in accordance with various embodiments of the disclosure.
Figure 18:
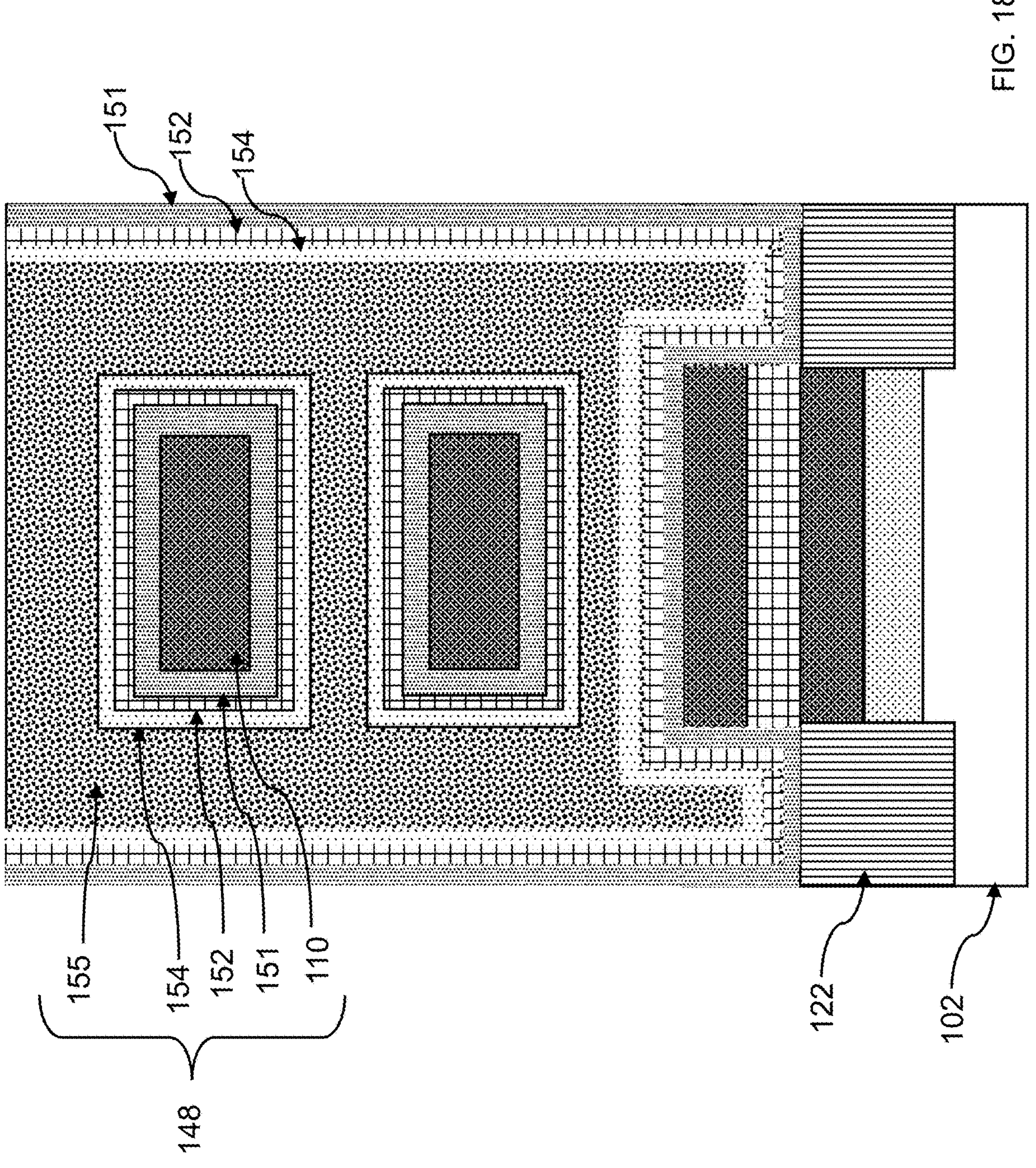
FIG. 18 is a vertical cross-sectional view through line AA' in FIG. 17 in accordance with various embodiments of the disclosure.

Referring to FIGS. 17 and 18, gate material 148 may be conformally deposited on the silicon layers 110 that form the individual nanowires in the trench region 144. In various embodiments, the trench region 144 may be completely filled with gate material 148. The top surface of the structure illustrated in FIG. 17 may be planarized, for example by chemical-mechanical polishing, to remove any excess gate material 148 in the trench region 144. In various embodiments, the gate material 148 may comprise a liner layer 151, a wetting layer 152, an adhesion layer 154 and a metal layer 155 conformally deposited over the silicon layer 110 that forms the individual nanowires in the trench region 144. The final gate structure may be a high-k/metal gate stack. The metal layer 155 used within gate stack 148 may include a metal, metal alloy, or metal silicide. The liner layer 151 of the gate stack 148 may include a dielectric material such as silicon oxide ($SiO_2$), HfSiO, or silicon oxynitride (SiON). The liner layer 151 may be formed by chemical oxidation, thermal oxidation, atomic layer deposition (ALD), chemical vapor deposition (CVD), and/or other suitable method. The metal layer 155 of the gate stack 148 may include Ti, Ag, Al, TiAlN, TaC, TaCN, TaSiN, Mn, Zr, TiN, TaN, Ru, Mo, Al, WN, Cu, W, Re, Ir, Co, Ni, although other suitable metal materials or a combination thereof are within the contemplated scope of disclosure. The wetting layer 152 and adhesion layers 154 may be selected to assist in adhering the metal layer 155 to the silicon layer 110 in the trench 144 (also referred to as channel region 146). Example materials for the wetting layer 152 and adhesion layers 154 may include, but are not limited to, Ni, Ti and nitrides thereof.

Figure 19:
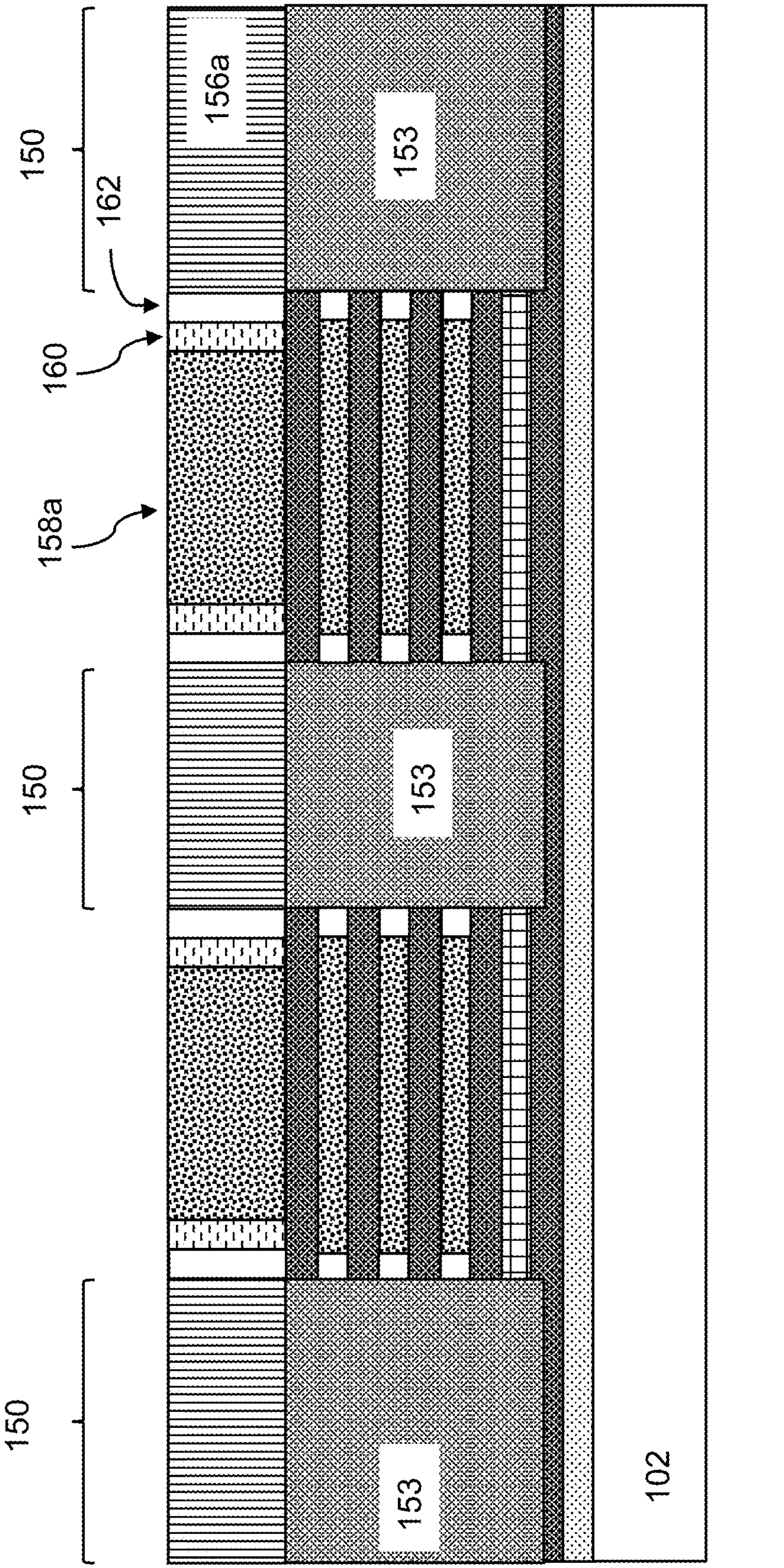
FIG. 19 is a vertical cross-sectional view illustrating a step of forming an interconnect in the interlayer dielectric layer in accordance with various embodiments of the disclosure.

Referring to FIG. 19, a photoresist layer (not shown) may be deposited over the surface of the intermediate structure illustrated in FIGS. 17 and 18. The photoresist layer 118 may be patterned such that the gate stacks 148 and nanowires formed from silicon layer 110 in the channel region 146 may be protected by the photoresist layer while the active regions 150 are exposed. Then, doped active region material 153, such as doped SiGe may be deposited to form the active regions 150 (e.g. source and drain).

A first interlayer dielectric layer (ILD) 156*a* may be formed over the planarized structure illustrated in FIG. 17. In some embodiments, the first ILD layer 156*a* may be made of materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 156*a* may be deposited by a PECVD process or other suitable deposition technique. In some embodiments, the dielectric material 142 may be used as the first interlayer dielectric layer (ILD) 156*a*. In such embodiments, the fabrication steps of FIG. 19 may be omitted as the previously formed dielectric material 142 may be planarized in FIG. 17 and serve as the first interlayer dielectric layer (ILD) 156*a*

The metal material 155 located in the trench 144 above the gate stacks 148 and nanowires formed from silicon layer 110 in the channel region 146 form first level interconnects 158*a* in the first ILD layer 156*a*.

Figure 20:
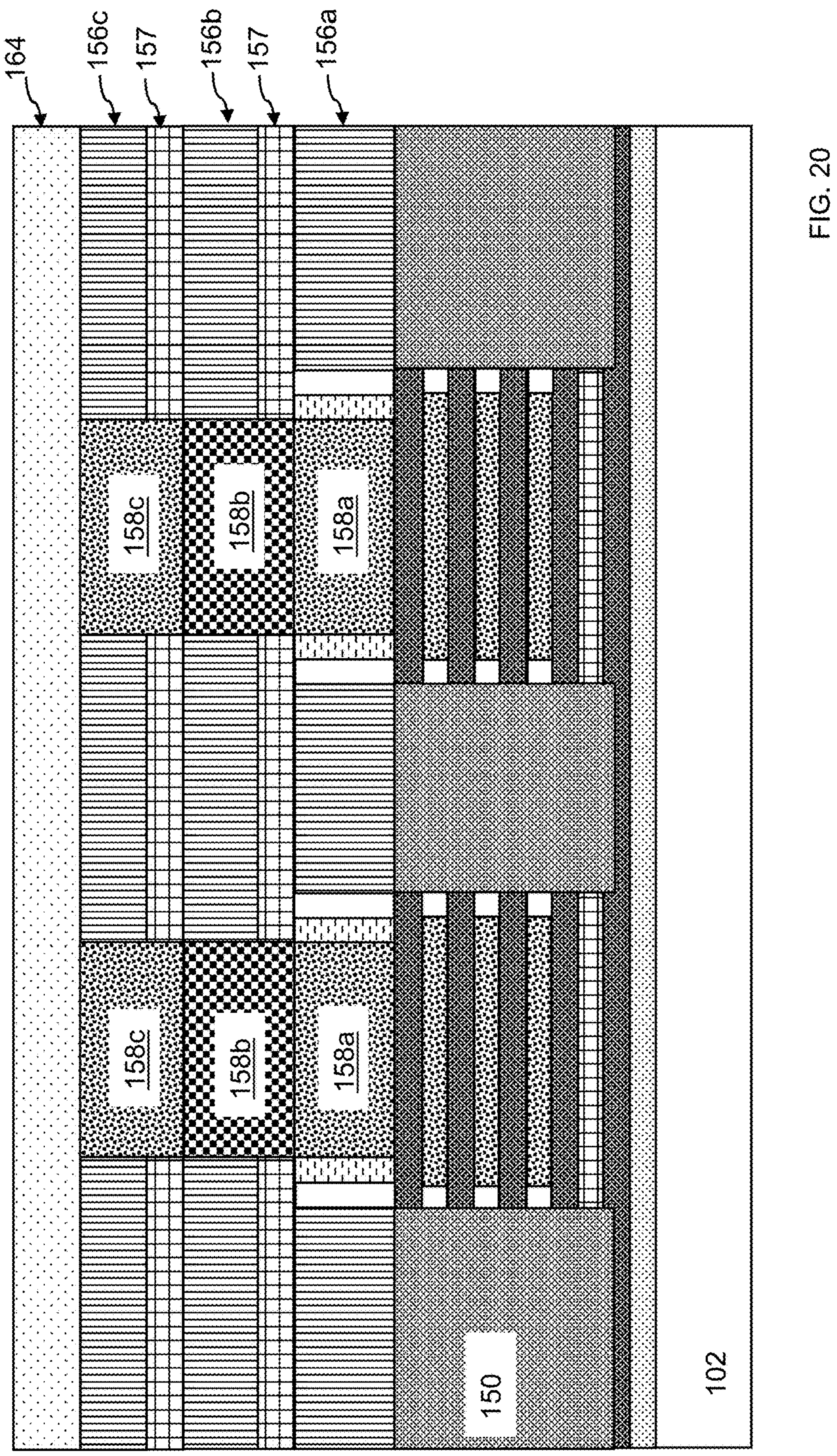
FIG. 20 is a vertical cross-sectional view illustrating a step of forming additional interlayer dielectric layers and interconnects in the additional interlayer dielectric layers in accordance with various embodiments of the disclosure.

Referring to FIG. 20, additional second and third interlayer dielectric layers 156*b*, 156*c* and second and third level interconnects 158*b*, 158*c* may be formed over the first ILD layer 156*a* using processing operations similar to the operations used to form the first level interconnects 158*a*. In various embodiments, the first level interconnects 158*a* may be made of any suitable metal, such as Cu, W, Ta, Re, Cr, silicides or alloys thereof. In various embodiment, the second level interconnects 158*b* may be made of W. In various embodiments, the third level interconnects 158*c* may be made of Cu. However, in alternative embodiments, the second and third interconnects 158*b* and 158*c* may be formed from other metals, silicides and alloys. Optionally, etch stop layers 157 may be formed between the ILD layers 156*a*, 156*b*, 156*c*. The etch stop layer 157 may be formed from silicon nitride (SiN), although other suitable etch stop materials are within the contemplated scope of disclosure. In addition, a high density plasma (HDP) oxide layer 164 may be formed over the surface of the topmost (third) ILD layer 156*c* and the third level interconnects 158*c*. The HDP oxide layer may act as a passivation layer.

Figure 21:
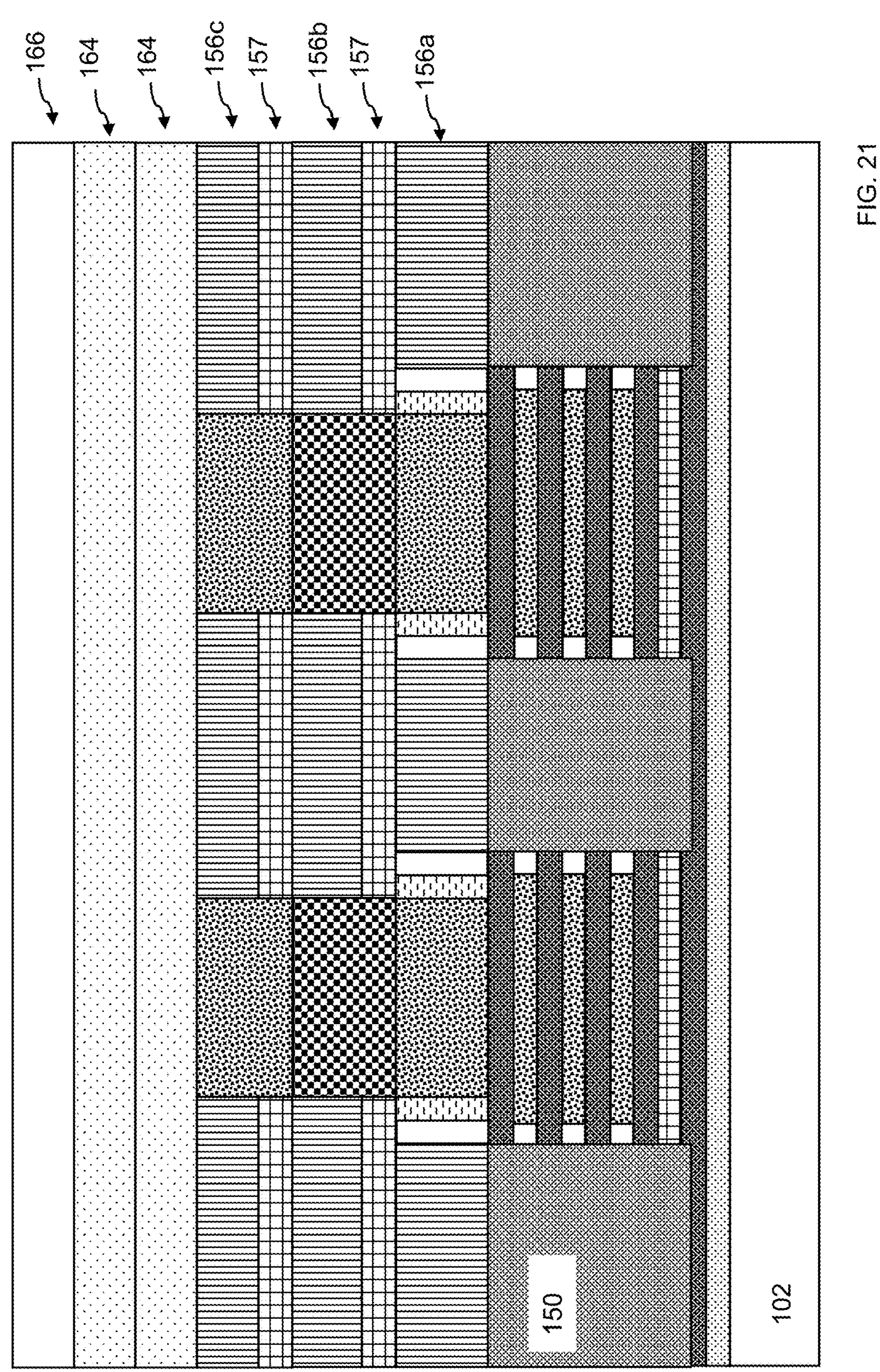
FIG. 21 is a vertical cross-sectional view illustrating a step of adding a carrier layer to the top surface of the device of FIG. 20 in accordance with various embodiments of the disclosure.

Referring to FIG. 21, an optional second (or more) HDP oxide layer(s) 164 may be formed over the first HDP oxide layer 164. Next, a carrier wafer 166 may be bonded to the top most HDP oxide layer 164. The term carrier wafer used herein may be a wafer, for example, a monocrystalline silicon wafer, or a substrate, for example, a glass substrate, used to hold, flip, or move, for example, other wafers, layers, or substrates, for further processing.

Figure 22:
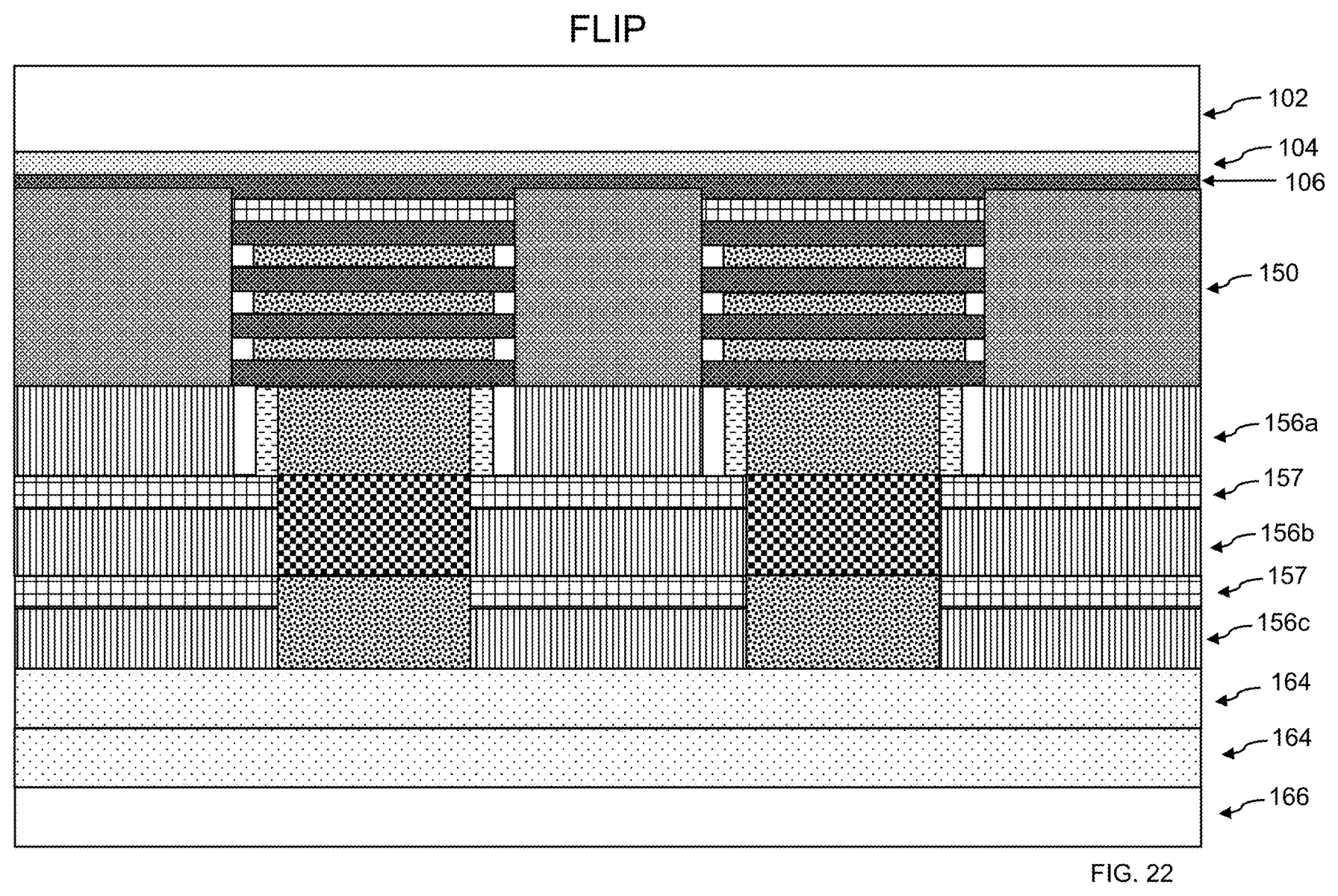

Referring to FIG. 22, the device illustrated in FIG. 21 may be flipped such that the carrier layer 166 becomes the bottom most layer and the original substrate 102 becomes the top most layer in the flipped orientation.

Figure 23:
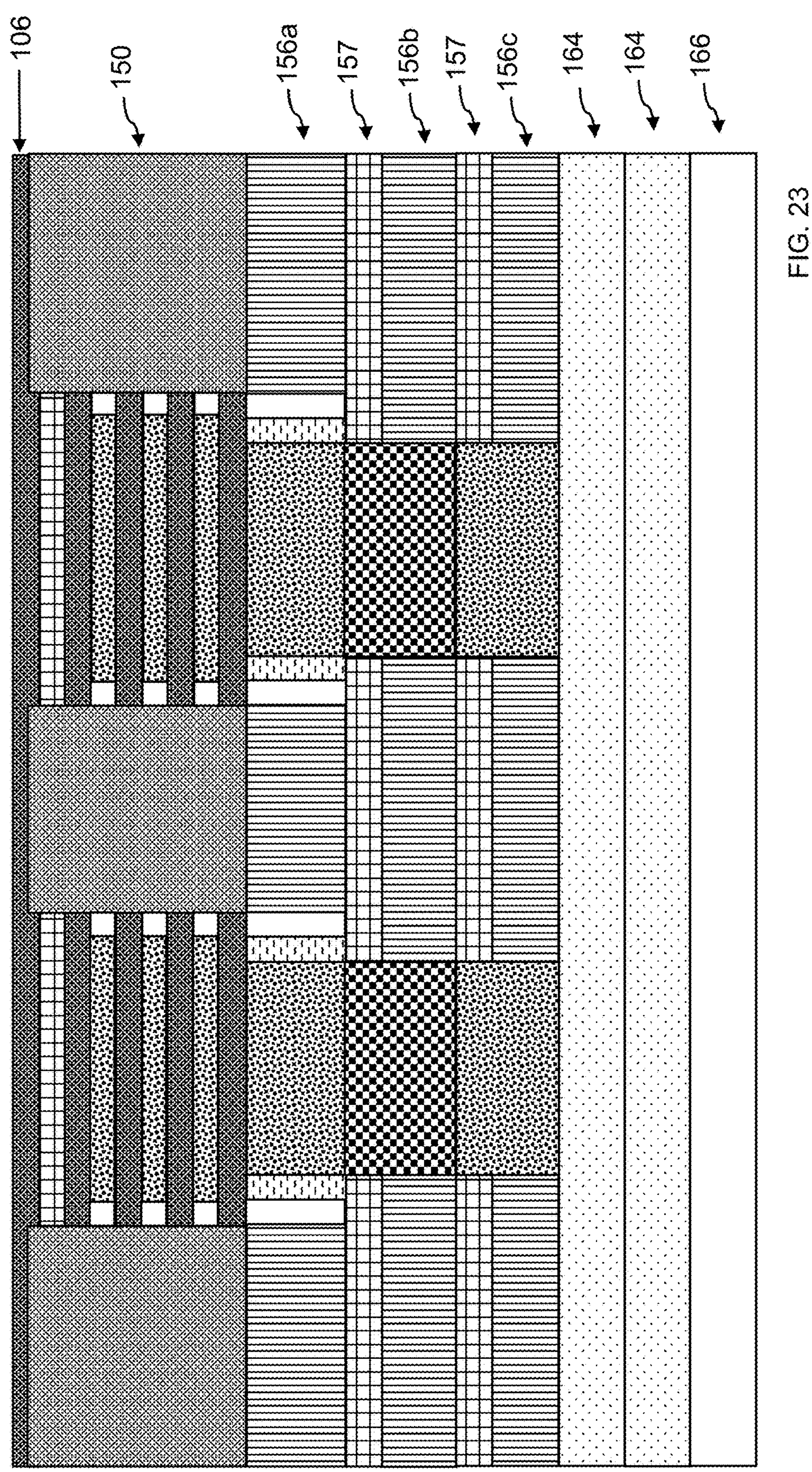
FIG. 23 is a vertical cross-sectional view illustrating a step of removing the substrate from the device illustrated in FIG. 22 in accordance with various embodiments of the disclosure.

Referring to FIG. 23, the substrate 102 and the insulating layer 104 may be removed from the device, thereby exposing the silicon epitaxial layer 106. In various embodiments, the substrate 102 and the insulating layer 104 may be removed by CMP.

Figure 24:
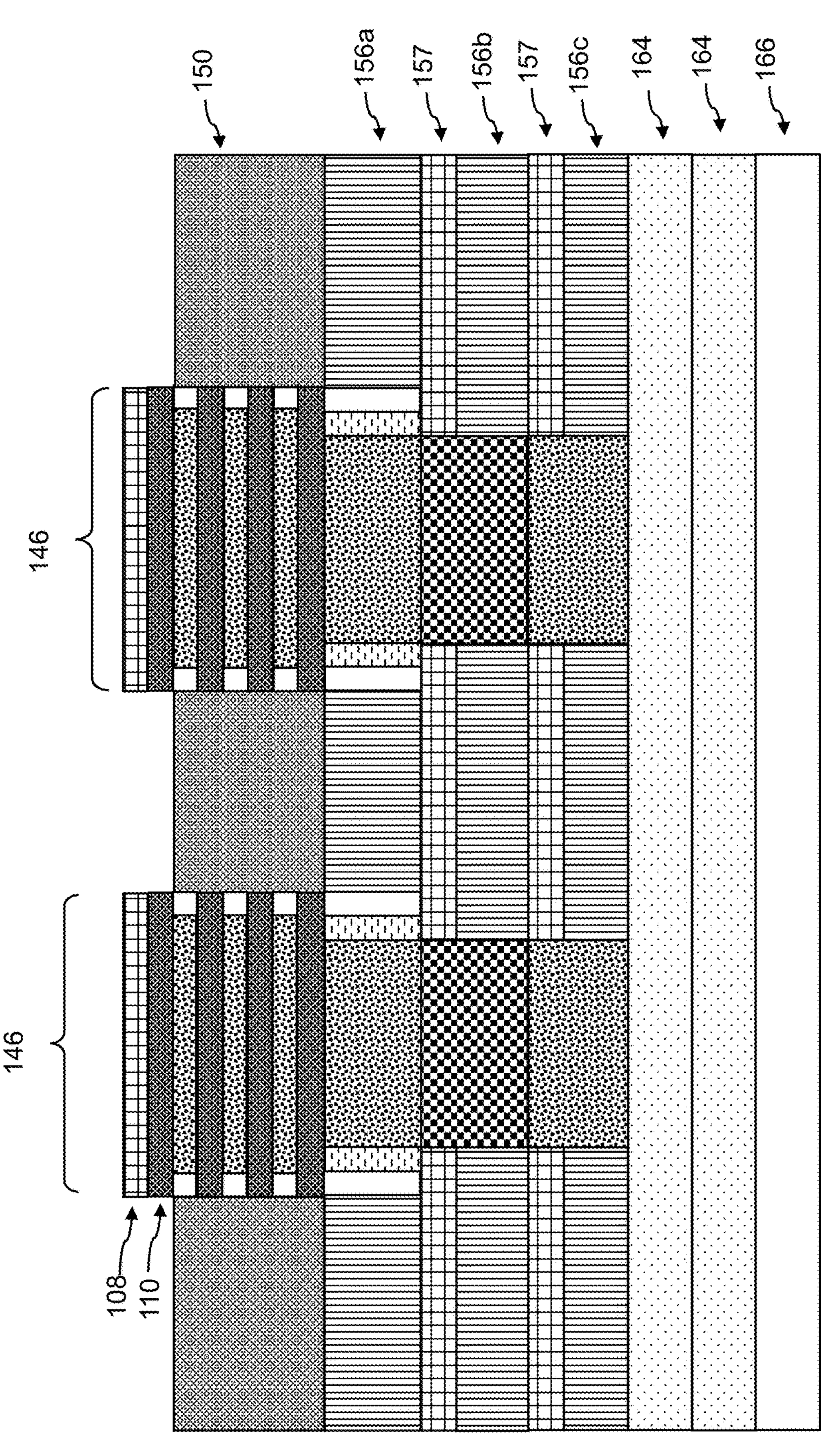
FIG. 24 is a vertical cross-sectional view illustrating a step of removing the epitaxial silicon layer from the device illustrated in FIG. 23 in accordance with various embodiments of the disclosure.

Referring to FIG. 24, the silicon epitaxial layer 106 may be removed. Further, doped active region material 153 in the active regions 150 may be removed to recess the active regions 150. In this manner, the insulating layer 108 and the bottom most silicon layer 110 in the rails 121 in the channel region 146 may be exposed.

Figure 25:
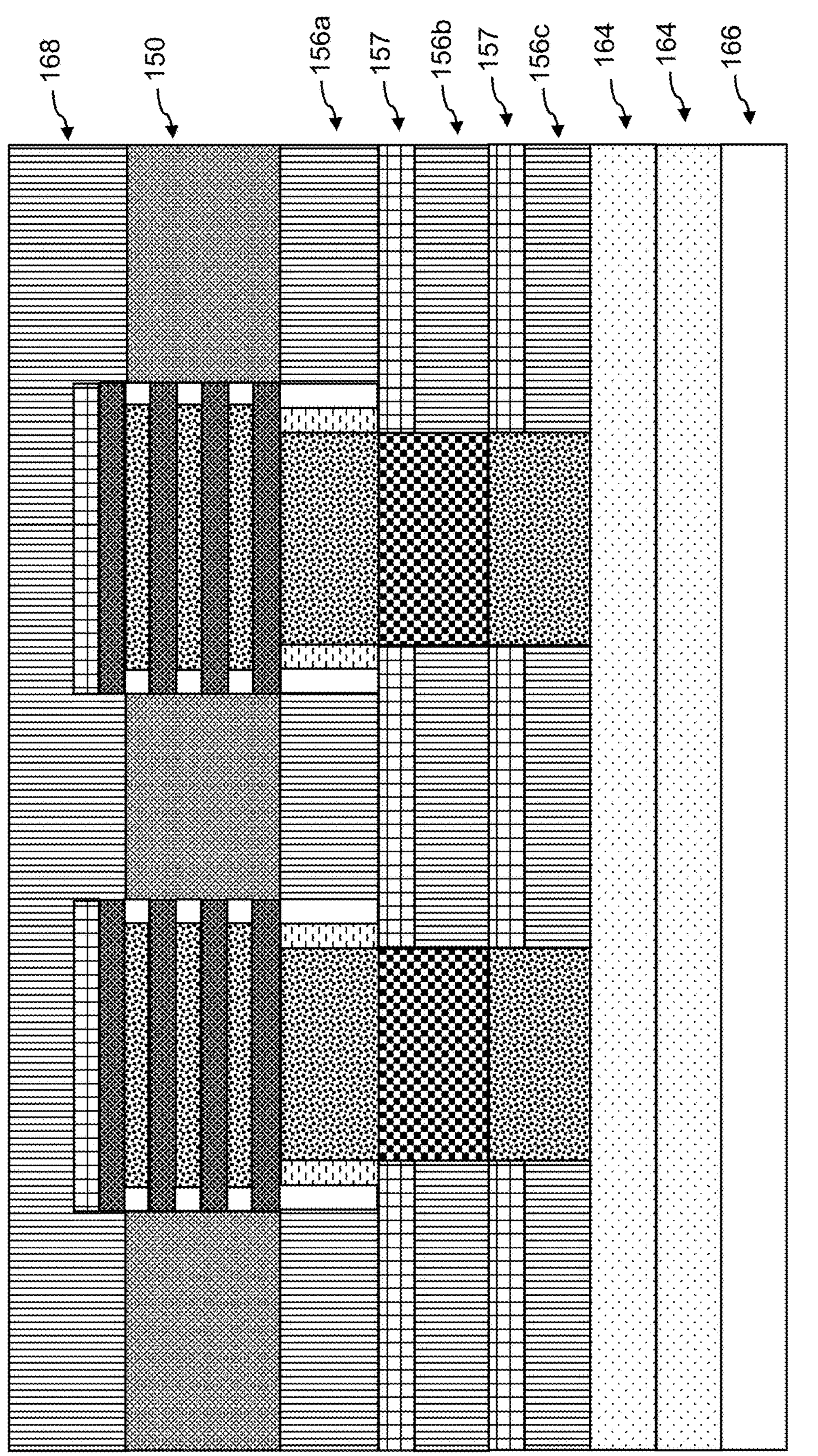
FIG. 25 is a vertical cross-sectional view illustrating a step of depositing a dielectric layer over the device illustrated in FIG. 24 in accordance with various embodiments of the disclosure.

Referring to FIG. 25, a dielectric layer 168 may be deposited over the intermediate structure illustrated in FIG. 24. The dielectric layer 168 may comprise a layer of SiCN, an oxide layer or layers of SiCN and oxide. Other suitable dielectric materials are within the contemplated scope of disclosure.

Figure 26:
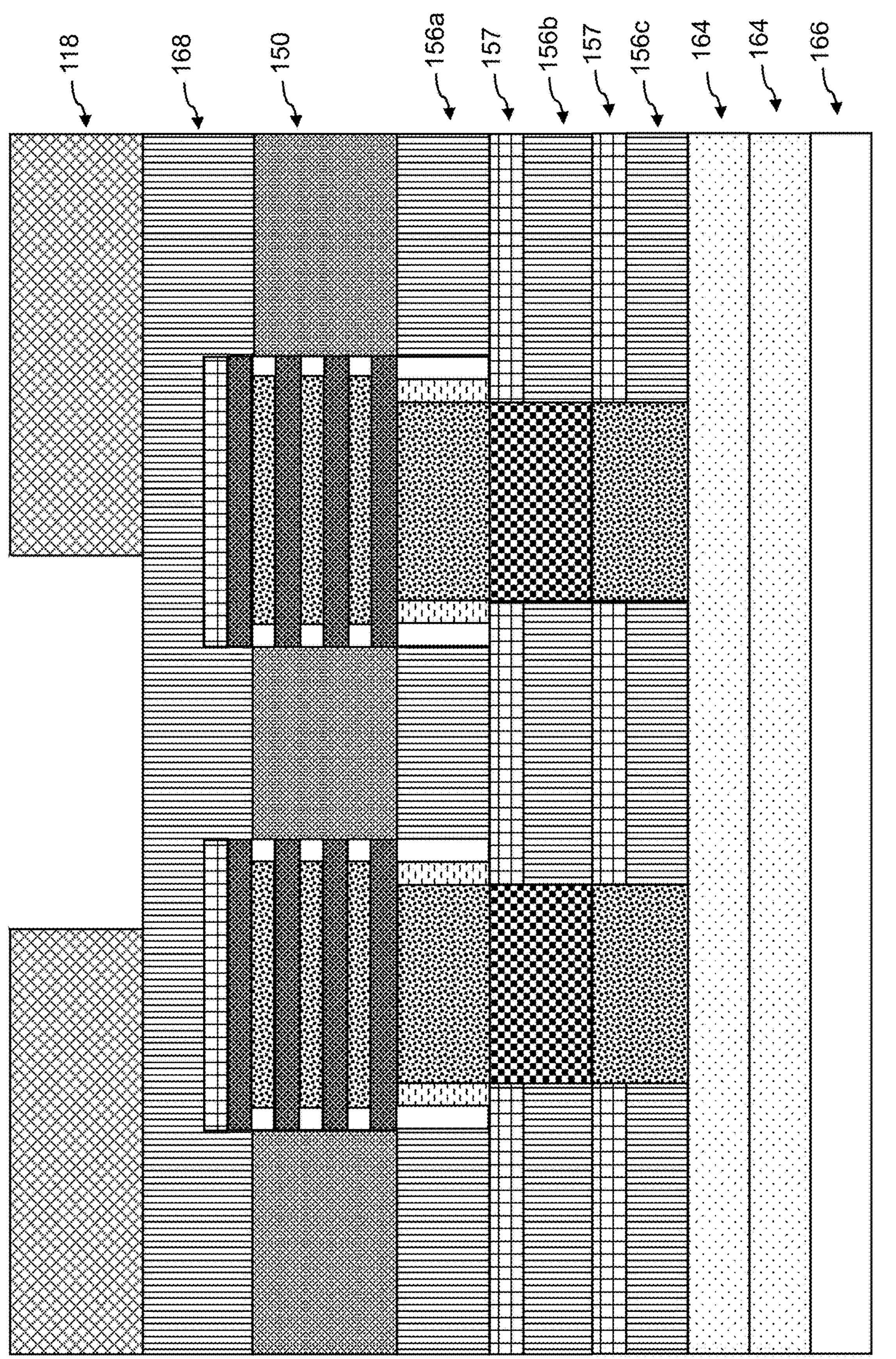
FIG. 26 is a vertical cross-sectional view illustrating a step of depositing and patterning a photoresist layer over the device illustrated in FIG. 25 in accordance with various embodiments of the disclosure.

Referring to FIG. 26, a photoresist layer 118 may be deposited over the surface of the dielectric layer 168 and patterned in preparation for forming a top contact to the active regions 150.

Figure 27:
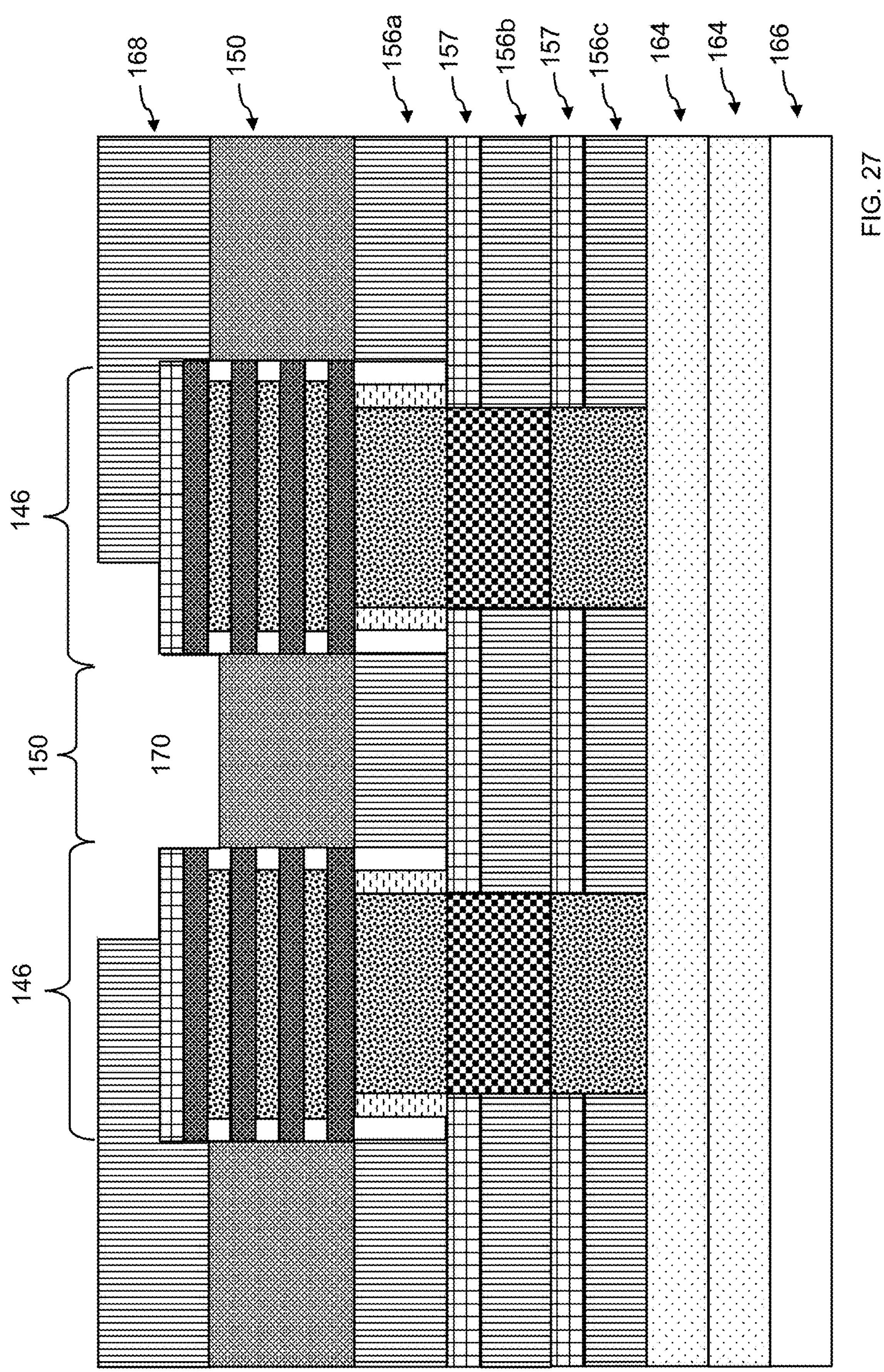
FIG. 27 is a vertical cross-sectional view illustrating a step of patterning the dielectric layer over the device illustrated in FIG. 26 in accordance with various embodiments of the disclosure.

Referring to FIG. 27, the dielectric layer 168 may be patterned using the patterned photoresist layer 118 to form a contact via hole 170 in the dielectric layer 168. As illustrated in FIG. 27, the dielectric layer 168 may be selectively etched such that the contact via hole 170 generally has a "T" shape with the stem portion equal to the width of the active region 150 and a cross portion which overlaps with the channel regions 146 of adjacent transistors. In various embodiments, the "T" shaped via hole 170 may be produced with consecutive patterning and etching steps.

Figure 28:
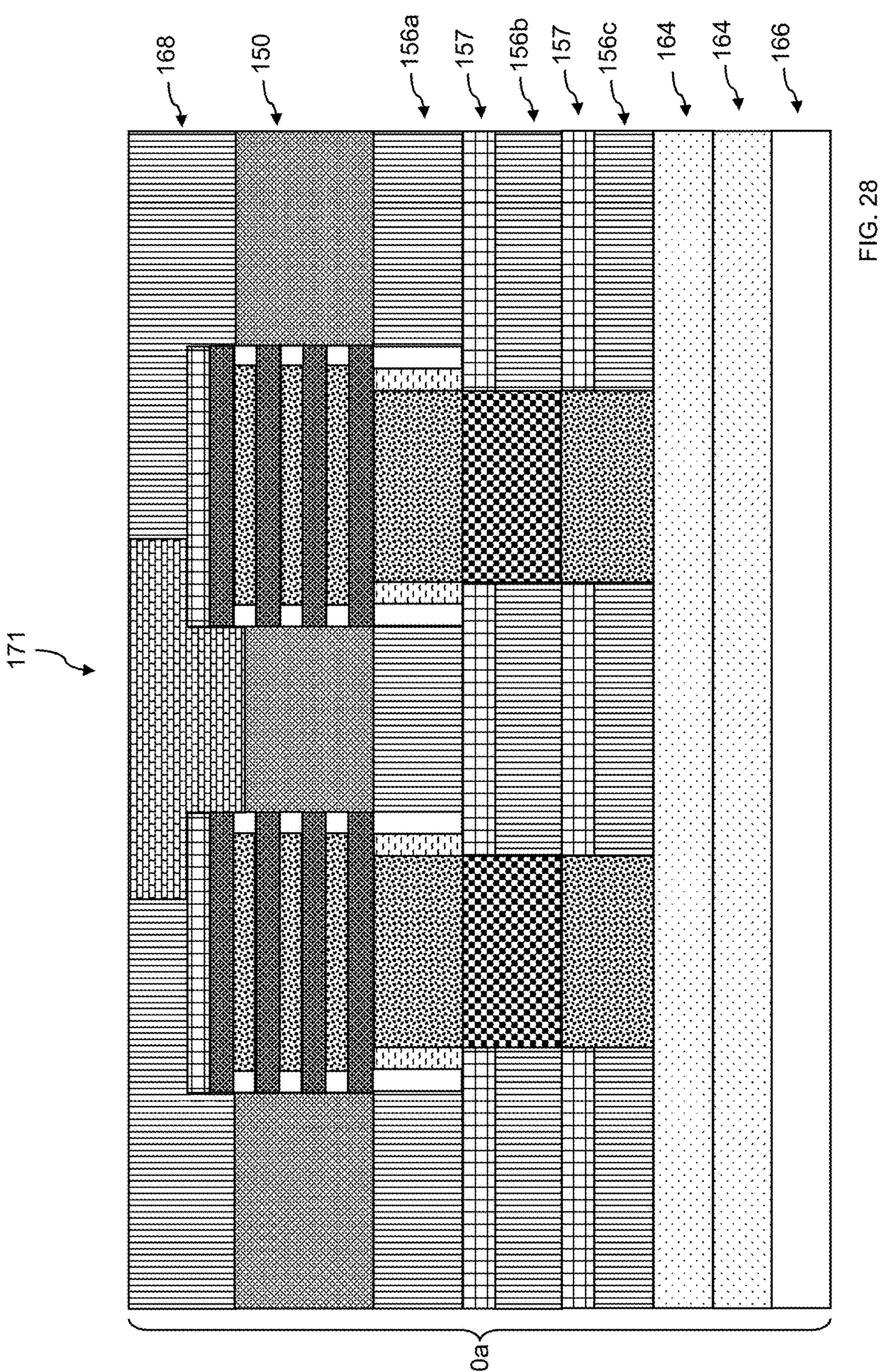
FIG. 28 is a vertical cross-sectional view illustrating a step of depositing an interconnect layer in the patterned dielectric layer in the device illustrated in FIG. 27 in accordance with various embodiments of the disclosure.

Referring to FIG. 28, the contact via hole 170 may be filled with conducting material to form a contact via 171. In various embodiments, the contact via 171 may be filled with conducting material that comprises a metal silicide. In alternative embodiments, the contact via 171 may be filled with conducting material such as Cu, W, Al or any other suitable metal. The resulting device 100*a* forms a gate all around metal oxide semiconductor field effect transistor (MOSFET) device. The device 100*a* may be either n-type or p-type as desired.

Figure 29:
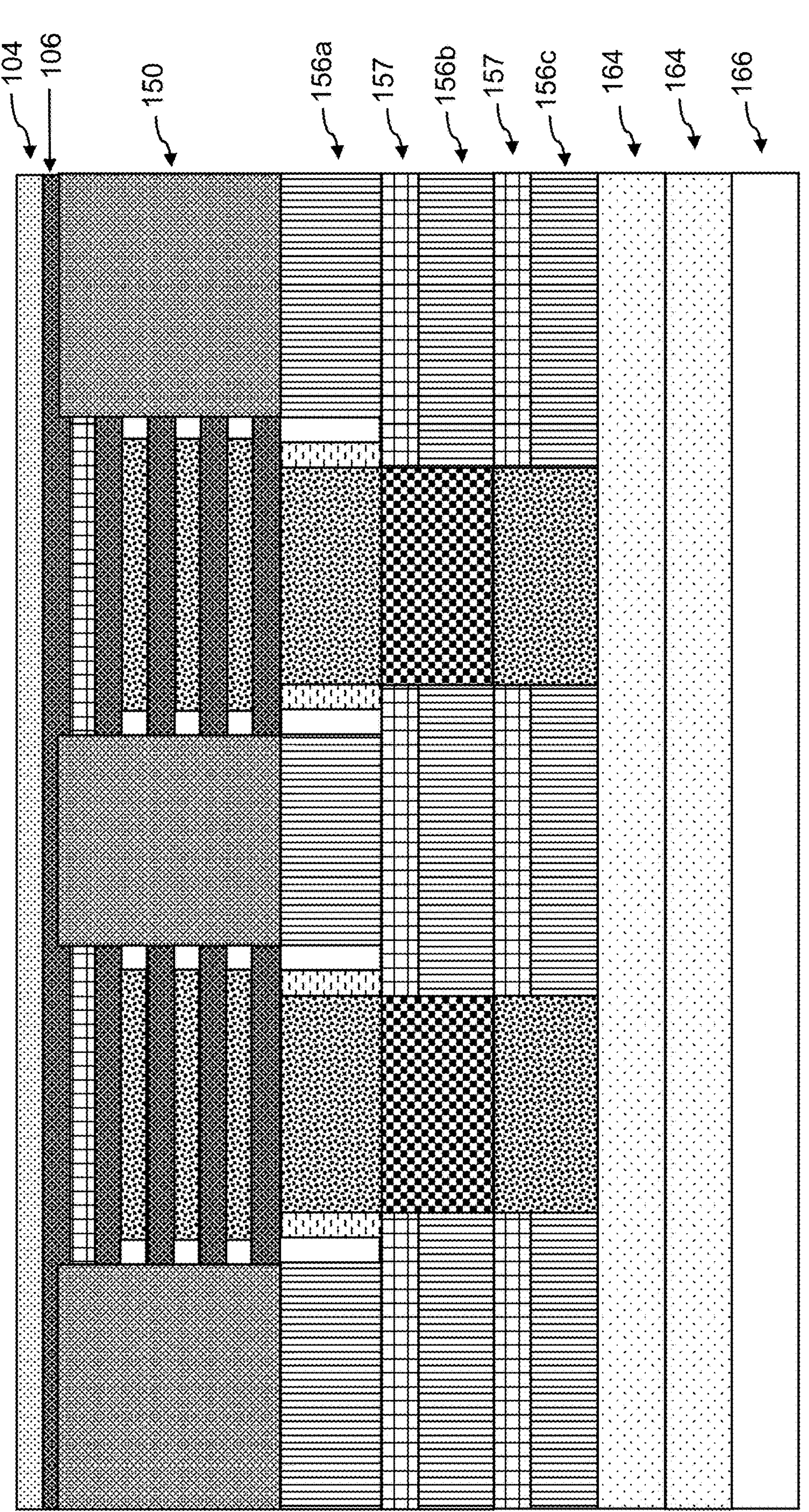
FIG. 29 is a vertical cross-sectional view illustrating a step of removing the substrate from the device illustrated in FIG. 22 in an alternative embodiment in accordance with various embodiments of the disclosure.

Referring to FIG. 29, a method of making an alternative embodiment is described. Starting with the intermediate device structure illustrated in FIG. 22 of the previous method, the substrate 102 may be removed from the top of the flipped device, thereby exposing the insulating layer 104. The substrate 102 may be remove by any suitable method such as CMP.

Figure 30:
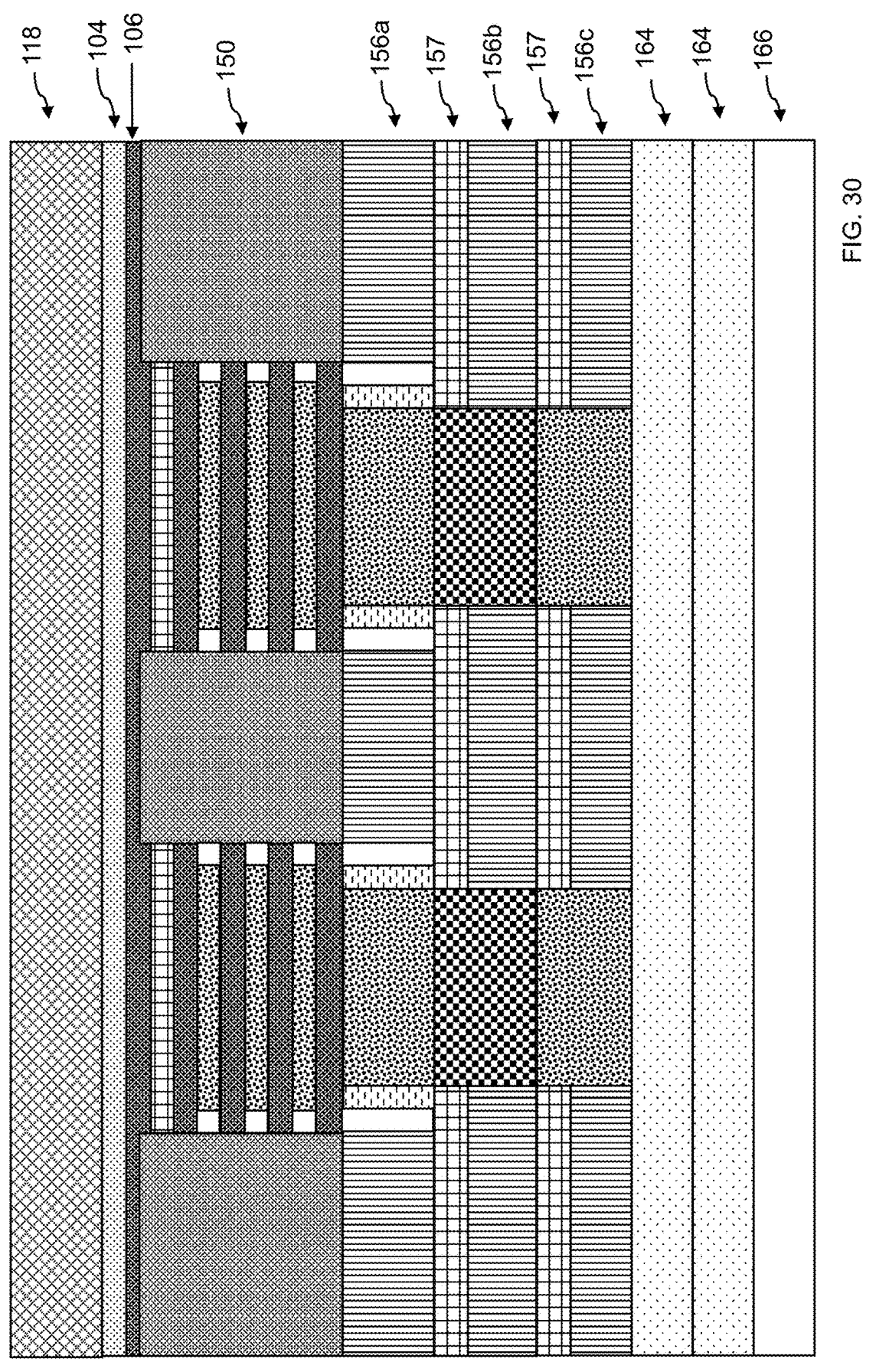

Referring to FIG. 30, a photoresist layer 118 may be deposited over the surface of the insulating layer 104. Optionally, a hard mask layer (not shown) may be deposited over the surface of the insulating layer 104 prior to depositing the photoresist layer 118.

Figure 31:
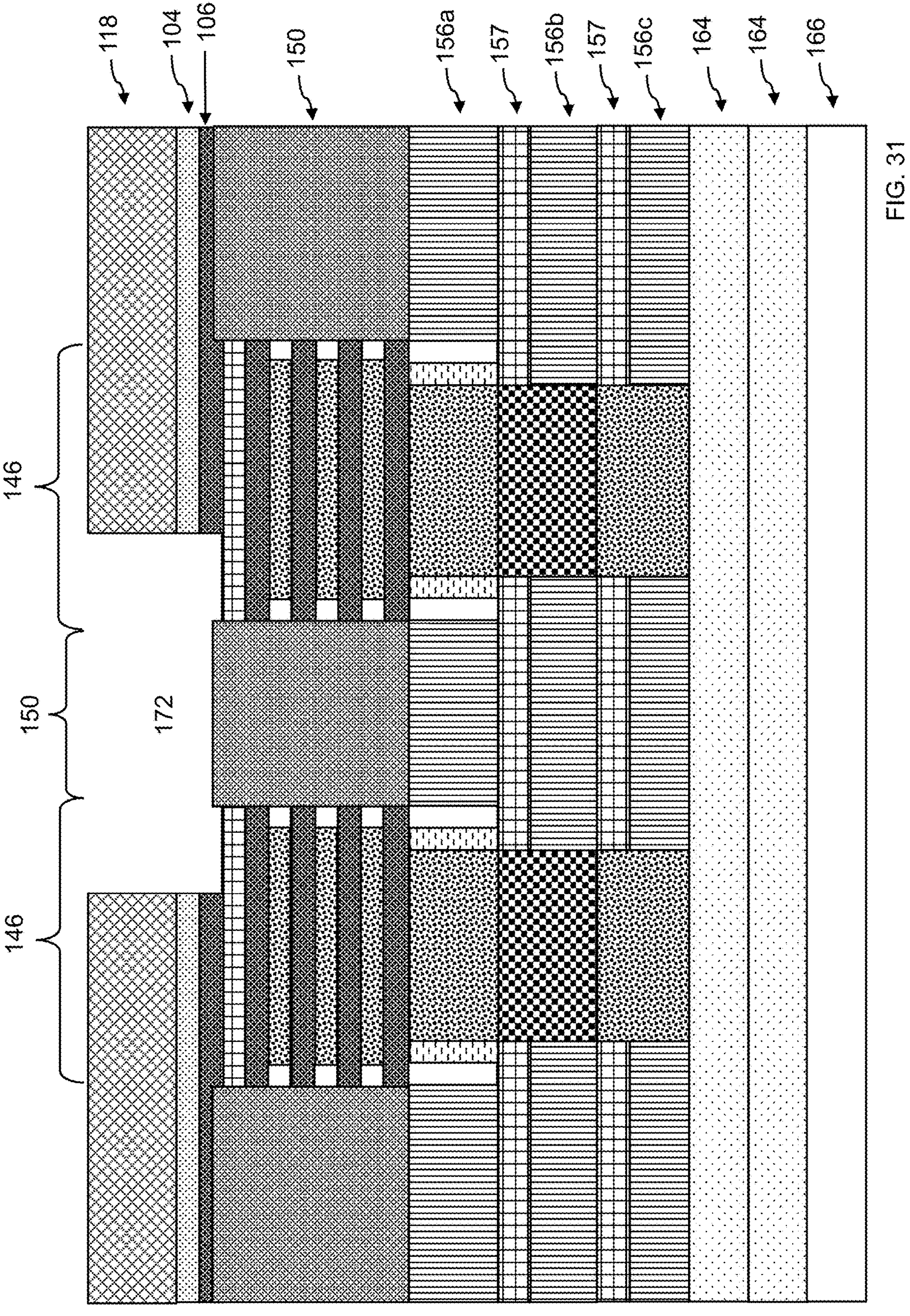
FIG. 31 is a vertical cross-sectional view illustrating a step of patterning the photoresist and using the patterned photoresist to etch a via hole to the active regions in the device structure illustrated in FIG. 30 in accordance with various embodiments of the disclosure.

Referring to FIG. 31, the photoresist layer 118 may be patterned and used as mask to pattern the underlying insulating layer 104 and silicon epitaxial layer 106. Unlike the previous embodiment in which the contact via hole 170 had a "T" shape, the contact via hole 172 of the present embodiment, is generally rectangular in shape. The contact via hole 172 covers the active region 150 and a portion of adjacent channel regions 146.

Figure 32:
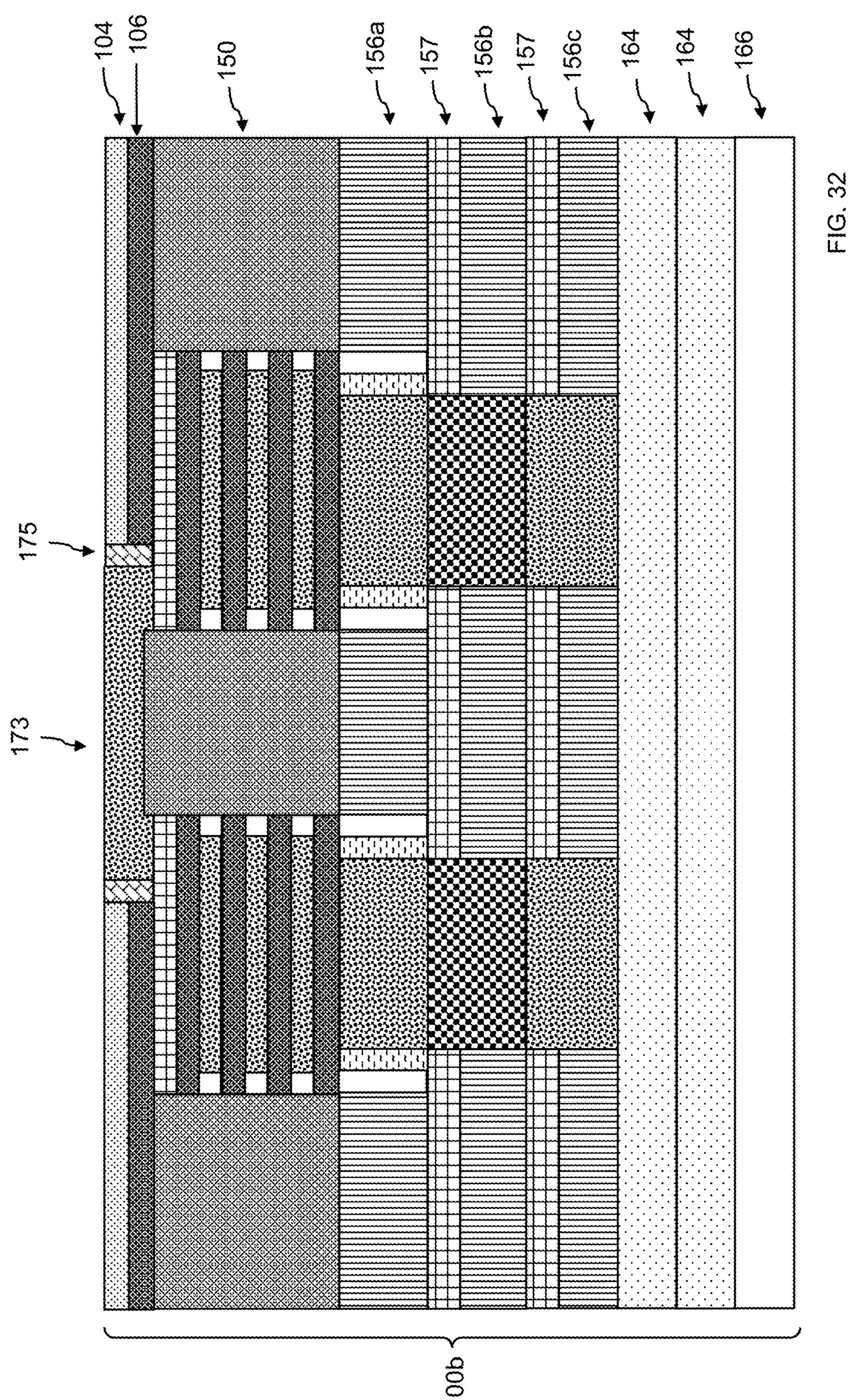
FIG. 32 is a vertical cross-sectional view illustrating a step of depositing metal in the via hole to the active regions in the device structure illustrated in FIG. 31 in accordance with various embodiments of the disclosure.

Referring to FIG. 32, the contact via hole 172 may be filled with a conducting material to make a contact via 173. In various embodiments, a contact liner layer 175 may be deposited in the contact via hole 172 prior to forming the contact via 173. The contact liner layer 175 may include a dielectric material such as silicon oxide, silicon nitride, and/or other suitable materials. Similar to the device illustrated in FIG. 28, the resulting device **100*b* forms a gate all around metal oxide semiconductor field effect transistor (MOSFET) device. This MOSFET device 100*b*** may be either n-type or p-type as desired.

Figure 33:
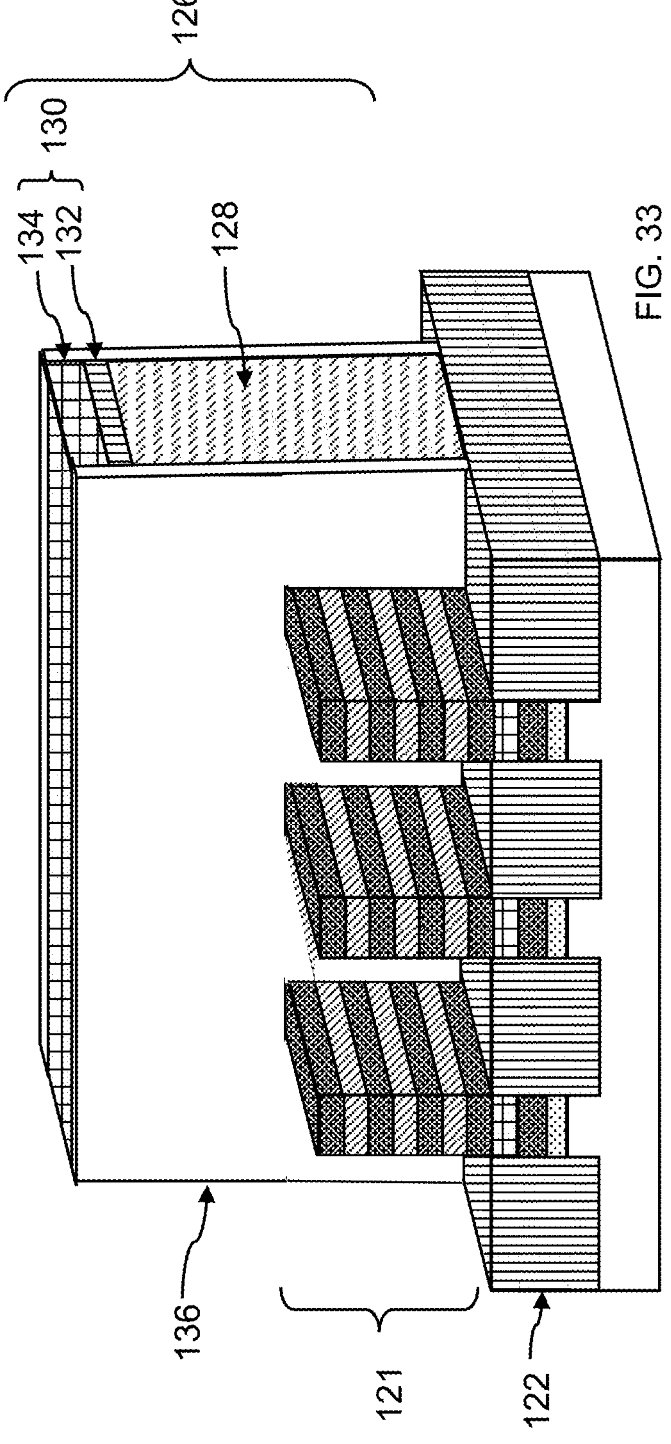
FIG. 33 is a perspective view illustrating a step of covering the dummy gate stack with an inner spacer material layer of a gate all around MOSFET in accordance with various alternative embodiments of the disclosure.
Figure 34:
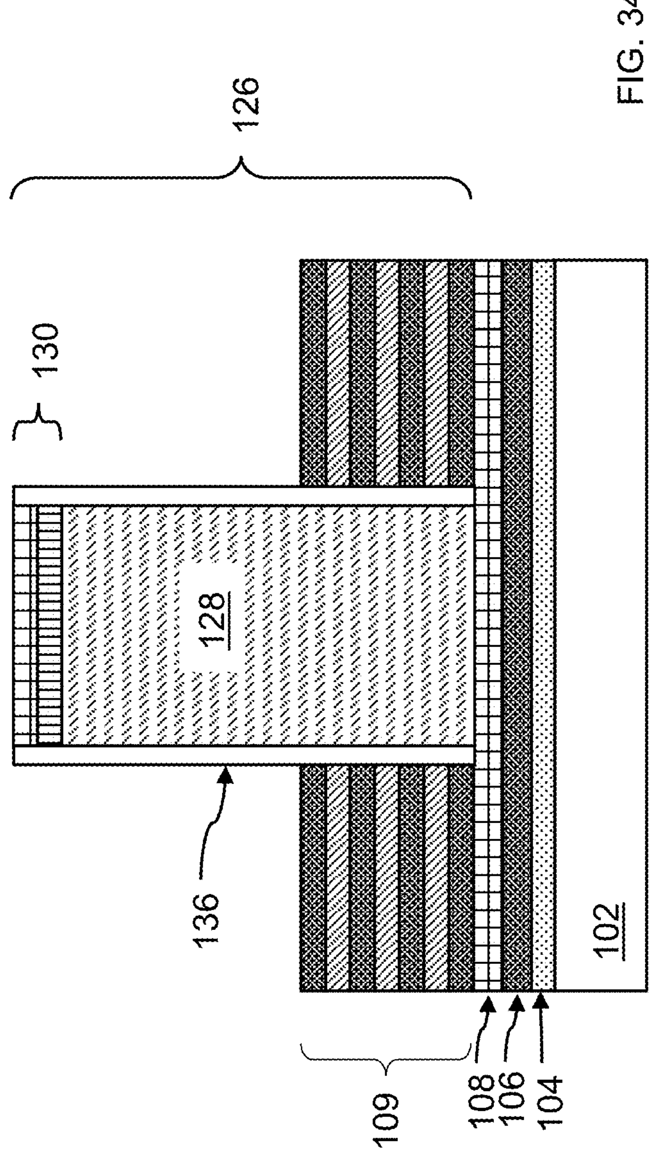
FIG. 34 is a vertical cross-sectional view of the structure of FIG. 33 in accordance with various alternative embodiments of the disclosure.

FIGS. 33-41 illustrate steps in an alternative method of making a gate all around MOSFET. Referring to FIGS. 33 and 34, the intermediate structure illustrated in FIG. 6, a dummy gate stack 126 may be formed over a central portion of the rails 121. The dummy gate stack 126 may include an electrode layer 128 and a hard mask layer 130, which may include an oxide hard mask 132 and a nitride hard mask 134. The dummy gate stack 126 may be replaced in later steps with a final gate stack. The dummy gate stack 126 protects a channel while processing non-channel portions of the device. In some embodiments, the dummy gate stack 126 may be formed by various process steps such as layer deposition, patterning, etching, as well as other suitable processing steps. Exemplary layer deposition processes includes CVD (including both low pressure CVD and plasma-enhanced CVD), PVD, ALD, thermal oxidation, e-beam evaporation, or other suitable deposition techniques, or combinations thereof. Similar to the fabrication step illustrated above with reference to FIG. 10, a dielectric spacer layer 136 may be deposited over the dummy gate stack 126. However, in the present embodiment, the sidewall portions of the dielectric spacer layer 136 over the dielectric fill material 122 may be removed. In addition, the portions of the dielectric spacer 136 covering the hard mask layer 130 of the dummy stack 126 may be omitted.

In an alternative embodiment, an intermediate structure similar to the structure illustrated in FIG. 8 above may be formed. However, in the alternative embodiment, the dielectric layer 124 illustrated in FIG. 7 over the of the rails 121 of the stack 109 of alternating silicon layers 110 and sacrificial layers 112 may be optionally omitted.

Figure 35:
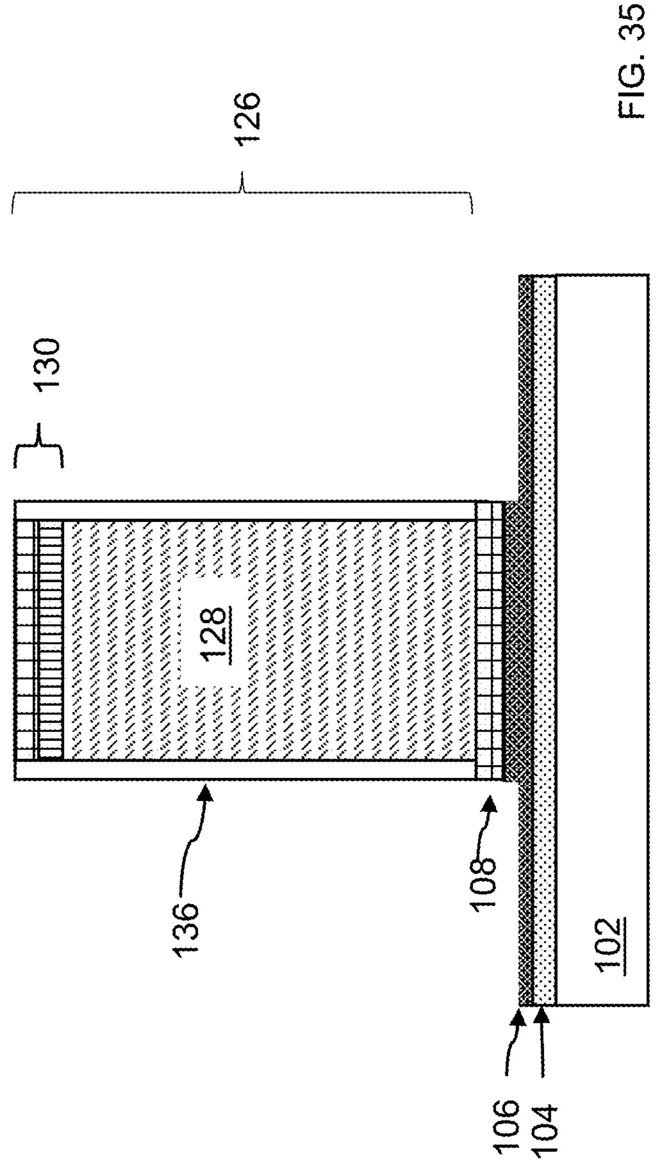
FIG. 35 is a vertical cross-sectional view illustrating a step of removing the portions of the rails of silicon and sacrificial layers outside of the dummy stack in accordance with various alternative embodiments of the disclosure.

Referring to FIG. 35, the portions of the rails 121 of the stack 109 of alternating silicon layers 110 and sacrificial layers 112 outside of the dielectric spacer layers 136 that are not covered by the dummy gate stack 126 may be removed. In addition, portions of the insulating layer 108 that are not covered by the dummy gate stack 126 may be removed. In some embodiments, portions of the silicon epitaxial layer 106 not covered by the dummy gate stack 126 may also be recessed.

Figure 36:
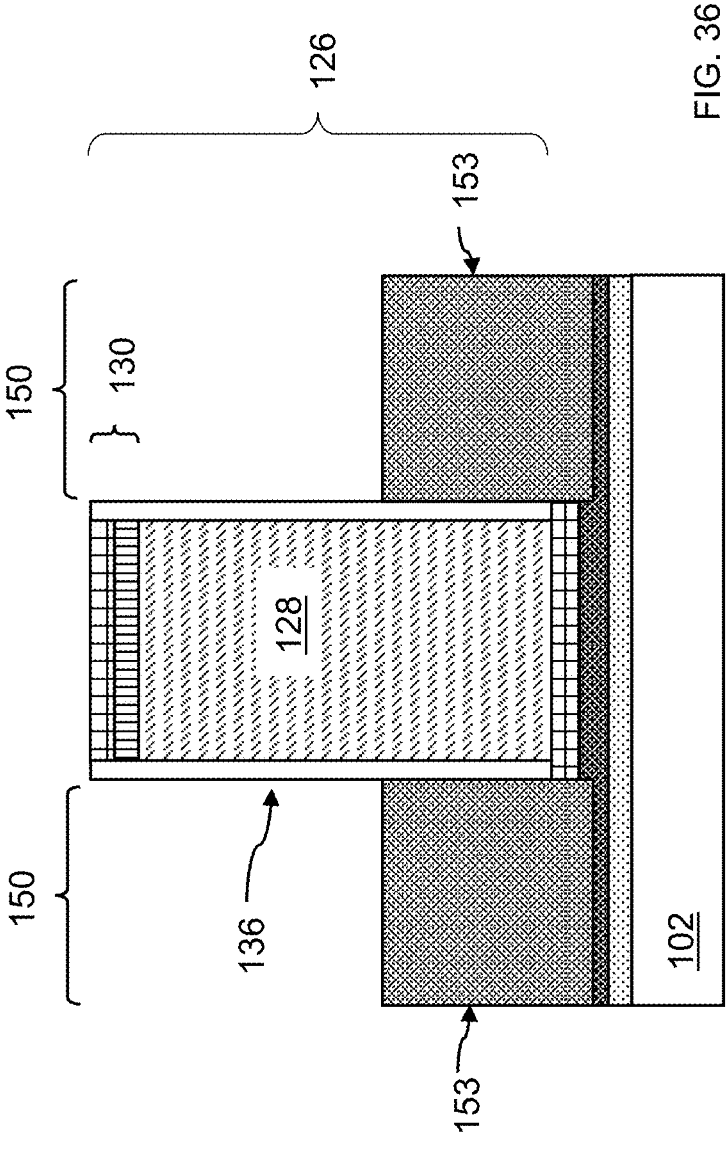
FIG. 36 is a vertical cross-sectional view illustrating a step of depositing active region material in accordance with various alternative embodiments of the disclosure.

Referring to FIG. 36, doped active region material 153, may be deposited to form active regions 150. Thus, in the present embodiment and in contrast to the embodiment illustrated in FIGS. 8-19 above, the active regions 150 may be formed prior to depositing the gate material 148 forming the gate all around structure. The doped active region material 153 may be deposited by any suitable epitaxial method, such as vapor phase epitaxy (VPE) or molecular beam epitaxy (MBE).

Figure 37:
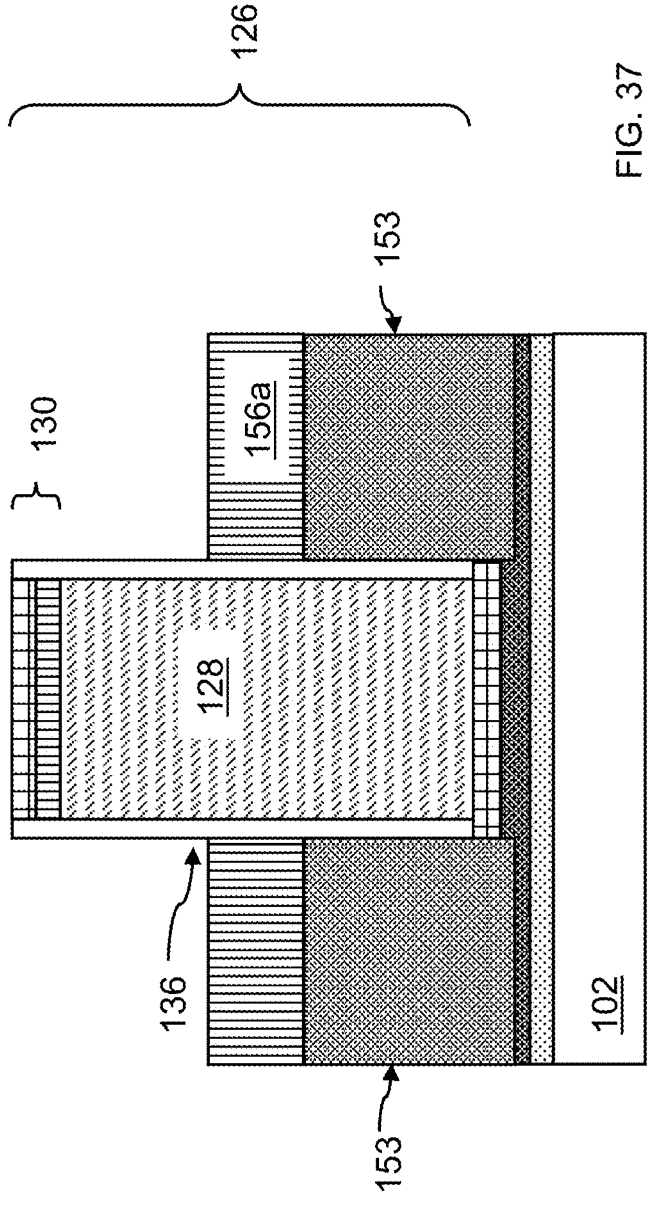
FIG. 37 is a vertical cross-sectional view illustrating a step of depositing a first interlayer dielectric layer in accordance with various alternative embodiments of the disclosure.

Referring to FIG. 37, a first interlayer dielectric layer (ILD) **156*a* may be formed over the structure illustrated in FIG. 36. In an embodiment, a photoresist layer (not shown) may be deposited and patterned such that the first ILD layer 156*a* is only deposited on the doped active region material 153. Alternatively, the first ILD layer 156*a* may be deposited over the entire surface of the intermediate structure illustrated in FIG. 38 and then patterned such that the first ILD layer 156*a* is only located on the doped active region material 153**.

Figure 38:
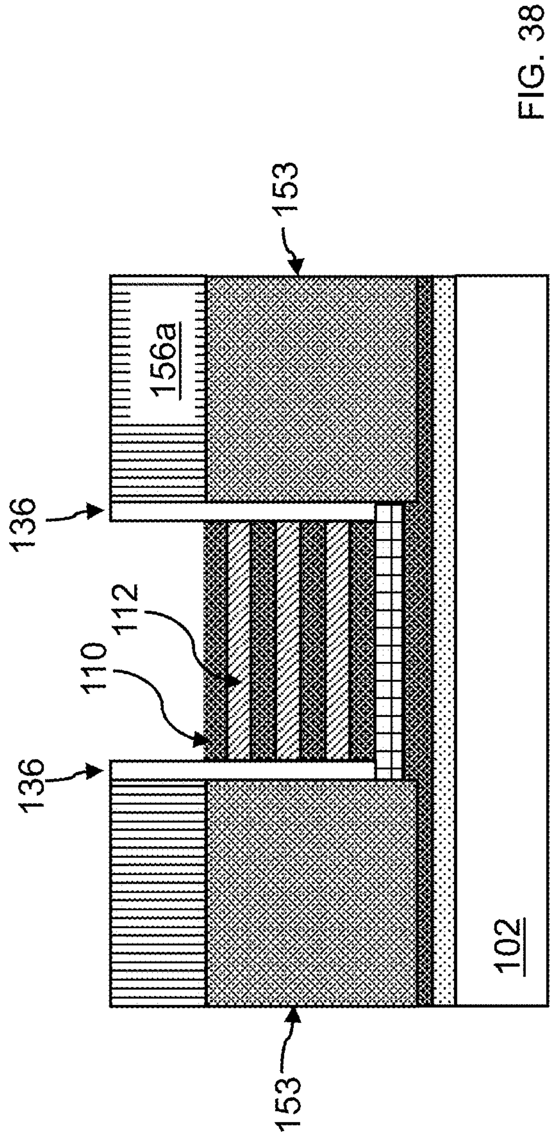
FIG. 38 is a vertical cross-sectional view illustrating a step of removing the electrode layer from the dummy gate stack in accordance with various alternative embodiments of the disclosure.

Referring to FIG. 38, the dummy gate stack 126, i.e. the hard mask layer 130 and the electrode material 128, may be removed (i.e., etched), exposing the rails 121 of the stack 109 of alternating silicon layers 110 and sacrificial layers 112 located between the dielectric spacer layers 136. The materials of the dummy gate stack 126 may be removed by selectively etching relative to the first ILD layer **156*a*. Alternatively, the first ILD layer 156*a*** may be protected with a patterned photoresist layer (not shown) during etching.

Figure 39:
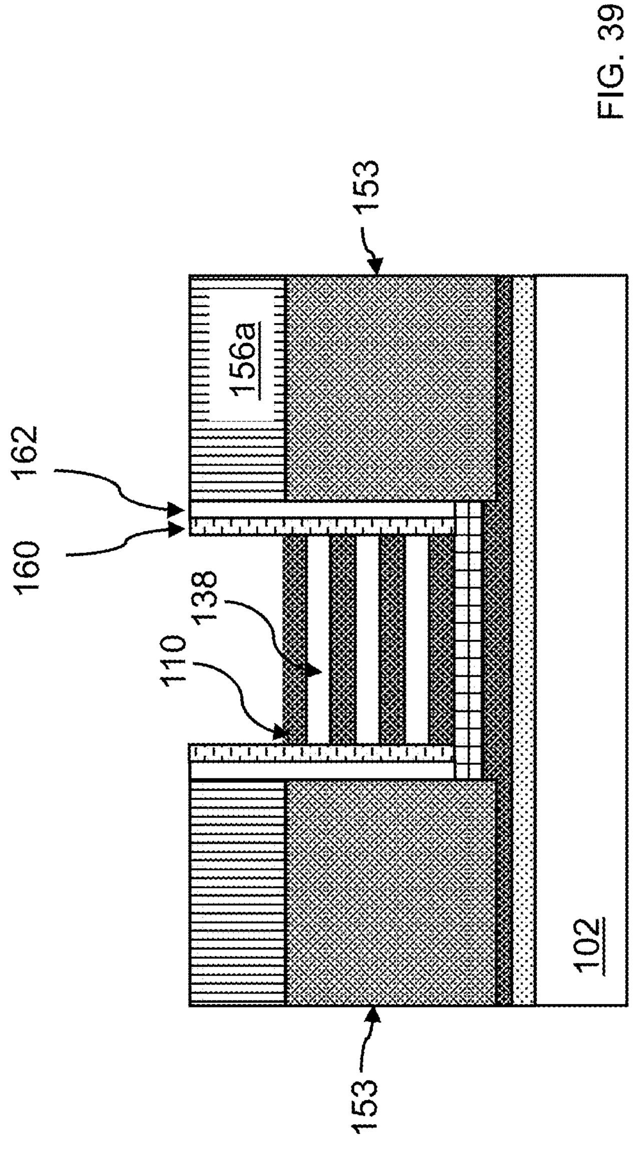
FIG. 39 is a vertical cross-sectional view illustrating a step of removing the sacrificial layers from the rails of silicon martial and sacrificial material and removing the dielectric spacer layer and depositing a conformal spacer layer and a conformal high-k dielectric layer in the trench in accordance with various embodiments of the disclosure.

Referring to FIG. 39, the sacrificial layers 112 located between the silicon layers 110 in the rails 121 of the stack 109 of alternating silicon layers 110 and sacrificial layers 112 may be removed. As discussed in regards to FIGS. 15 and 16 above, the sacrificial layers 112 may be removed to form gaps 138 by a selective wet etch, a selective dry etch or a combination of selective wet and dry etching. In some embodiments, the selective wet etching includes HF. In an embodiment, the sacrificial layers 112 may be formed from SiGe allowing for the selective removal of the SiGe sacrificial layers 112.

Figure 40:
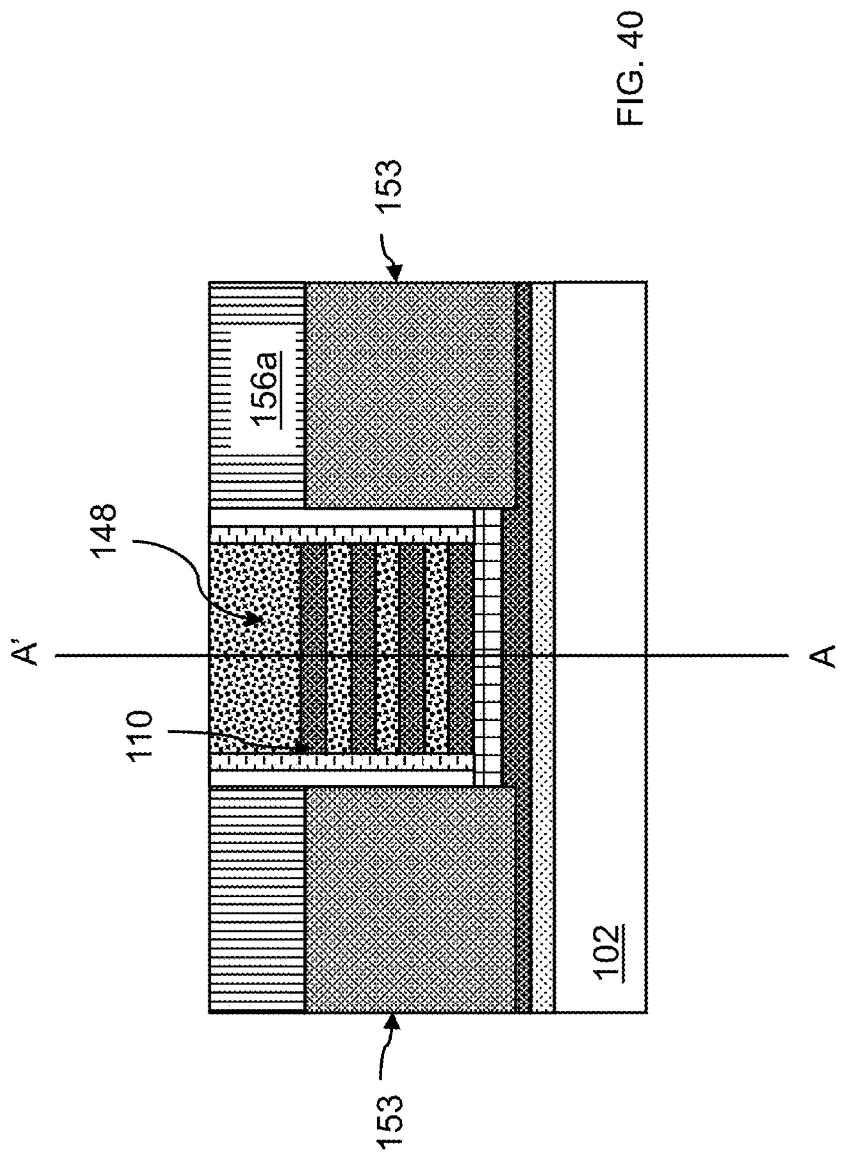
FIG. 40 is a vertical cross-sectional view illustrating a step of depositing gate material between the rails of silicon material in accordance with various alternative embodiments of the disclosure.
Figure 41:
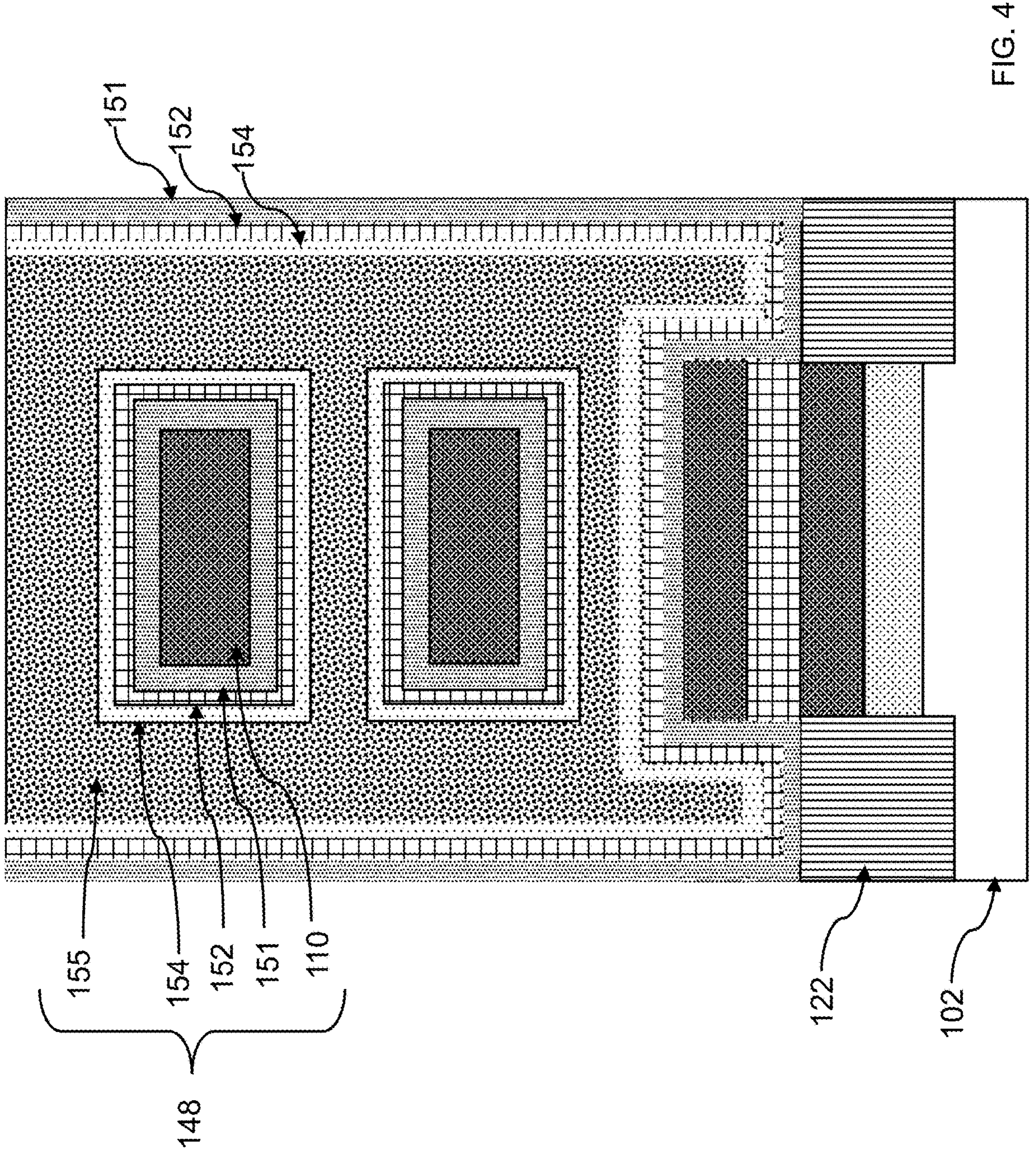
FIG. 41 is a vertical cross-sectional view through line AA' in FIG. 40 in accordance with various embodiments of the disclosure.

Referring to FIGS. 40 and 41, gate material 148 may be conformally deposited on the silicon layers 110 that form the individual nanowires. As discussed above with reference to FIG. 18, in various embodiments the gate material 148 may comprise a liner layer 151, a wetting layer 152, an adhesion layer 154 and a metal layer 155 conformally deposited over the silicon layer 110 that forms the individual nanowires in the trench region 144. The final gate structure may be a high-k/metal gate stack.

Following the step illustrated in FIG. 40, the method may proceed as discussed above with reference to FIGS. 17-29 to fabricate any of the embodiments discussed above.

Figure 42:
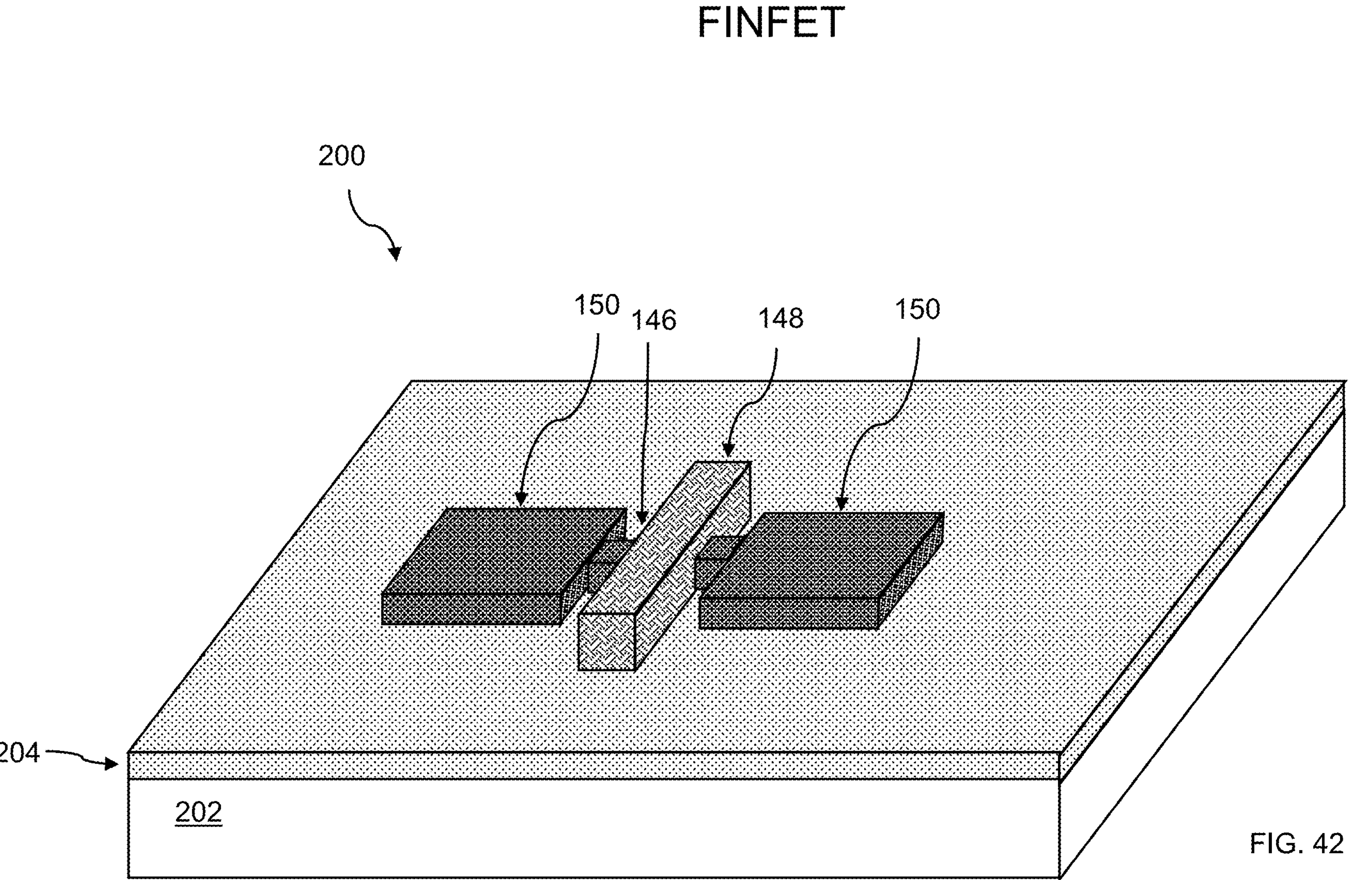
FIG. 42 is a perspective view illustrating a PMOS FinFET in accordance with various embodiments of the disclosure.

Referring to FIG. 42, a perspective illustration of a FinFET 200 according to an embodiment is provided. The FinFET 200 includes a second substrate 202 and an insulating layer 204 formed on top of the second substrate 202. Additionally, the FinFET 200 includes active regions 150 (e.g. source and drain regions) and a channel region 146 located between the active regions 150. A gate stack 148 surrounds the channel regions 146 on three sides.

Figure 43:
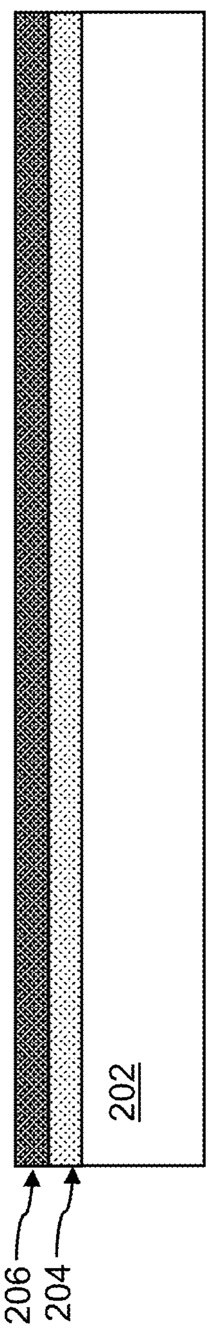
FIG. 43 is a vertical cross-sectional view illustrating a step of depositing an insulating layer and a silicon layer on a substrate in a method of making the PMOS FinFET in accordance with various embodiments of the disclosure.

Referring to FIG. 43, an insulating layer 204 and a silicon epitaxial layer 206 may be sequentially deposited over a second substrate 202 in a method of making the FinFET. The second substrate 202 may be a semiconductor substrate such as a commercially available bulk silicon substrate. Exemplary materials for the insulating layer 204 include an oxide or a nitride. The insulating layer 204 may be deposited by any suitable method such as chemical vapor deposition (CVD) or plasma enhanced chemical vapor deposition (PECVD). Exemplary materials for the silicon epitaxial layer 206 may be doped SiGe. The silicon epitaxial layer 206 may be deposited by any suitable method, such as chemical vapor deposition (CVD) or plasma enhanced chemical vapor deposition (PECVD). In some embodiments, the silicon epitaxial layer 206 may a thickness of approximately 8 to 15 nm, such as 10-12 nm, although lesser or greater thicknesses may also be used.

Figure 44:
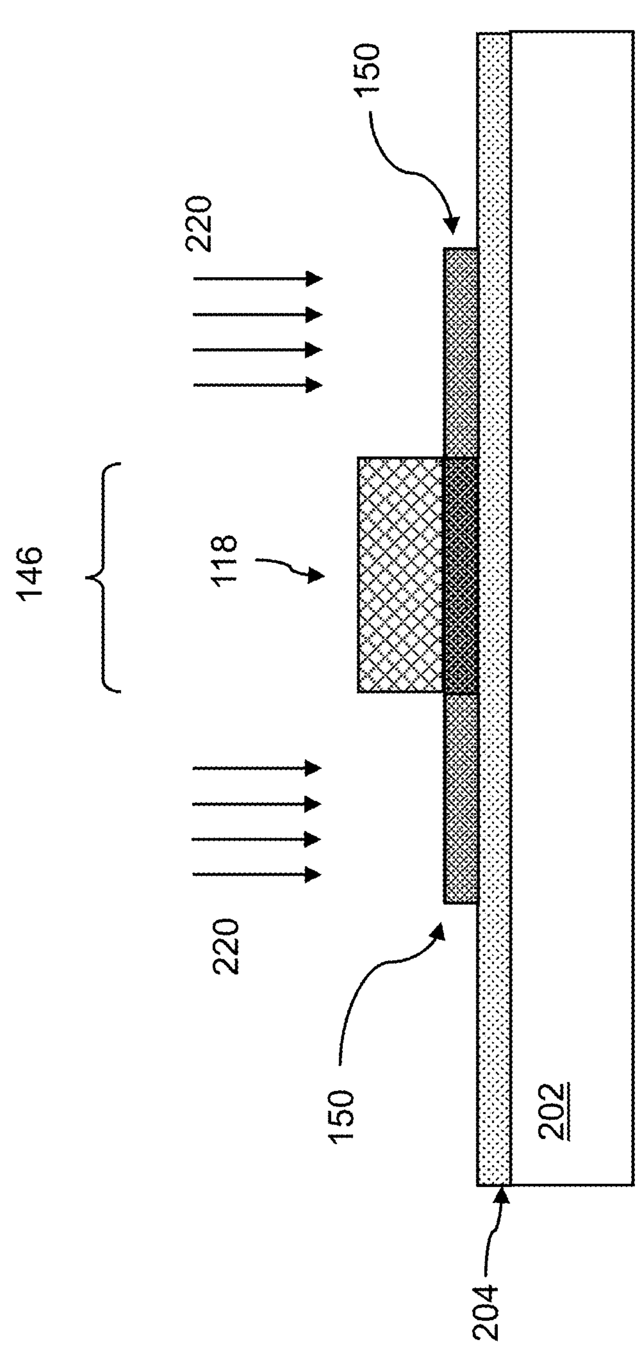
FIG. 44 is a vertical cross-sectional view illustrating a step of making the active regions in a method of making the PMOS FinFET in accordance with various embodiments of the disclosure.

Referring to FIG. 44, a photoresist layer 118 may be deposited over the silicon epitaxial layer 206 and patterned to protect a channel region 146 while exposing the active regions 150 illustrated in FIG. 43. Then, the active regions 150 may be doped such as by ion implanting 220 to complete the active regions 150.

Figure 45:
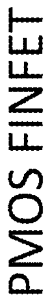
FIG. 45 is a vertical cross-sectional view illustrating a step of deposing a gate stack over the structure illustrated in FIG. 44 to form the gate in a method of making the PMOS FinFET in accordance with various embodiments of the disclosure.
Figure 45:
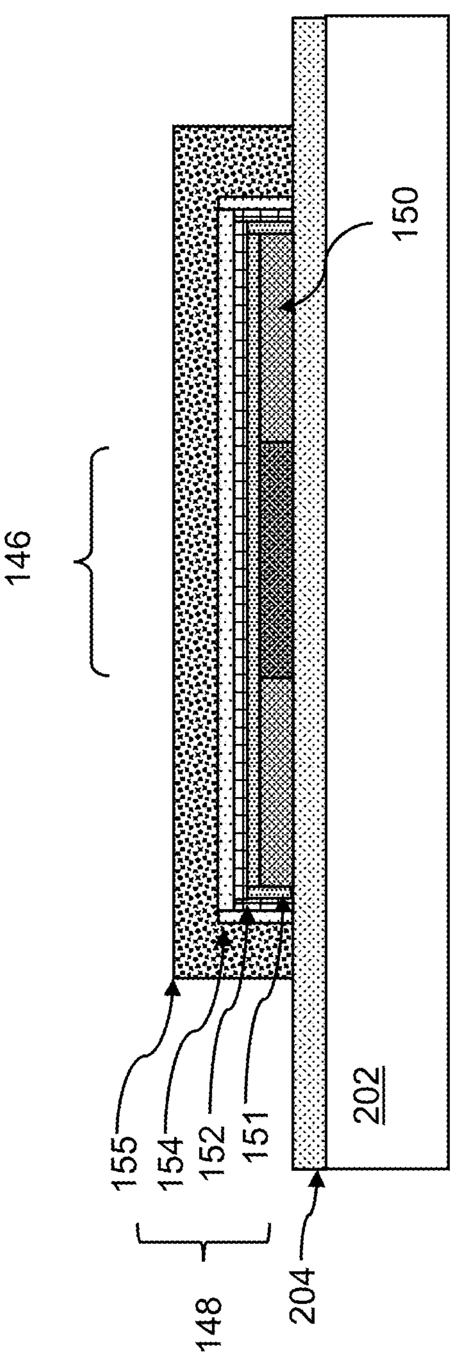

Referring to FIG. 45, a gate stack 148 may then be formed over the intermediate structure illustrated in FIG. 45. As described above, the gate stack 148 may include, a liner layer 151, a wetting layer 152, an adhesion layer 154 and a metal gate layer 155.

Figure 46:
FIG. 46 is a vertical cross-sectional view illustrating a step of patterning the gate stack in a method of making the PMOS FinFET in accordance with various embodiments of the disclosure.
Figure 46:
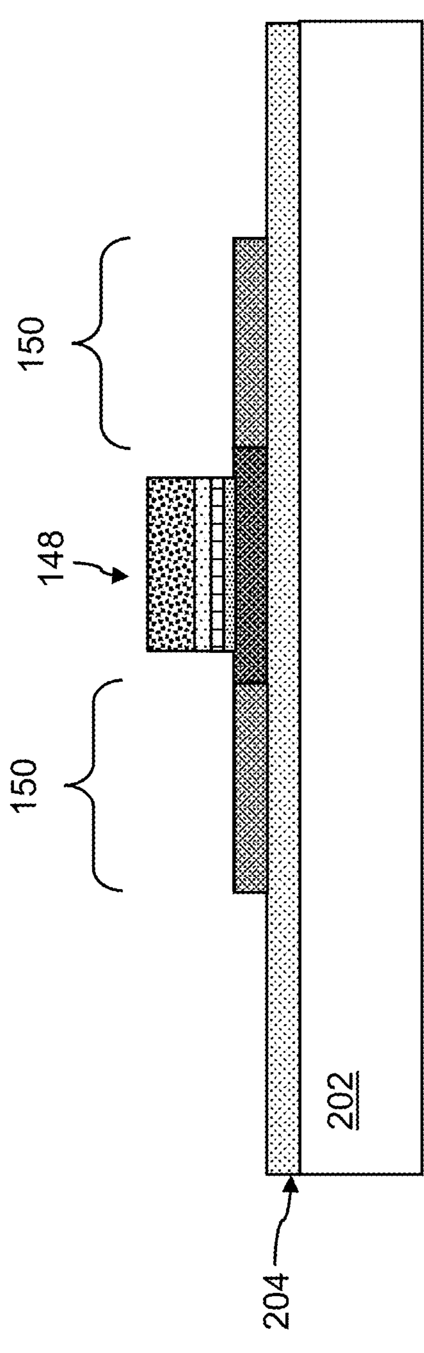

Referring to FIG. 46, a photoresist layer (not shown) may be deposited over the gate stack and patterned to form the gate stack 148 such that gate stack material is removed from the over active regions 150 and portions of the channel region 146 adjacent the active regions 150. In this manner, the device 200 has the vertical cross section illustrated in FIG. 46 and the structure illustrated in perspective view of FIG. 42.

Figure 47:
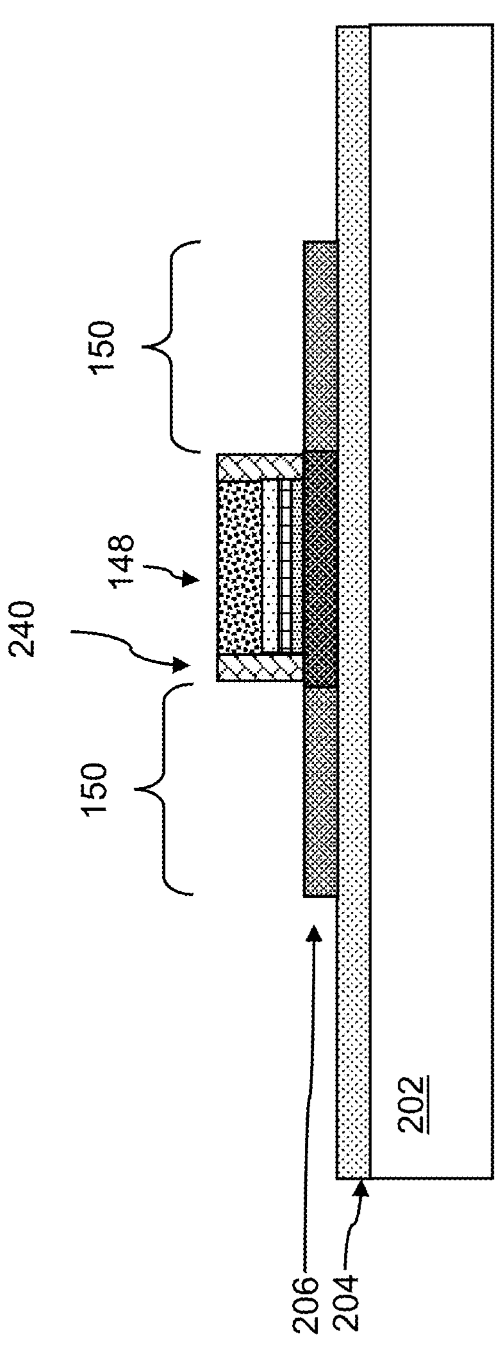
FIG. 47 is a vertical cross-sectional view illustrating a step of forming sidewall spacers on the metal gate in a method of making the PMOS FinFET in accordance with various embodiments of the disclosure.

Referring to FIG. 47, sidewall spacers 240 may be formed on the sidewalls of the gate stack 148. In various embodiments, the sidewall spacers 240 may be made of an insulating material such as an oxide or nitride although other suitable insulating materials are within the contemplated scope of disclosure.

Figure 48:
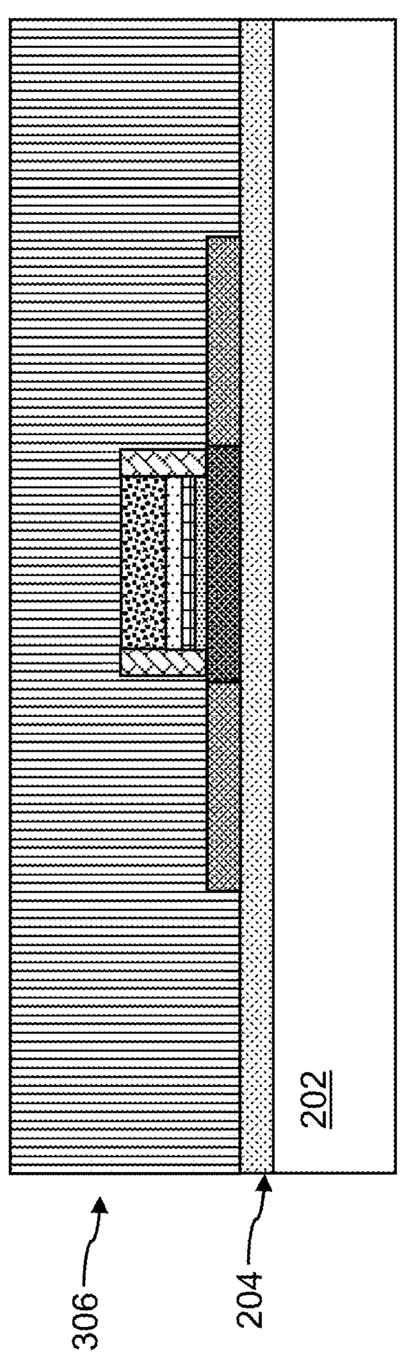
FIG. 48 is a vertical cross-sectional view illustrating a step of depositing a dielectric layer over the structure illustrated in FIG. 47 in accordance with various embodiments of the disclosure.

Referring to FIG. 48, a dielectric layer 306 may be deposited over the surface of the intermediate structure illustrated in FIG. 48.

Figure 49:
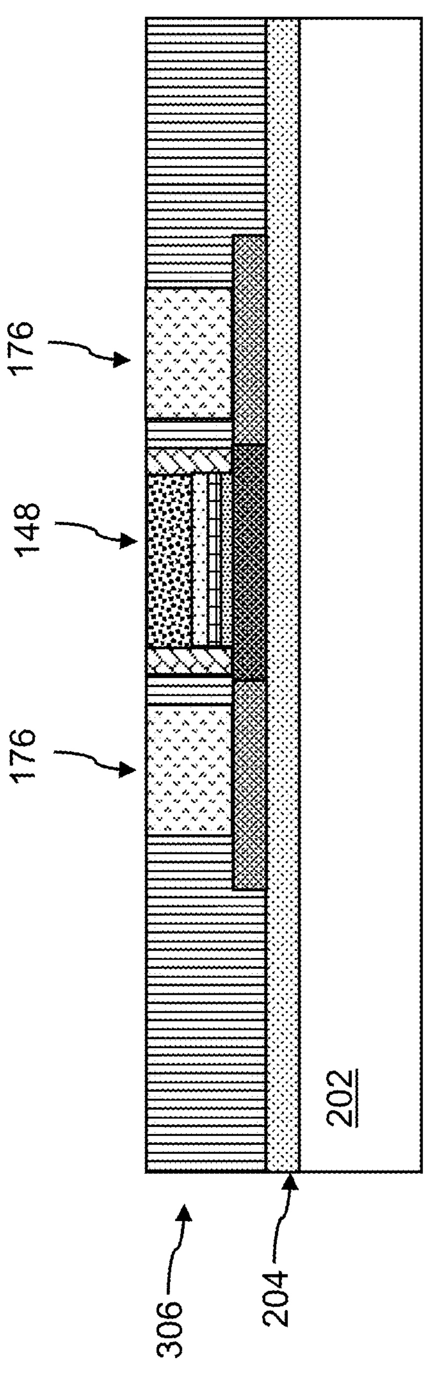
FIG. 49 is a vertical cross-sectional view illustrating a step of forming via holes in the dielectric layer and making contacts to the active regions in the structure illustrated in FIG. 48 in accordance with various embodiments of the disclosure.

Referring to FIG. 49, the surface of the intermediate structure of FIG. 48 may be planarized, such as by CMP, to thin the dielectric layer 306 to the thickness of the gate stack 148. Then, via holes (not shown) may be formed in the dielectric layer 306. The via holes may then be filled with conducting material to form active region contacts 176.

Figure 50:
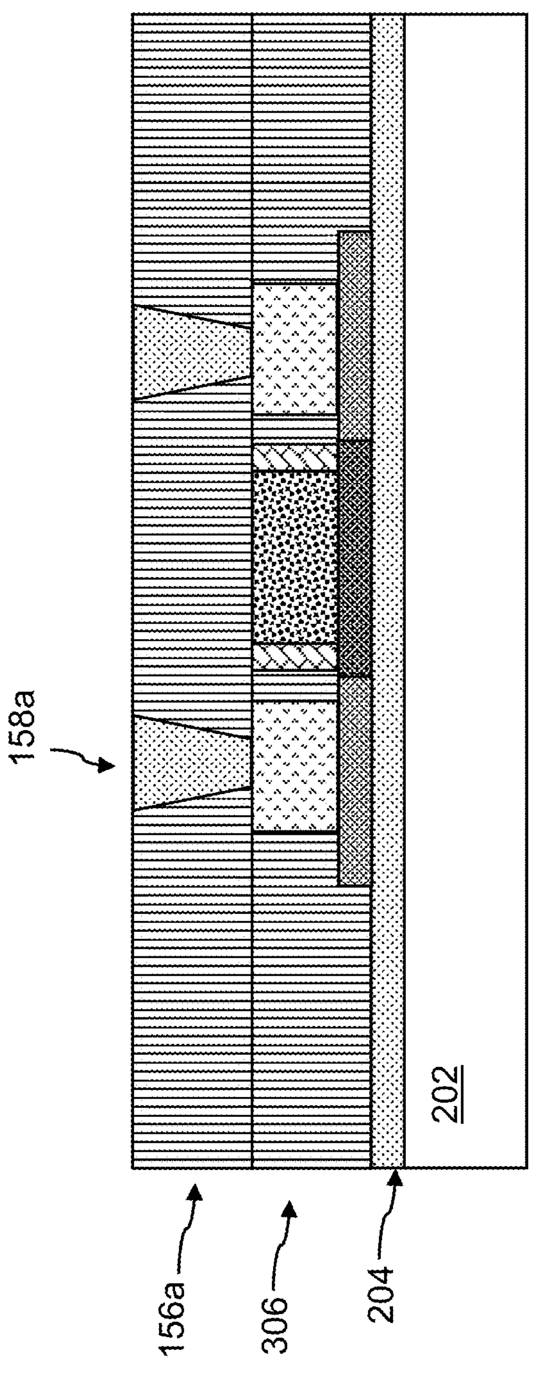
FIG. 50 is a vertical cross-sectional view illustrating a step of depositing an interlayer dielectric layer and forming interconnects in the interlayer dielectric layer in the structure illustrated in FIG. 49 in accordance with various embodiments of the disclosure.

Referring to FIG. 50, a first interlayer dielectric layer **156*a* may be deposited over the dielectric layer 306. Further, the first ILD layer 156*a* may be patterned to form via holes (not shown). The via holes may be filled to form first level interconnects 158*a* to the active region contacts 176**.

Figure 51:
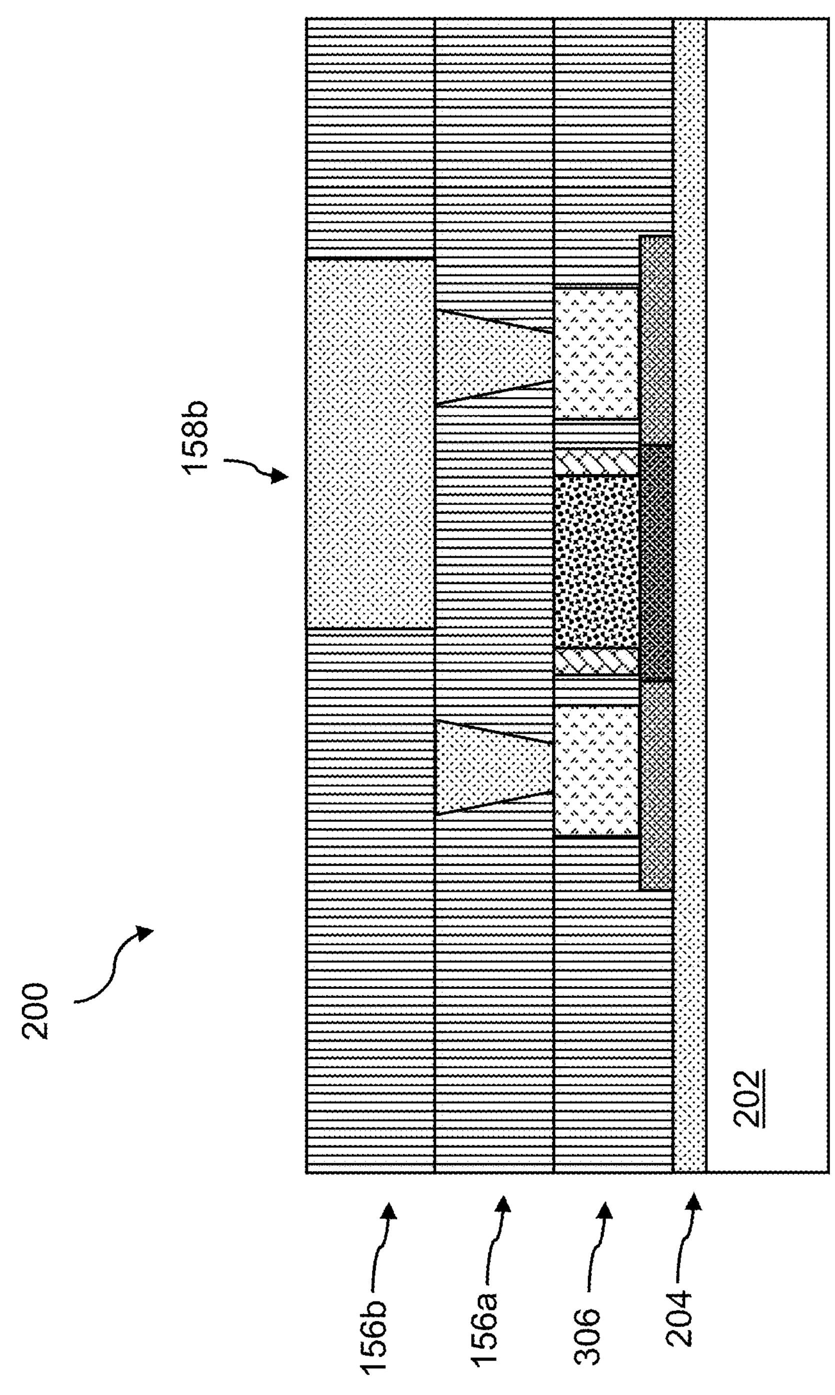
FIG. 51 is a vertical cross-sectional view illustrating a step of depositing an second interlayer dielectric layer and forming an interconnect in the interlayer dielectric layer in the structure illustrated in FIG. 50 in accordance with various embodiments of the disclosure.

Referring to FIG. 51, back end of the line (BEOL) metal routing may be formed to provide metal contacts for the FinFET 200. For example, a second ILD layer **156*b* may be deposited over the first ILD layer 156*a*. The second ILD layer 156*b* may be patterned such that a second level interconnect 158*b* may be formed in the second ILD layer 156*b*. The second level interconnect 158*b* may contact one of the first level interconnects 158*a* such that a connection may be formed to one of the active regions 150. Thus, first and second level interconnects 158*a* and 158*b* may be considered BEOL metal contacts (158*a*, 158*b*) for the FinFET 200**.

Figure 52:
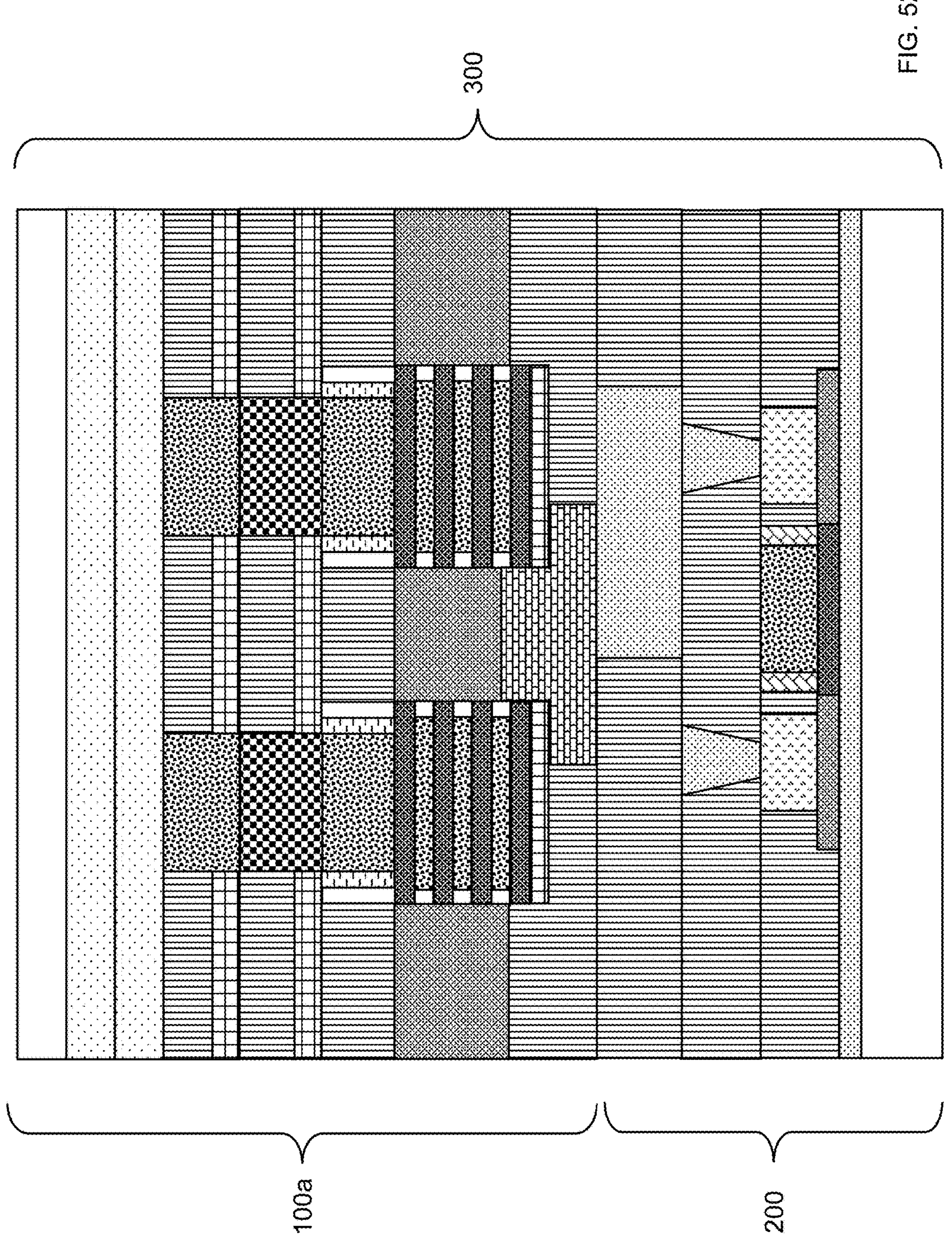
FIG. 52 is a vertical cross-sectional view illustrating a step of bonding an NMOS gate all around device to a PMOS FinFET to form a vertical CMOS device in accordance with various embodiments of the disclosure.

Referring to FIG. 52, a gate all around metal oxide semiconductor field effect transistor device **100*a* as illustrated in FIG. 28 may be bonded to a FinFET 200 as illustrated in FIG. 52 to form device 300. In various embodiments, the gate all around MOSFET device 100*a* may be an NMOS device and the FinFET 200 may be a PMOS device. The resulting device 300 is therefore a CMOS device. In alternative embodiments, the gate all around MOSFET device 100*a* may be a PMOS device and the FinFET 200 may be an NMOS device. The resulting device 300** is also a CMOS device.

Figure 53:
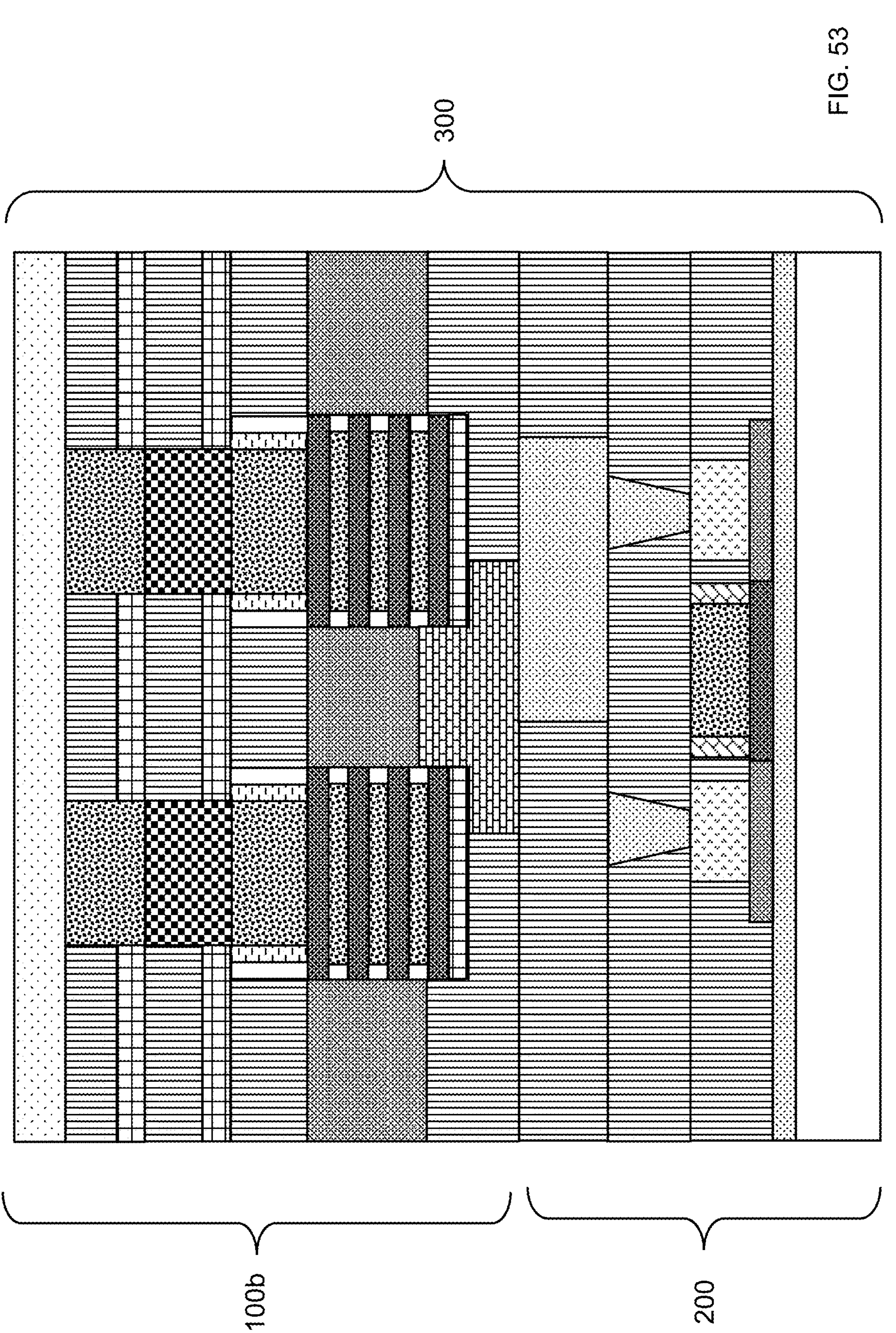
FIG. 53 is a vertical cross-sectional view illustrating a step of removing the carrier wafer of the vertical CMOS device illustrated in FIG. 52 in accordance with various embodiments of the disclosure.

Referring to FIG. 53, the carrier wafer 166 may be removed from the device 300. The carrier wafer 166 may be removed by any suitable method, such as CMP.

Figure 54:
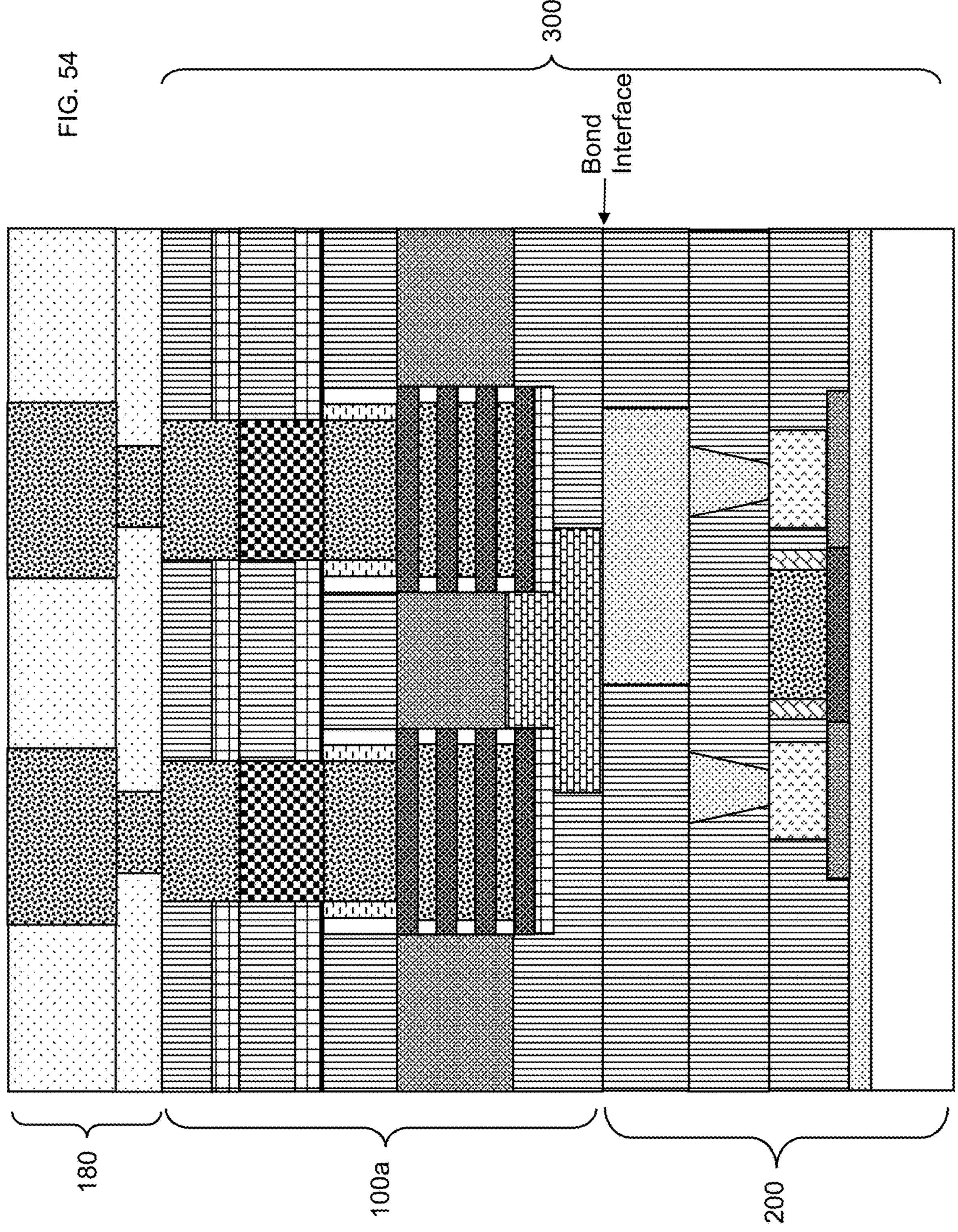
FIG. 54 is a vertical cross-sectional view illustrating a step of forming the back end of line routing of the vertical CMOS device illustrated in FIG. 53 in accordance with various embodiments of the disclosure.

Referring to FIG. 54, back end of the line (BEOL) metal routing 180 may be added to the device 300. With BEOL metal routing 180 wires may be formed in interconnect dielectric layers to connect individual transistors to form an integrated circuit device.

Figure 55:
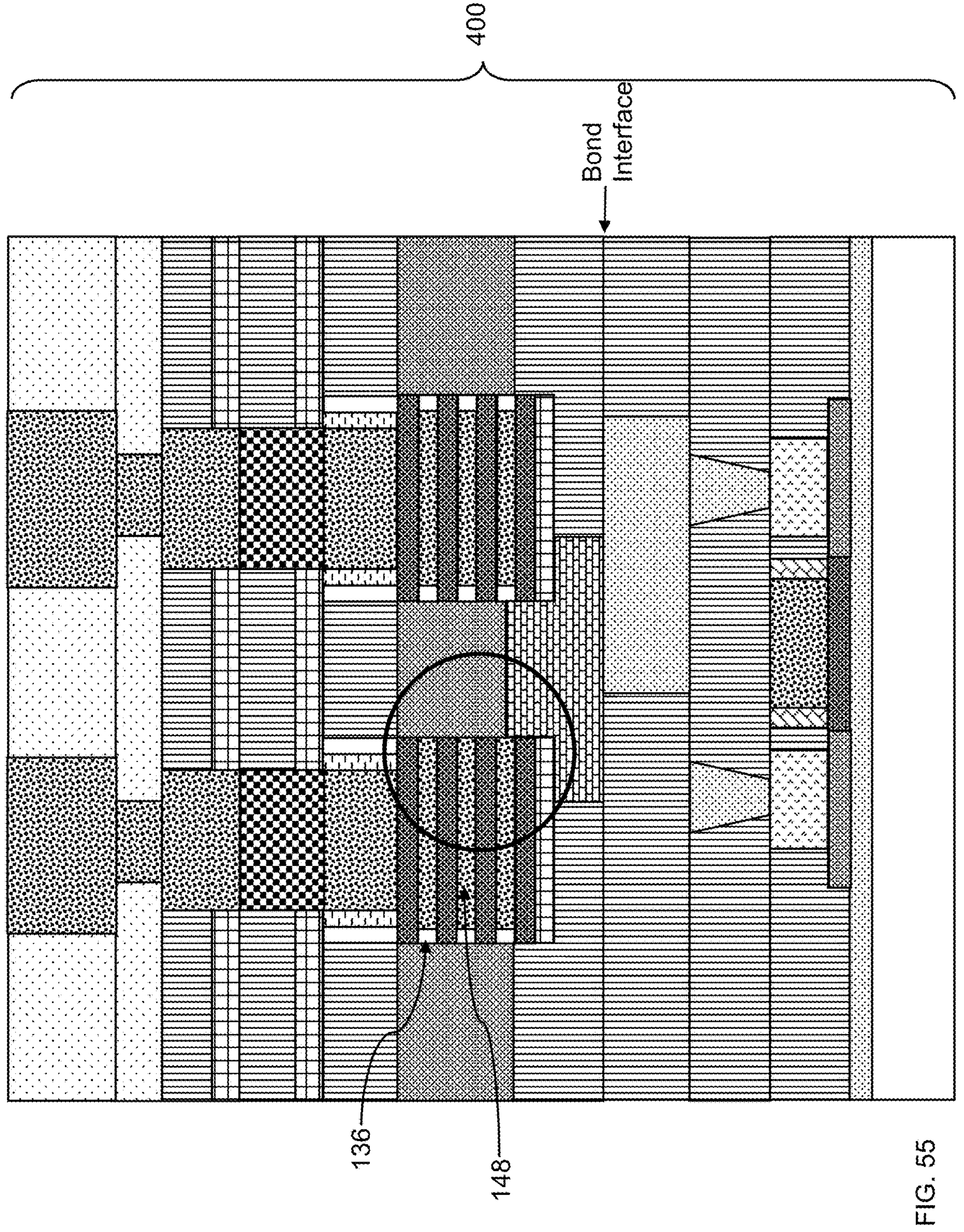
FIG. 55 is a vertical cross-sectional view illustrating an embodiment lacking inner spacers on one side of the nanowire gates in accordance with various embodiments of the disclosure.
Figure 56:
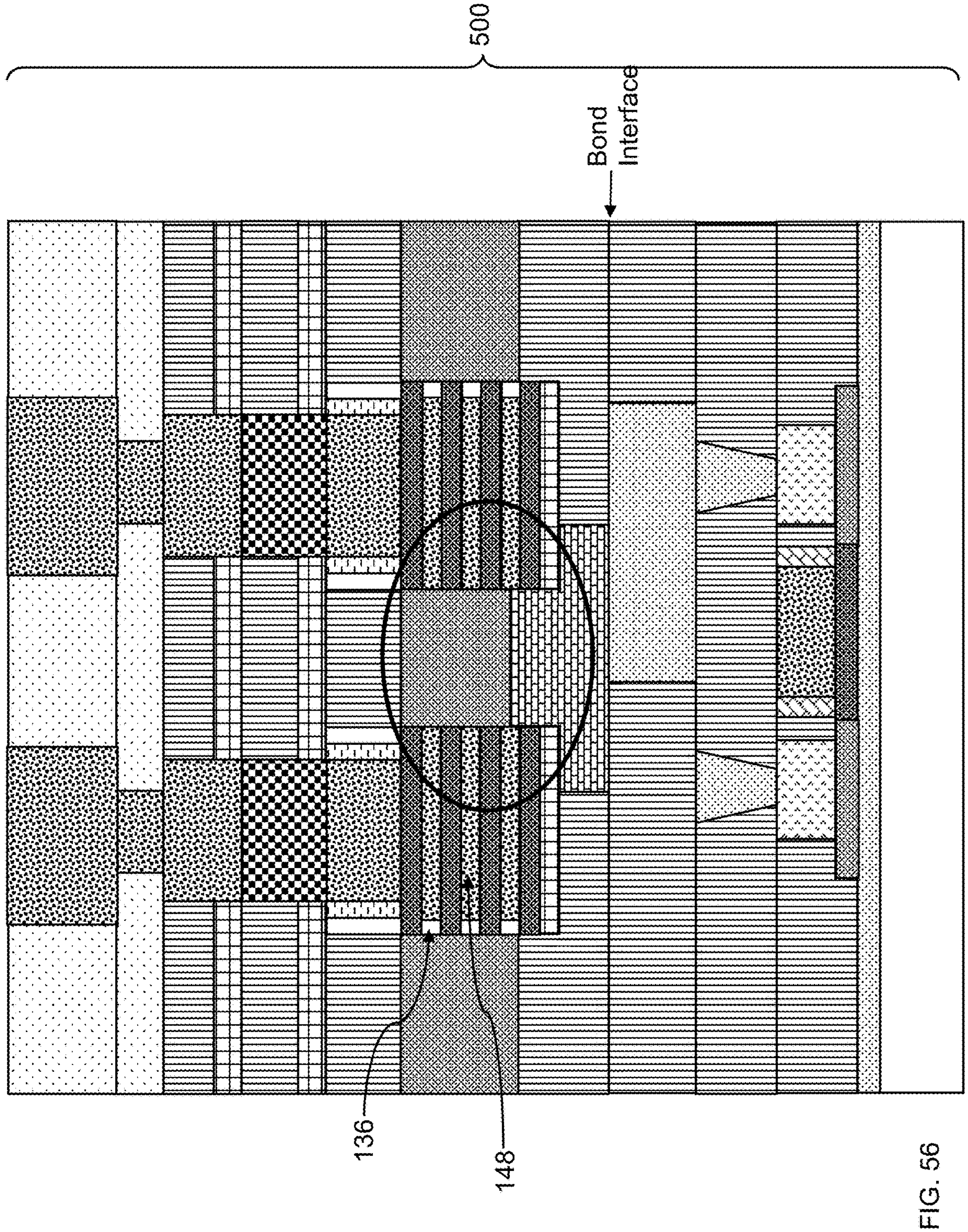
FIG. 56 is a vertical cross-sectional view illustrating an embodiment lacking inner spacers on both sides of the nanowire gates in accordance with various embodiments of the disclosure.

Referring to FIG. 55, an embodiment device 400 is illustrated in which dielectric spacer layer 136 may not be formed around one side of the silicon material layers 110 that form nanowire in the channel region 146 as shown in the highlighted circle of interest in FIG. 56 (compare to same region of interest in FIG. 54). By not forming the dielectric spacer layer 136 around one side of the silicon material layers 110 that form nanowire in the channel region 146, the gate stack 148 can be extended to increase coverage of the silicon material layers 110 that form nanowire in the channel region 146. By replacing the high resistance dielectric spacer layer 136 with metal gate stack material 148 or polysilicon, the overall resistance may be lowered as compared to a device (e.g., 300) with dielectric spacer layer 136. The overall resistance may be further reduced by replacing the dielectric spacer layer 136 with a material having a lower resistance than the gate stack material 148. For example, a type I resistor may be formed by replacing the high resistance dielectric spacer layer 136 with polysilicon. A type II resistor may be formed by replacing the high resistance dielectric spacer layer 136 with a metal. A type III resistor may be formed by replacing the high resistance dielectric spacer layer 136 with lower resistance metal than the metal for the type II resistor. Further, in an alternative embodiment, high resistance dielectric spacer layer 136 may be replaced with dielectric/metal/dielectric materials to form a dielectric/metal/dielectric capacitor.

Referring to FIG. 56, an embodiment device 500 is illustrated in which dielectric spacer layer 136 are not formed around both sides of the silicon material layers 110 that form nanowire in the channel region 146. In this embodiment, the gate stack 148 may be extended even further than the gate stack 148 of the previous embodiment shown in FIG. 55. Therefore, the overall resistance of the may be reduced further as compared to the previous embodiment device 400 shown in FIG. 55 or device 300 shown in FIG. 54.

Figure 57:
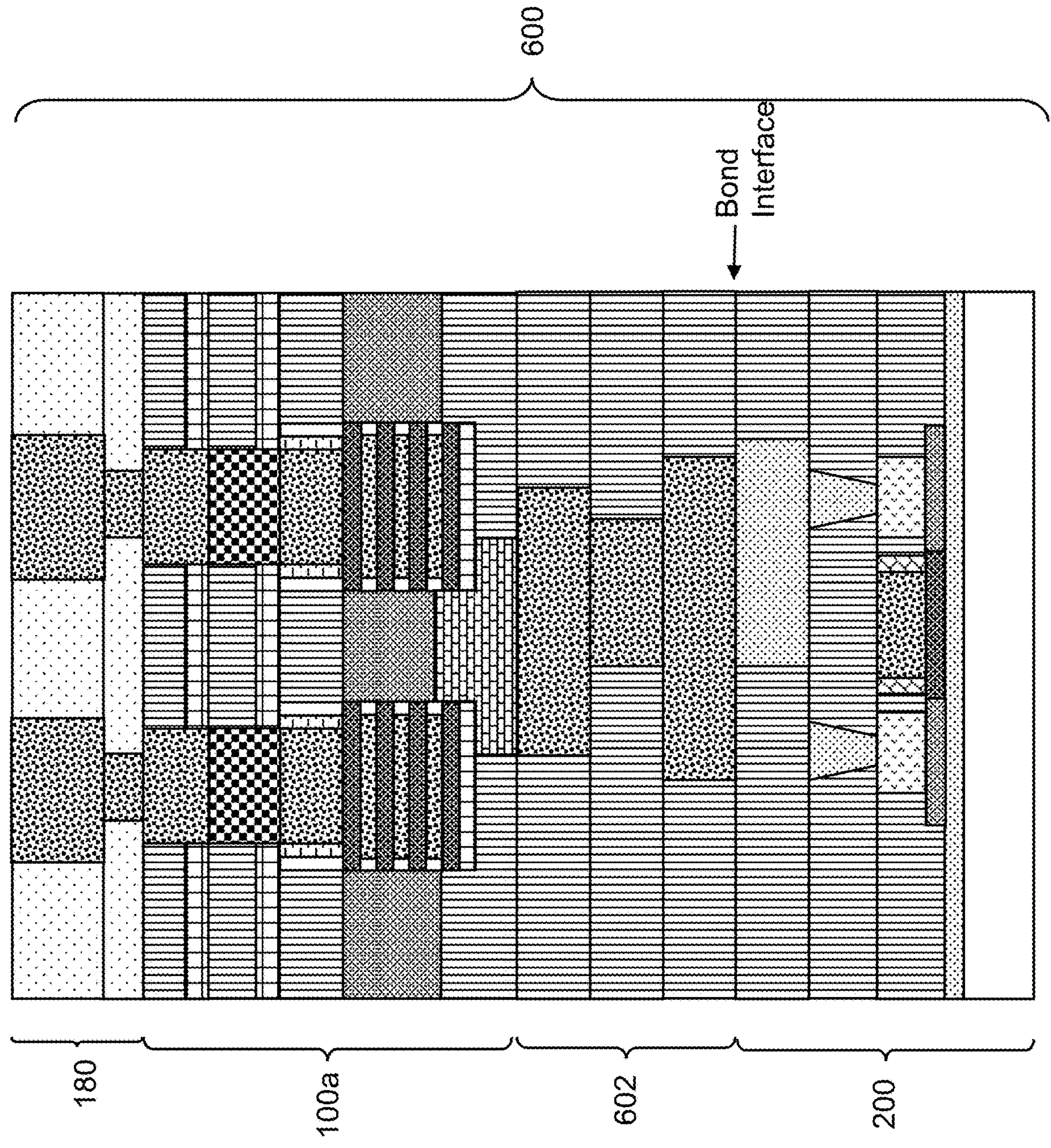
FIG. 57 is a vertical cross-sectional view illustrating an embodiment with a redistribution layer located between the PMOS and NMOS transistors in accordance with various embodiments of the disclosure.

Referring to FIG. 57, an embodiment device 600 is illustrated in which a redistribution layer (RDL) 602 may be provided between the gate all around metal oxide semiconductor field effect transistor device **100*a* and the FinFET 200. A redistribution layer 602** is an extra metal layer on a chip that makes the input output pads of the integrated circuit available to other locations of the chip.

Figure 58:
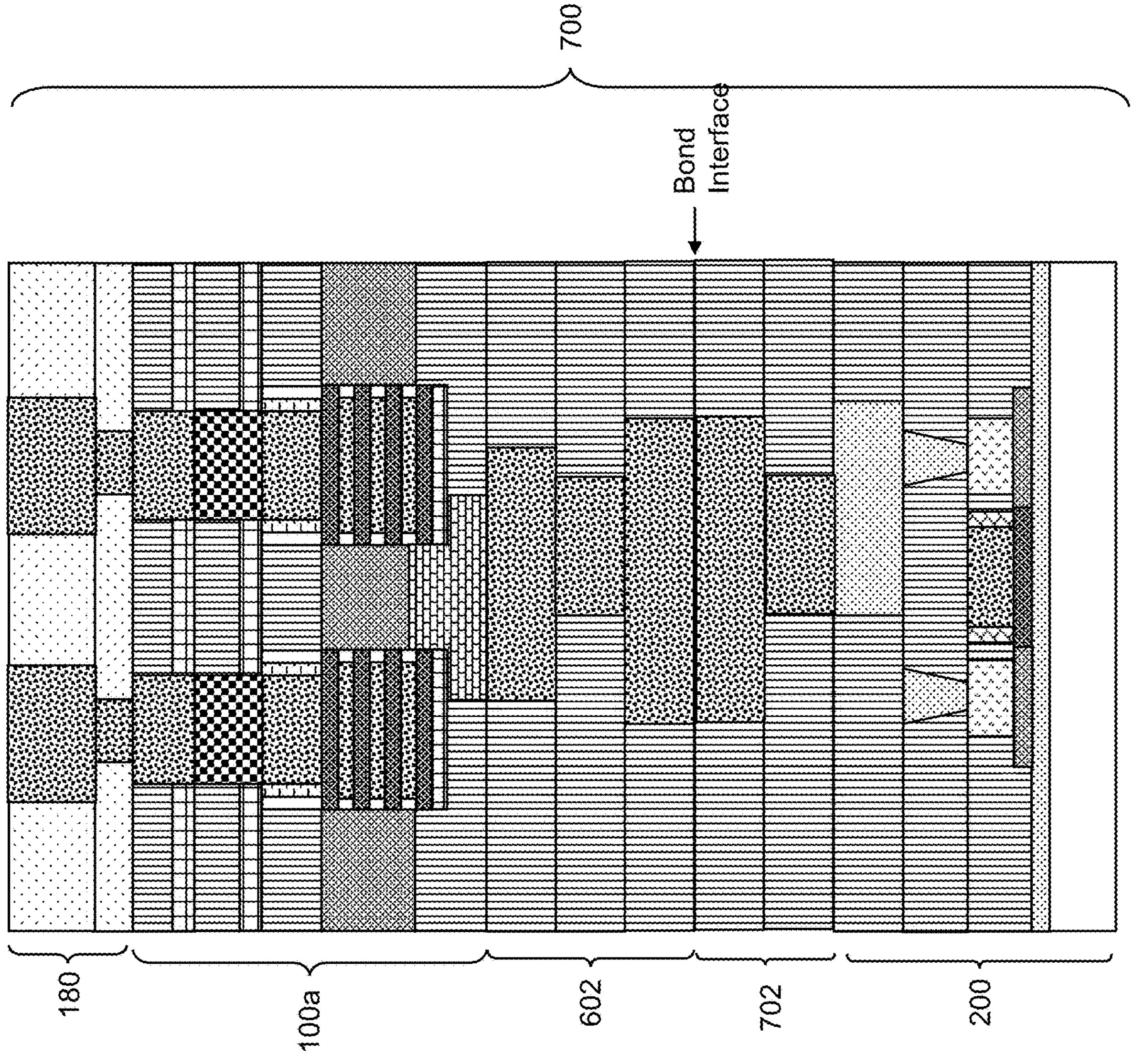
FIG. 58 is a vertical cross-sectional view illustrating an embodiment with two redistribution layers located between the PMOS and NMOS transistors in accordance with various embodiments of the disclosure.

Referring to FIG. 58, an embodiment device 700 is illustrated in which a second redistribution layer (RDL) 702 may be provided between the gate all around metal oxide semiconductor field effect transistor device **100*a* and the FinFET 200 in addition to the first RDL 602**.

Figure 59:
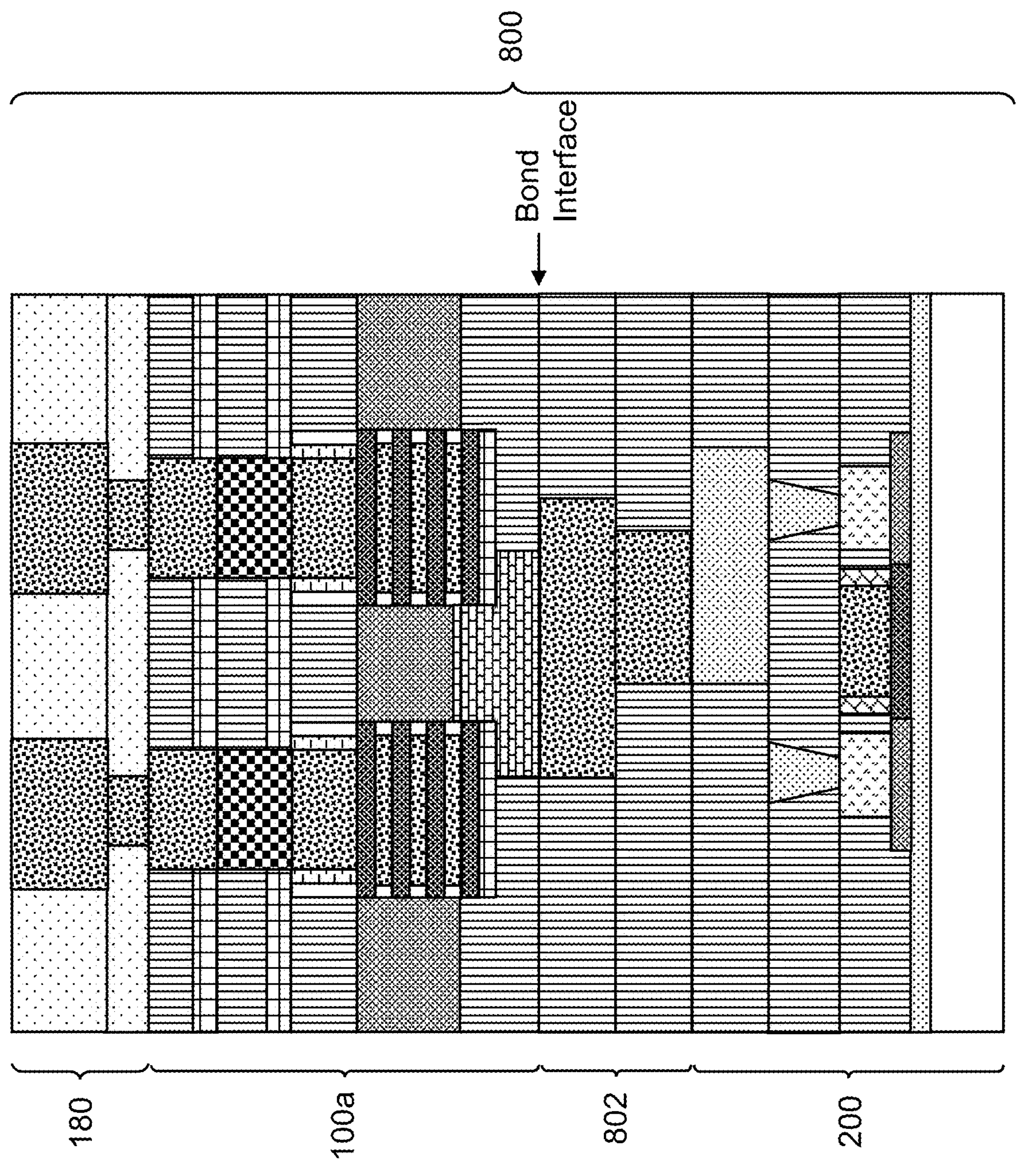
FIG. 59 is a vertical cross-sectional view illustrating an embodiment with a redistribution layer located between the PMOS and NMOS transistors in accordance with various embodiments of the disclosure.

Referring to FIG. 59, an embodiment device 800 is illustrated in which a redistribution layer (RDL) 802 with a different configuration than the RDL layer 602 may be provided between the gate all around metal oxide semiconductor field effect transistor device **100*a* and the FinFET 200. Specifically, the RDL 802 does not have a landing pad in contact with the first level interconnect 158*a* of the FinFET 200**.

Figure 60:
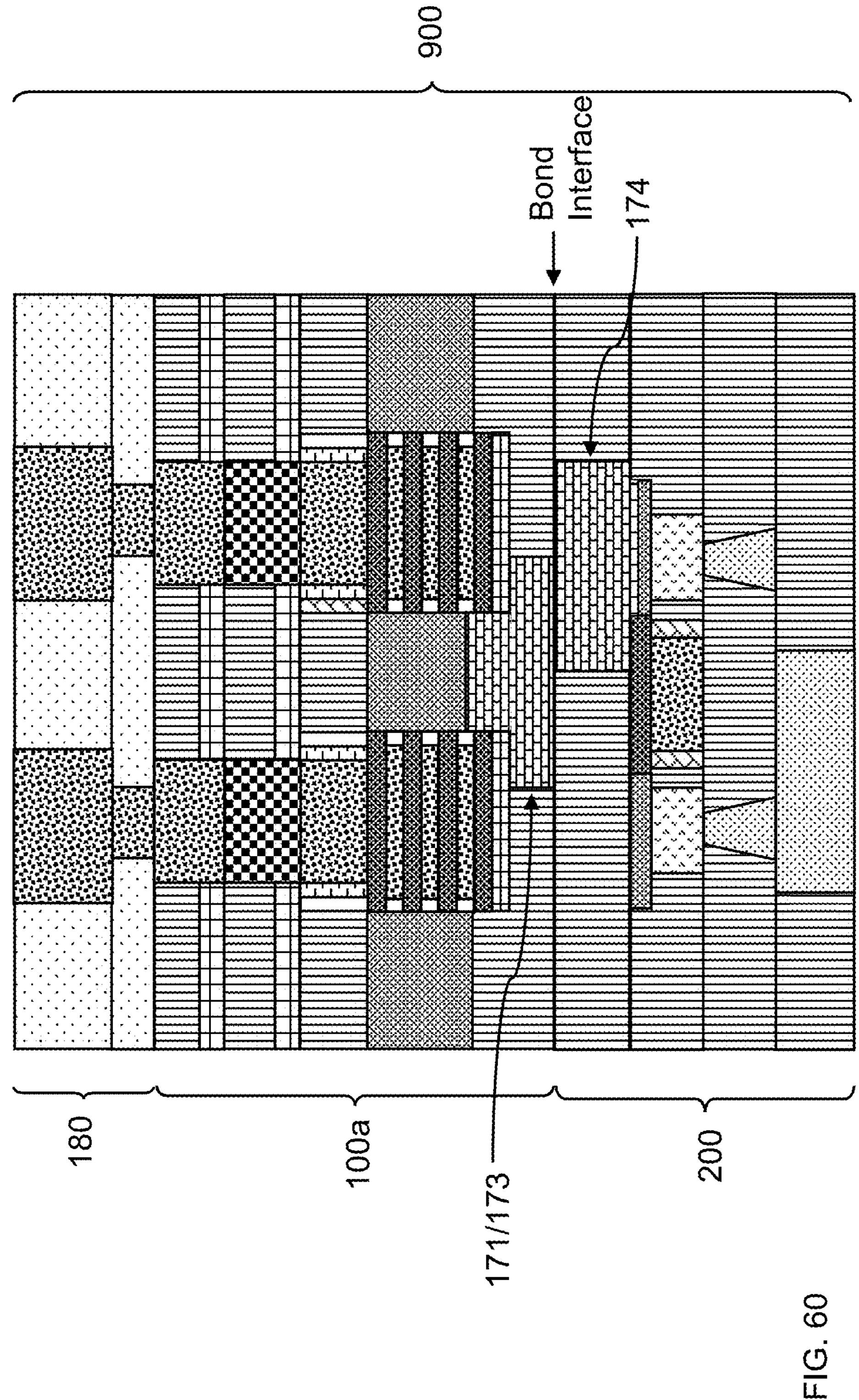
FIG. 60 is a vertical cross-sectional view illustrating an embodiment without a redistribution layer located between the PMOS and NMOS transistors in accordance with various embodiments of the disclosure.

Referring to FIG. 60, an embodiment device 900 is illustrated in which the FinFET 200 may flipped relative to the FinFET 200 shown in previous embodiments. In this embodiment, a contact via 171/173 of the gate all around metal oxide semiconductor field effect transistor device 100*a* is in contact with a bottom contact 174 of the FinFET 200. In this embodiment, hybrid bonding may be used. That is, bonds may be formed between the surfaces of the opposing ILD layers and bond formed between opposing metal contacts in the same step.

Figure 61:
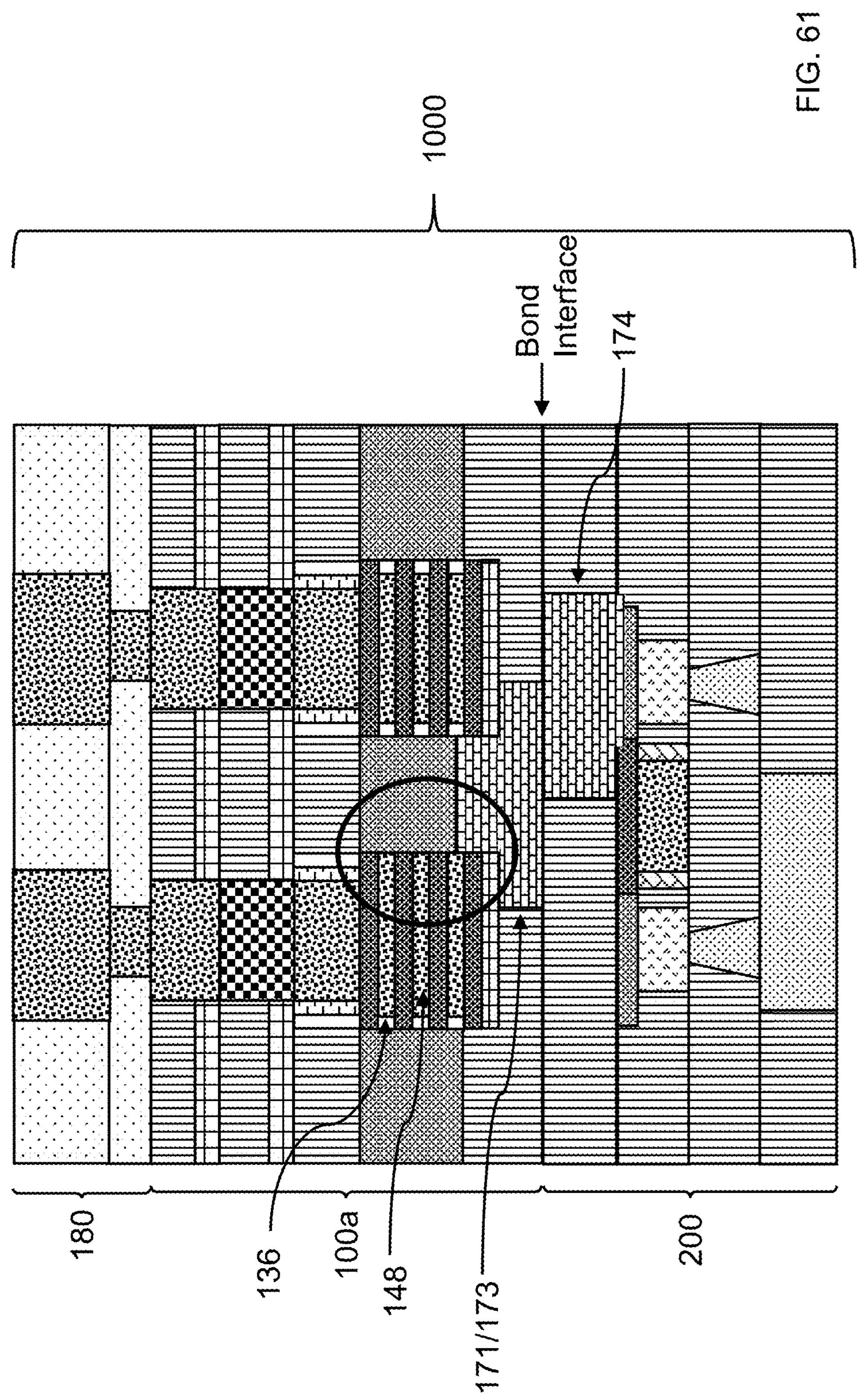
FIG. 61 is a vertical cross-sectional view illustrating an embodiment lacking inner spacers on one side of the nanowire gates in accordance with various embodiments of the disclosure.

Referring to FIG. 61, an embodiment device 1000 is illustrated which is similar to the previous device 900. In the present embodiment, dielectric spacer layer 136 are not formed around one side of the silicon material layers 110 that form nanowire in the channel region 146. By not forming the dielectric spacer layer 136 around one side of the silicon material layers 110 that form nanowire in the channel region 146, the gate stack 148 may be extended to increase coverage of the silicon material layers 110 that form nanowire in the channel region 146. By replacing the high resistance dielectric spacer layer 136 with metal gate stack material, the overall resistance can be lowered relative to a device with dielectric spacer layer 136. The overall resistance can be further reduced by replacing the dielectric spacer layer 136 with a low resistance metal having a lower resistance than the gate stack material.

Figure 62:
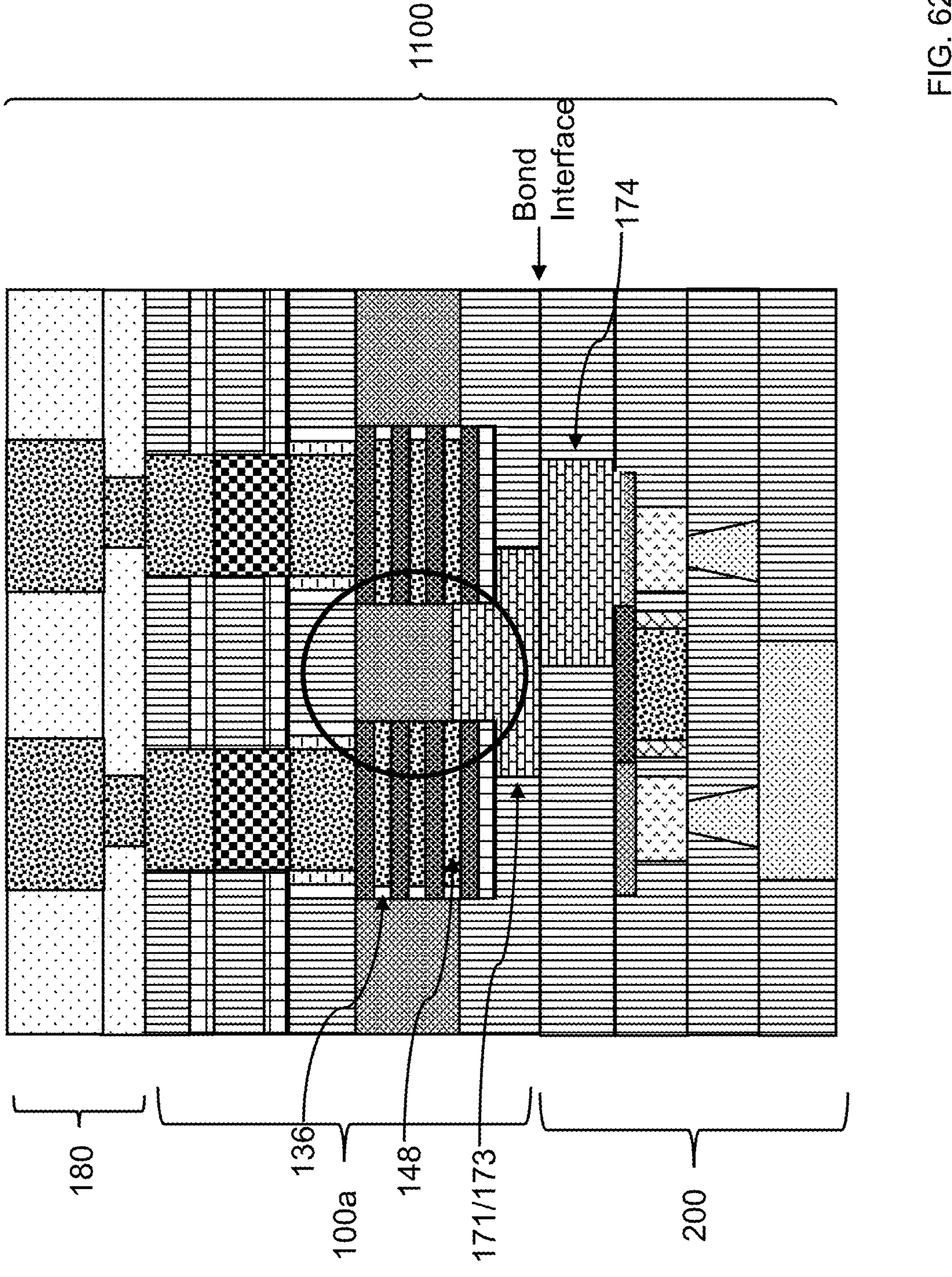
FIG. 62 is a vertical cross-sectional view illustrating an embodiment lacking inner spacers on both sides of the nanowire gates in accordance with various embodiments of the disclosure.

Referring to FIG. 62, an embodiment device 1100 is illustrated which is similar to the previous device 900. In this embodiment, dielectric spacer layer 136 may not be formed around both sides of the silicon material layers 110 that form nanowire in the channel region 146. In this embodiment, the gate stack 148 may be extended even further than the gate stack 148 of the previous embodiment device 1000. Therefore, the overall resistance of the embodiment device 1100 may be reduced further relative to the previous embodiment devices 900 and 1000.

Figure 63:
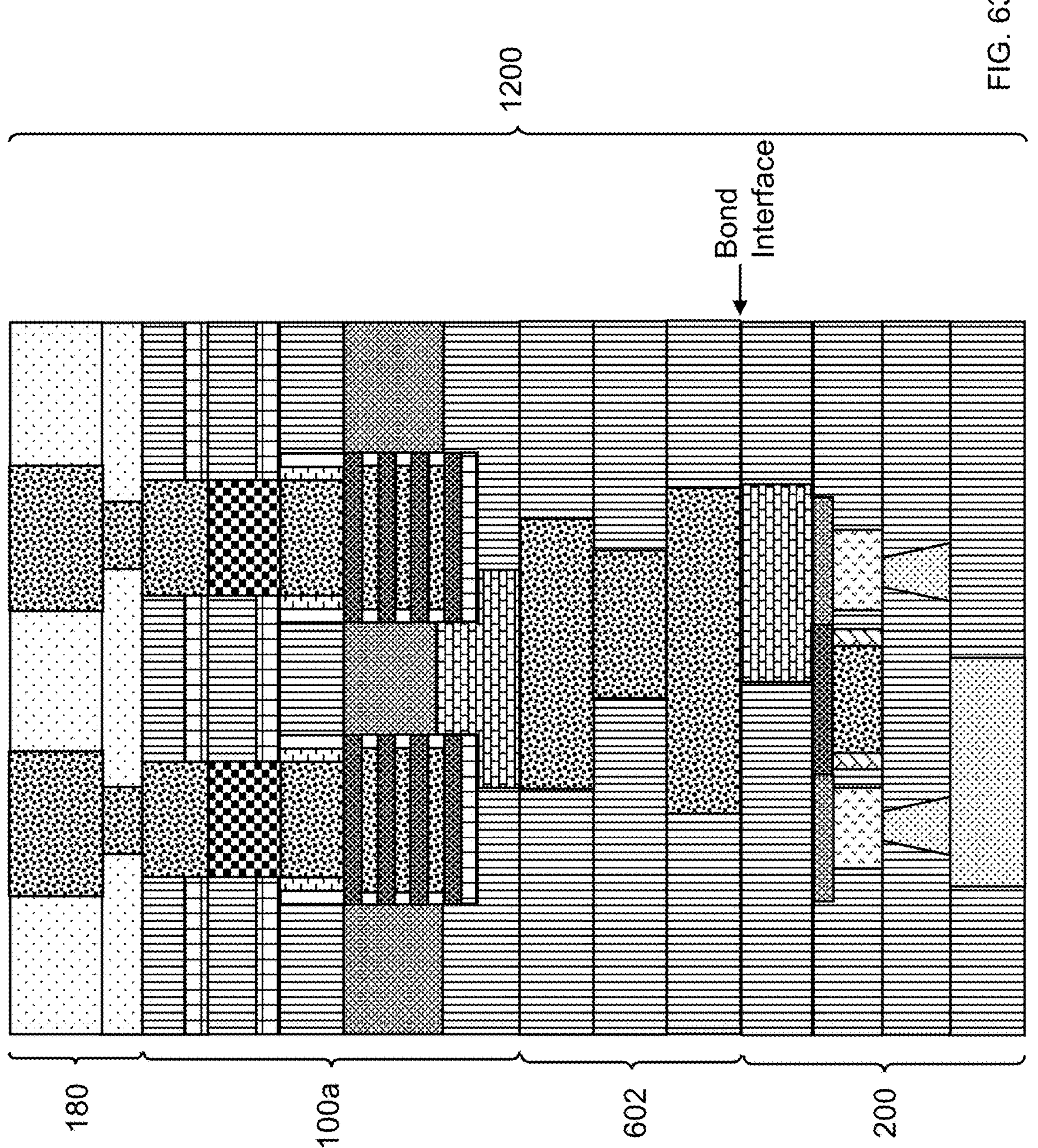
FIG. 63 is a vertical cross-sectional view illustrating an embodiment with a redistribution layer located between the PMOS and NMOS transistors in accordance with various embodiments of the disclosure.

Referring to FIG. 63, an embodiment device 1200 is illustrated which is similar to the previous device 900. In this embodiment, a redistribution layer (RDL) 602 may be provided between the gate all around metal oxide semiconductor field effect transistor device 100*a* and the FinFET 200.

Figure 64:
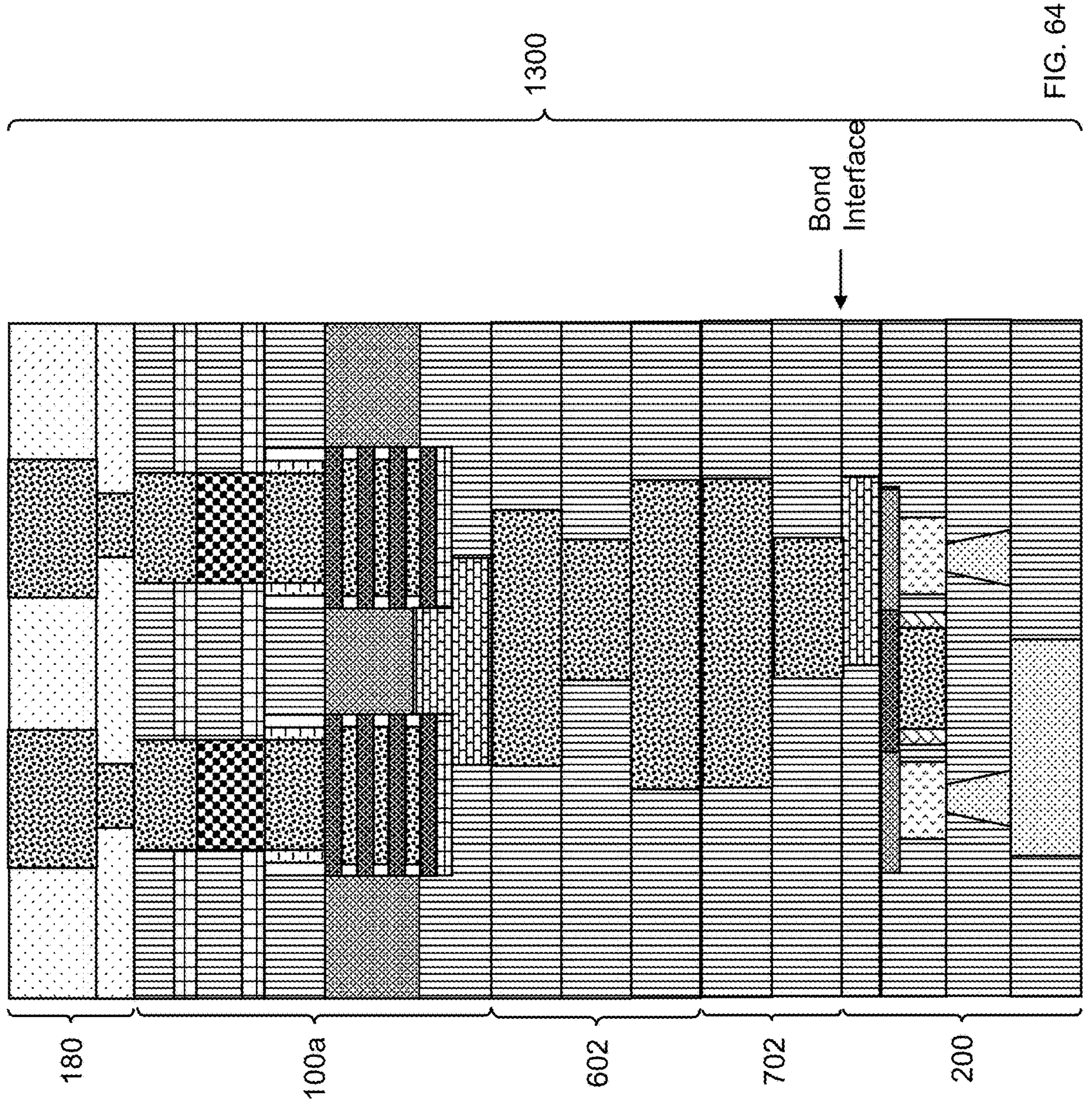
FIG. 64 is a vertical cross-sectional view illustrating an embodiment with two redistribution layers located between the PMOS and NMOS transistors in accordance with various embodiments of the disclosure.

Referring to FIG. 64, an embodiment device 1300 is illustrated which is similar to the previous device 900. In this embodiment, a second redistribution layer (RDL) 702 may be provided between the gate all around metal oxide semiconductor field effect transistor device 100*a* and the FinFET 200 in addition to the first RDL 602.

Figure 65:
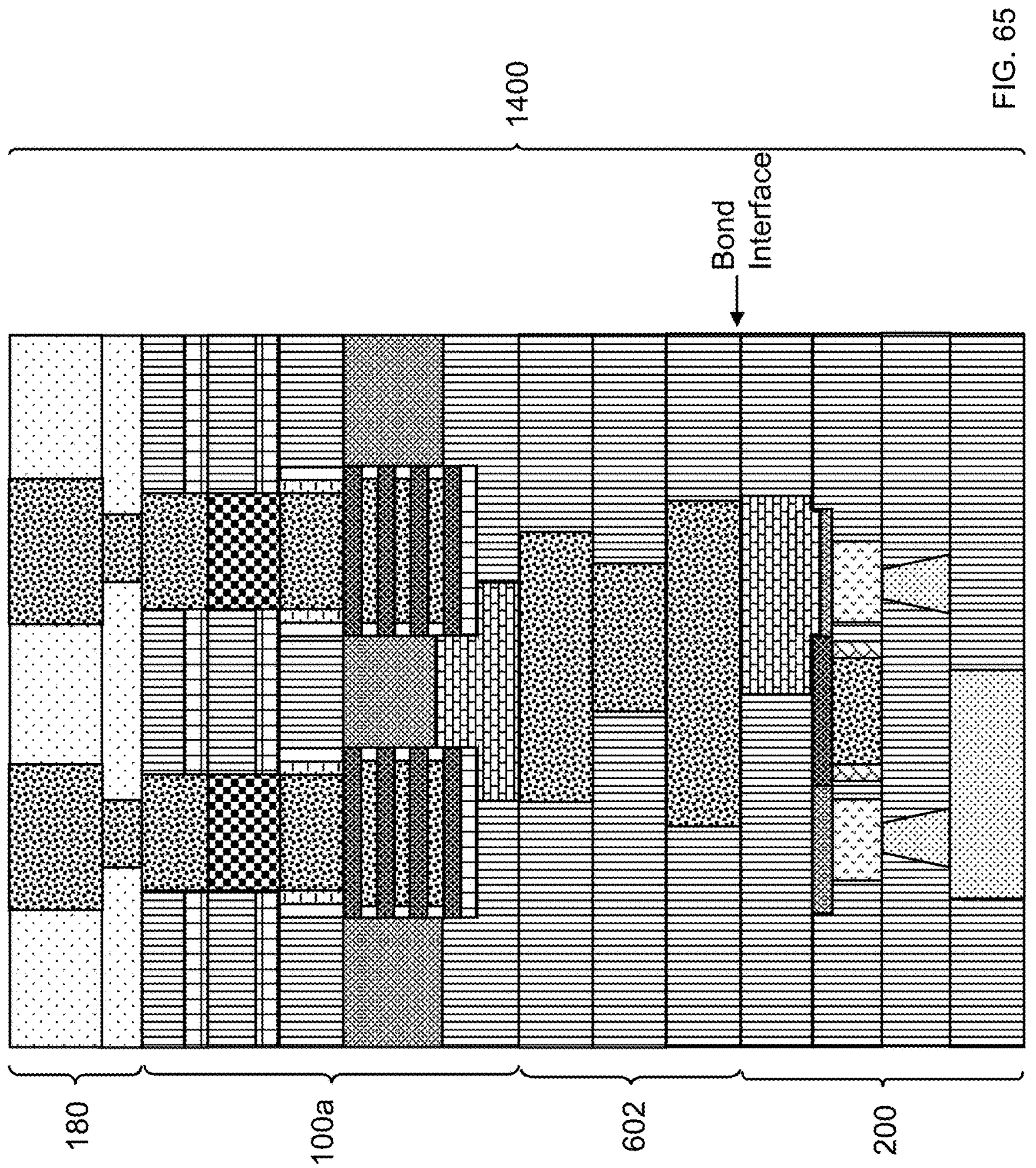
FIG. 65 is a vertical cross-sectional view illustrating an embodiment similar to the embodiment illustrated in FIG. 58 but having trenches filled with metal in accordance with various embodiments of the disclosure.

Referring to FIG. 65, an embodiment device 1400 is illustrated which is similar to the previous device 1200. This embodiment includes trenches filled with metal or metal alloys.

Figure 66:
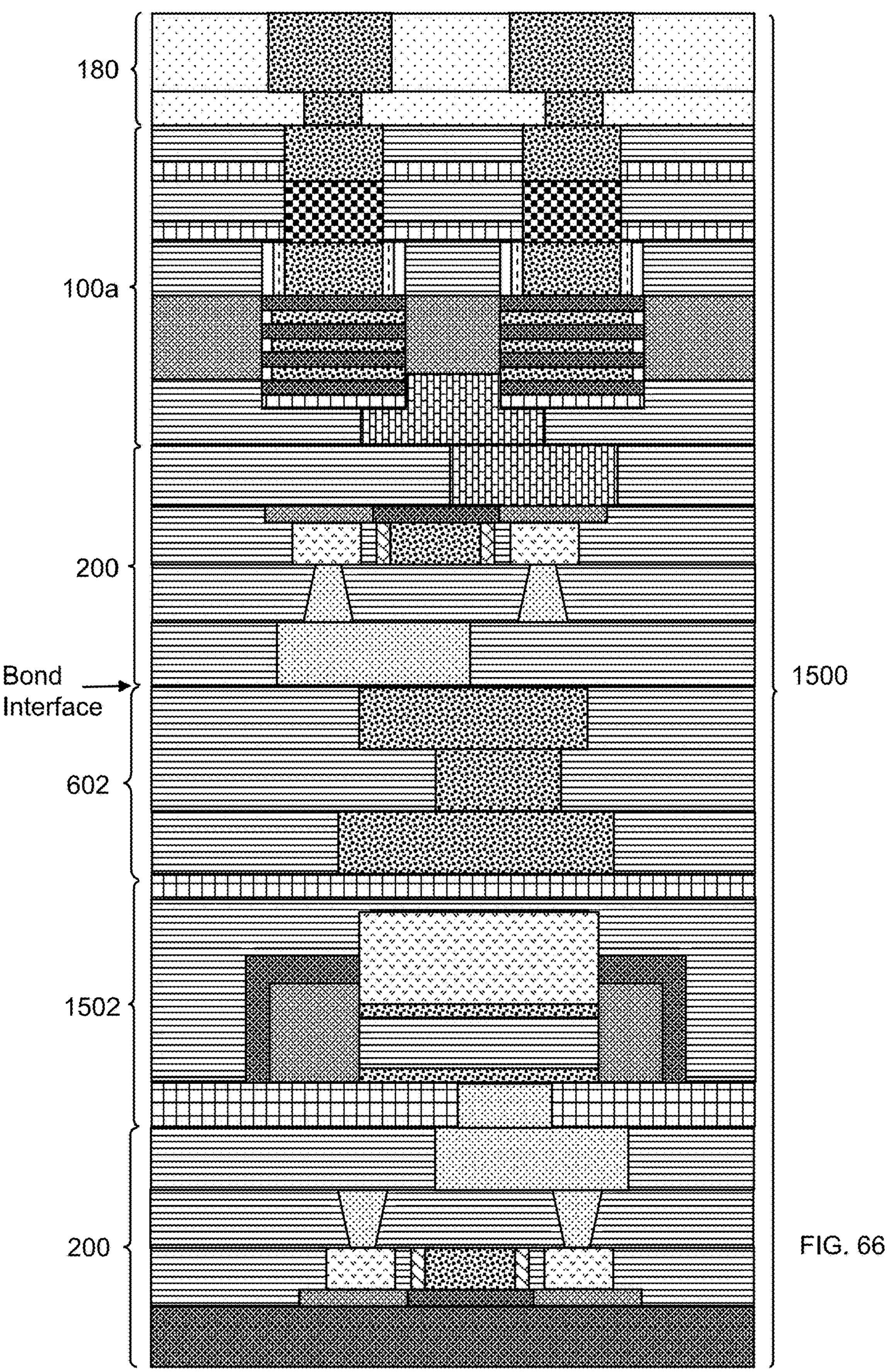
FIG. 66 is a vertical cross-sectional view illustrating an embodiment with a metal-insulating-metal memory first layer, a SRAM second layer and a logic third layer in accordance with various embodiments of the disclosure.

Referring to FIG. 66, an embodiment device 1500 is illustrated with a metal-insulator-metal memory 1502 that may be incorporated. As illustrated, the device 1500 includes a first FinFET 200, a metal-insulator-metal memory 1502, a redistribution layer 602, a second FinFET 200 and a gate all around metal oxide semiconductor field effect transistor device 100*a*.

Figure 67:
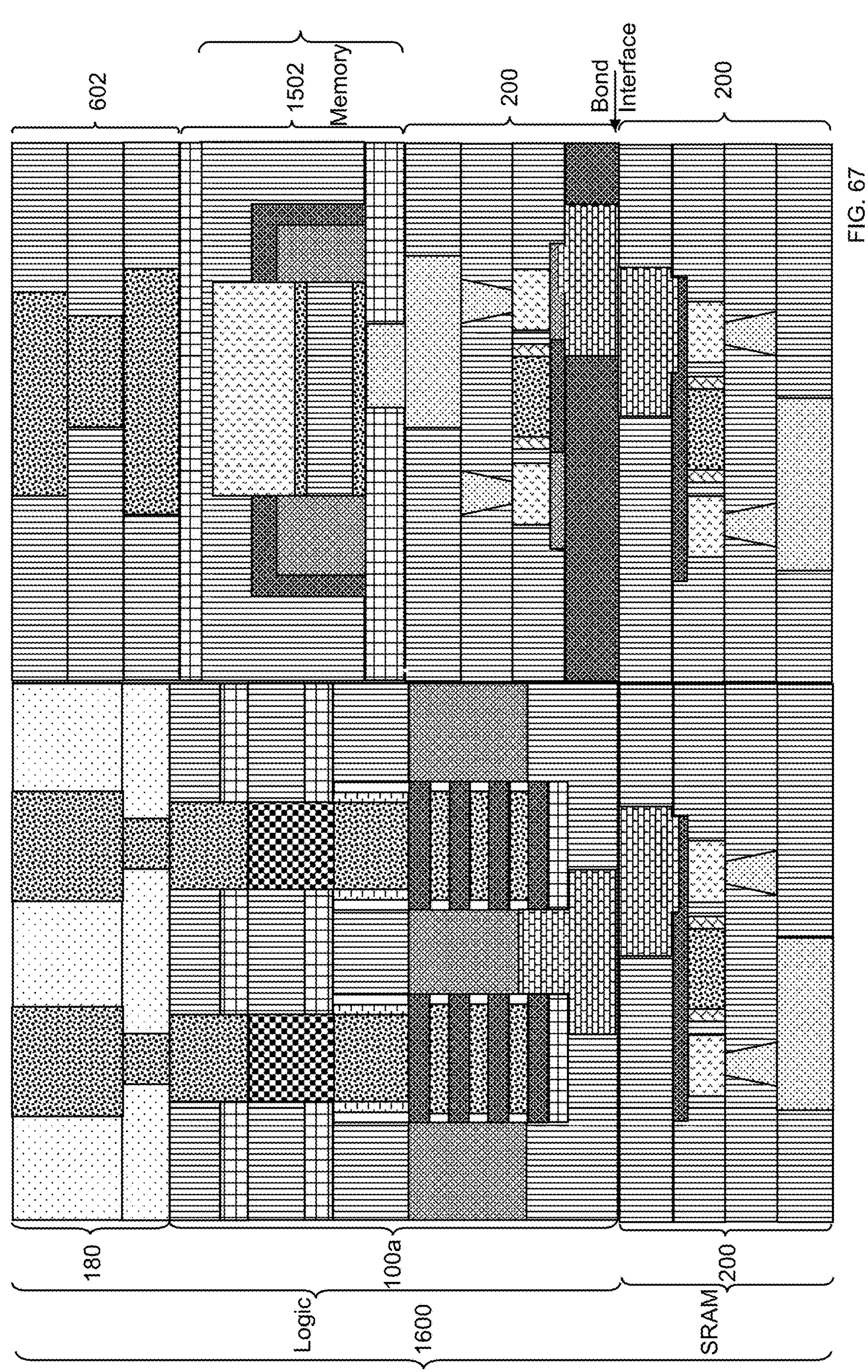
FIG. 67 is a vertical cross-sectional view illustrating an alternative embodiment with a metal-insulating-metal memory first layer, a SRAM second layer and a logic third layer in accordance with various embodiments of the disclosure.

Referring to FIG. 67, another embodiment device 1600 is illustrated in which a metal-insulator-metal memory 1502 may be incorporated. The embodiment device 1600 illustrated in FIG. 67 includes three distinct regions, a logic region, a memory region and a SRAM region. The SRAM region may be formed on a first wafer. The logic and memory regions may be formed on a second wafer which may be bonded to the first wafer. As illustrated in FIG. 59, the SRAM region may be wider than either of the logic or memory regions so that the SRAM region will be operative connected to the logic and memory regions when the first and second wafers are bonded.

Figure 68:
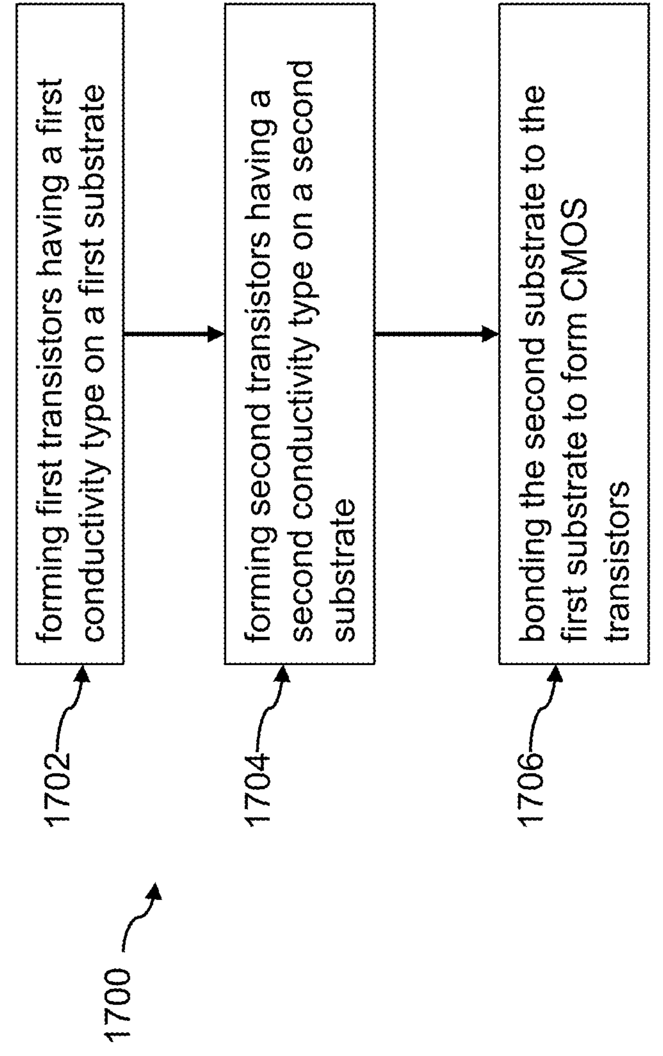
FIG. 68 is a flowchart illustrating a method of making a semiconductor device in accordance with various embodiments of the disclosure.

Referring to FIG. 68 is a flowchart illustrating general method 1700 of making a CMOS device 100*a*, 100*b*, 200 which the PMOS and NMOS transistors are vertically stacked on each other. Referring to step 1702, the method includes forming first transistors 100*a*, 100*b* having a first conductivity type on a first substrate 102. Referring to step 1704, the method includes forming second transistors 200 having a second conductivity type on a second substrate 202. Referring to step 1706, the method includes bonding the device formed over the second substrate 202 to the device formed over the first substrate 102 to form CMOS transistors 300, 400, 500, 600, 700, 800, 900, 1000, 1100, 1200, 1300, 1400, 1500, 1600.

Figure 69:
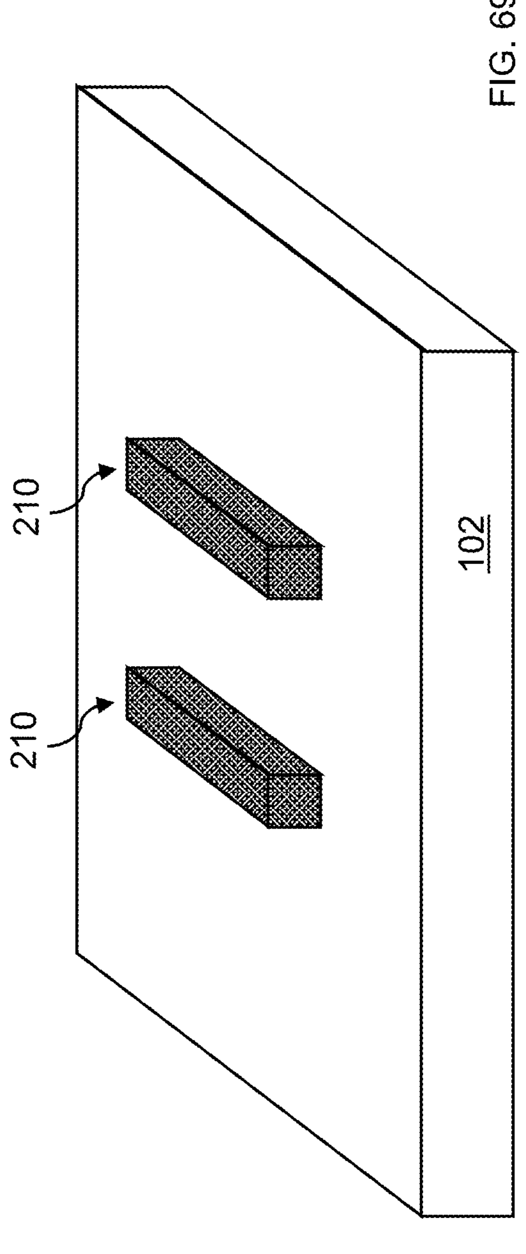
FIG. 69 is a perspective view illustrating a step of forming semiconductor rails of a PMOS FinFET in accordance with various alternative embodiments of the disclosure.

FIGS. 69-76 illustrate steps in an alternative method of making a PMOS FINFET. Referring to FIG. 69, rails 210 of semiconductor material may be formed on a substrate 102. The rails 210 may be formed by first depositing and patterning a photoresist layer (not shown) and then depositing the semiconducting material. Alternatively, a continuous layer of semiconducting material may be deposited and then patterned to form the rails of semiconductor material.

Figure 70:
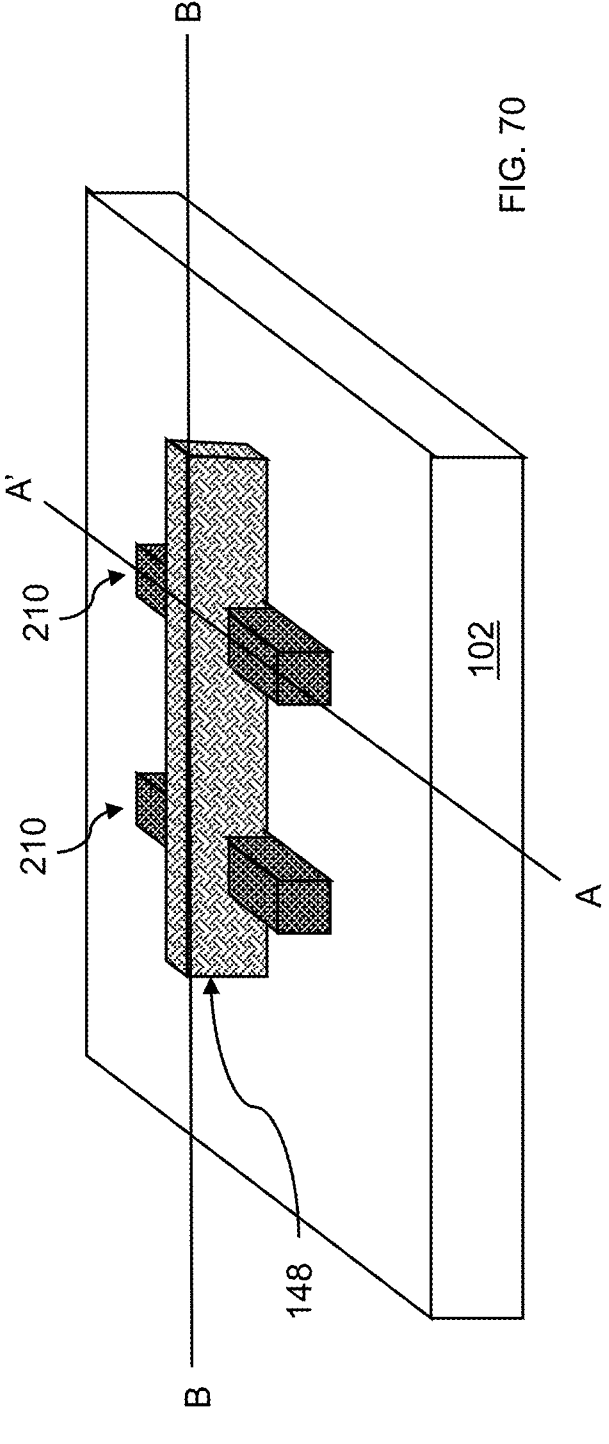
FIG. 70 is a perspective view illustrating a step of forming a gate stack of a PMOS FinFET in accordance with various alternative embodiments of the disclosure.
Figure 71:
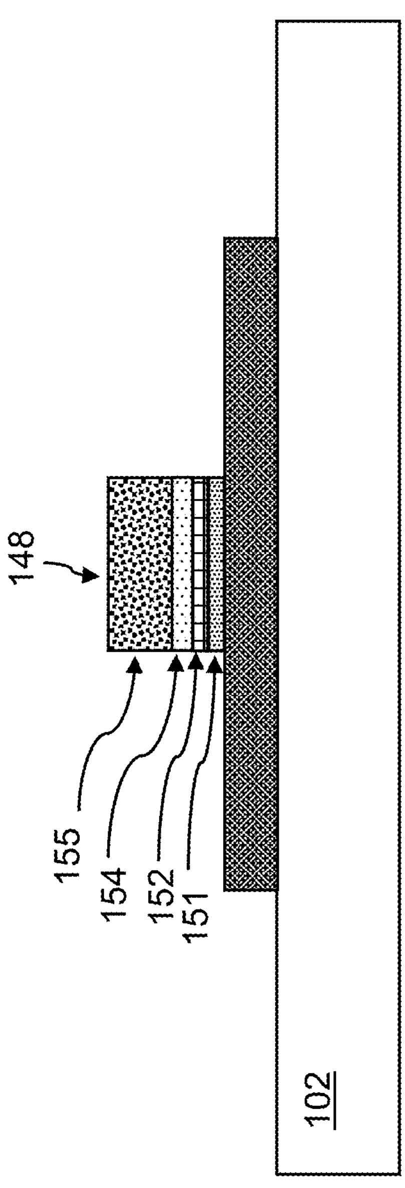
FIG. 71 is a vertical cross-sectional view of the structure of FIG. 70 through line AA' illustrating a cross-section of the intermediate structure in accordance with various embodiments of the disclosure.
Figure 72:
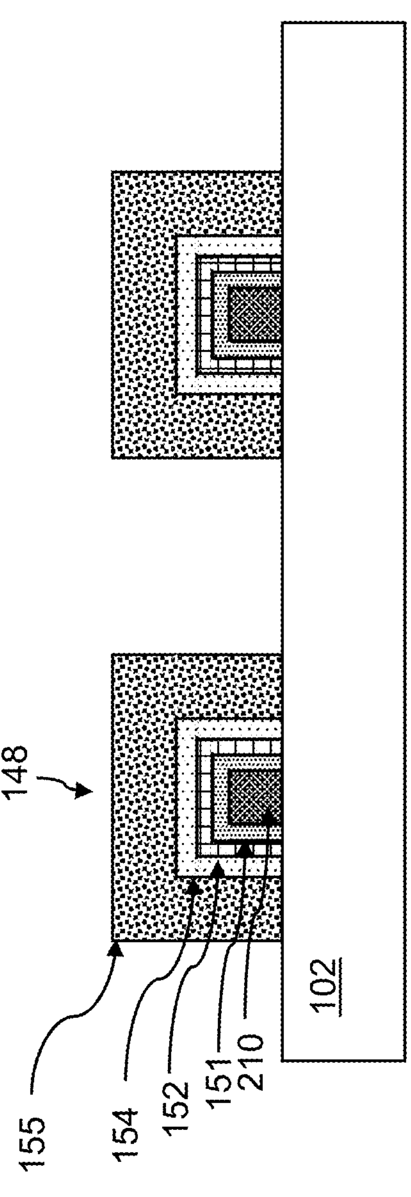
FIG. 72 is a vertical cross-sectional view of the structure of FIG. 70 through line BB' illustrating a cross-section of the intermediate structure in accordance with various embodiments of the disclosure.

Referring to FIGS. 70-72, a gate stack 148 may be formed over the rails 210 of semiconductor material. As illustrated, the gate stack 148 may cover the rails 210 on three sides. As in the embodiments above, the gate stack 148 may comprise a liner layer 151, a wetting layer 152, an adhesion layer 154 and a metal layer 155 conformally deposited over the rails 210 of semiconductor material. The gate stack 148 may be made by any suitable method such by the use of one or more conformal depositions and/or lithographic patterning followed by deposition.

Figure 73:
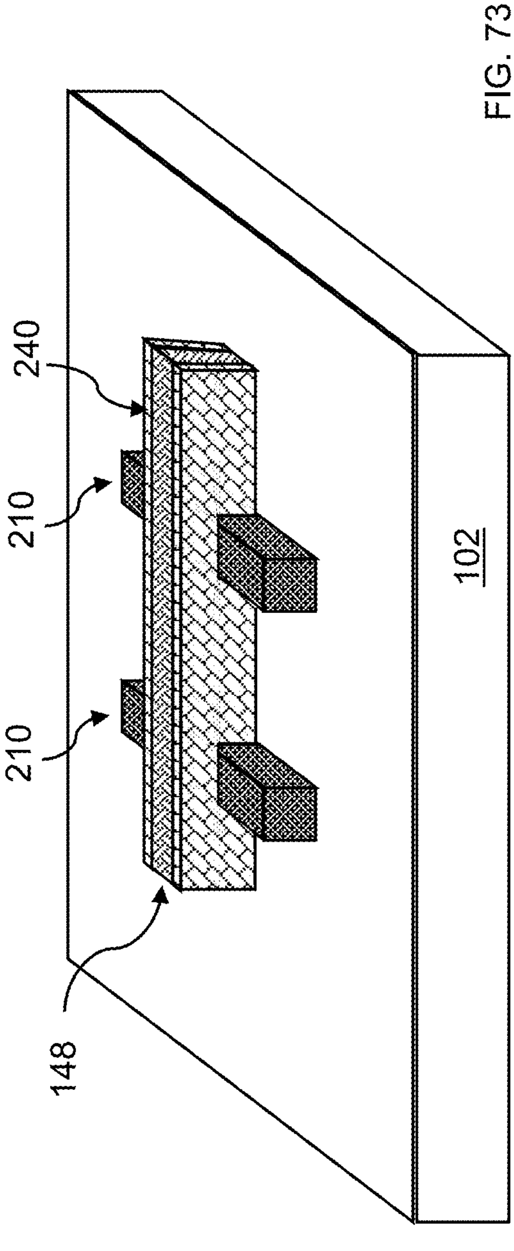
FIG. 73 is a perspective view illustrating a step forming sidewall spacers on the gate stack of a PMOS FinFET in accordance with various alternative embodiments of the disclosure.

Referring to FIG. 73, sidewall spacers 240 may be formed on the sidewalls of the gate stack 148. In various embodiments, the sidewall spacers 240 may be made of an insulating material such as an oxide or nitride although other suitable insulating materials are within the contemplated scope of disclosure.

Figure 74:
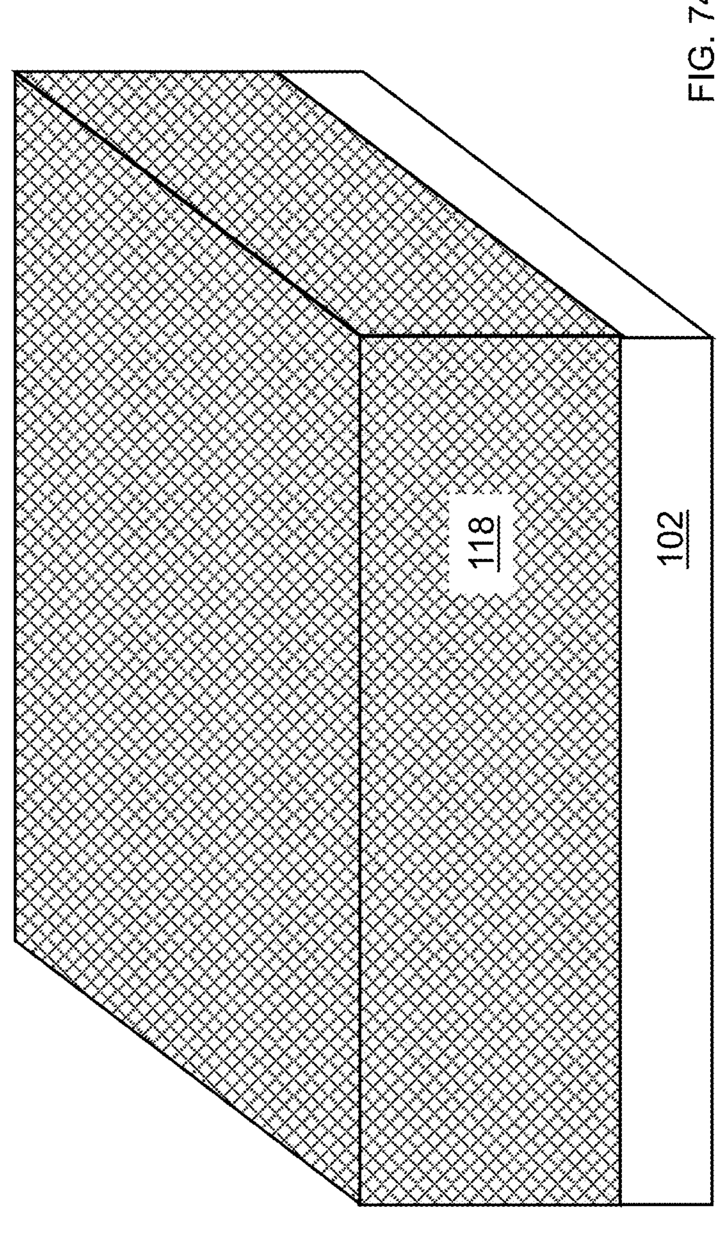
FIG. 74 is a perspective view illustrating a step of depositing a photoresist layer over the intermediate structure illustrated in FIG. 72 in accordance with various alternative embodiments of the disclosure.

Referring to FIG. 74, the intermediate structure illustrated in FIG. 74 may be covered with a photoresist layer 118.

Figure 75:
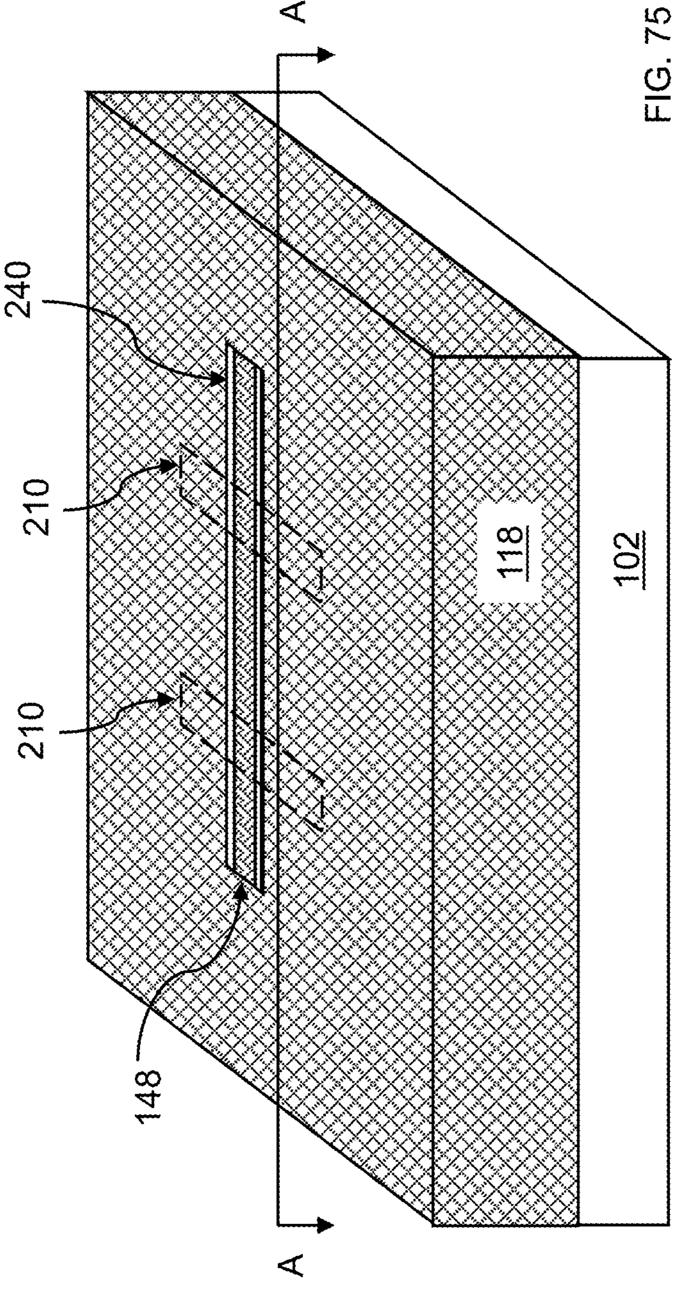
FIG. 75 is a perspective view illustrating a step of polishing the photoresist layer to expose the top surfaces of the gate stack and sidewall spacers in accordance with various alternative embodiments of the disclosure.

Referring to FIG. 75, the photoresist layer 118 may be polished down to expose the tops surfaces of the gate stack 148 and the sidewall spacers 240. The photoresist layer may be polished by any suitable method, such as CMP.

Figure 76:
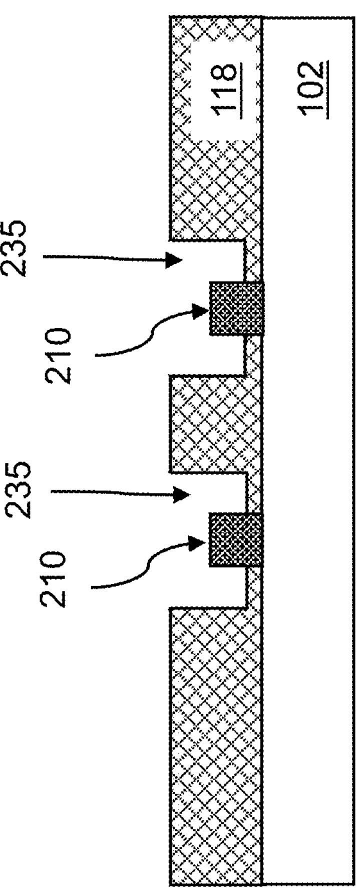
FIG. 76 is a vertical cross-sectional view following line AA in FIG. 74 illustrating a step of forming holes in the photoresist layer above the rails of silicon material in accordance with various alternative embodiments of the disclosure.

FIG. 76 is a vertical cross-sectional view following line AA in FIG. 75 after the formation of holes 235 in the photoresist layer 118. The holes 235 may be formed in the photoresist layer 118 over the rails 210 of semiconducting material. As illustrated, the holes 235 may be wider than the rails 210 of semiconducting material. The holes 235 may run the fill length of the rails 210 of semiconducting material. In an embodiment, the holes 235 do not extend to the surface of the substrate 102. In alternative embodiments, the holes 235 extend to the surface of the substrate 102.

Figure 77:
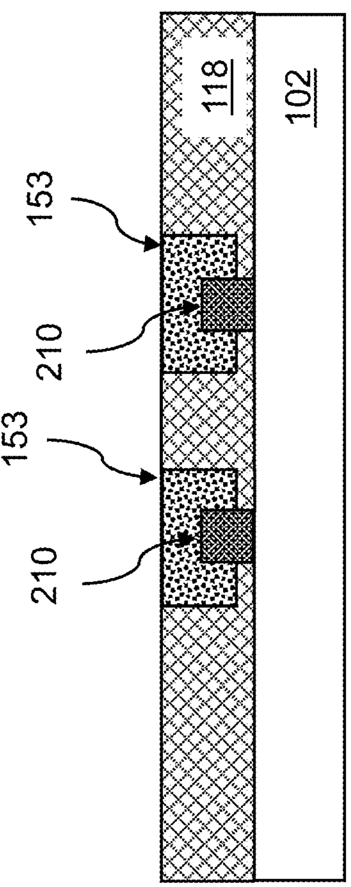
FIG. 77 is a vertical cross-sectional view illustrating a step of depositing active layer material over the rails of silicon material in accordance with various alternative embodiments of the disclosure.

Referring to FIG. 77, doped active region material 153 may be deposited in the holes 235. In some embodiments, the doped active region material 153 may be epitaxially deposited on the rails 210 of semiconducting material, thereby forming active regions 150. ILD layers and interconnects may be formed over the structure illustrated in FIG. 76 as discussed above.

The various embodiment devices and methods for forming the embodiment device allow for increased transistor density in a CMOS device.

In an embodiment, forming the first transistors 100*a*, 100*b* comprises forming gate all around transistors and forming the second transistors 200 comprises forming fin field effect transistors (FinFET). In an embodiment, forming the gate all around transistors comprises forming dummy gate stacks 126. In an embodiment, forming the gate all around transistors comprises removing the dummy gate stacks 126 and forming a gate stacks 148 comprising a liner layer 151, a wetting layer 152, an adhesion layer 154 and a metal layer 155. In an embodiment, the method further includes forming the gate all around transistors in a logic region and metal-insulator-metal memory devices in a memory region on the first substrate 102 and the FinFETs in a static random access memory (SRAM) region on the second substrate 202. In an embodiment, bonding the device formed over the second substrate 202 to the device formed over the first substrate 102 comprises hybrid bonding. In an embodiment, the method further includes forming at least one redistribution layer 602 between the first transistors 100*a*, 100*b* and the second transistors 200.

Various embodiments of the present disclosure may provide NMOS transistors and PMOS transistors which may be separately fabricated on respective first and second substrates 102, 202 and then bonded to each other for form CMOS devices. The resulting CMOS devices have a higher transistor density than CMOS devices in which the NMOS and PMOS transistors are made side by side on the same substrate. Other devices, such as metal-insulator-metal memory devices may be formed on either of the NMOS or PMOS substrates and incorporated into the finished integrated CMOS devices. As discussed in more detail below, the NMOS and PMOS transistors may include gate all around (GAA) transistors which have gate electrodes that formed on four sides, i.e. surround, at least a portion of the channel of the transistor and/or FinFETS which include fin shaped electrodes which may be formed on at least two, and often, three sides of a least a portion of the channel of the transistor.

Referring to all drawings and according to various embodiments of the present disclosure, a MOSFET device including a complementary metal oxide semiconductor (CMOS) device 300, 400, 500, 600, 700, 800, 900, 1000, 1100, 1200, 1300, 1400, 1500, 1600 including a transistor of a first type 100*a*, 100*b* formed on a first substrate 102 and a transistor of a second type 200 formed on a second substrate 202. The CMOS device 300, 400, 500, 600, 700, 800, 900, 1000, 1100, 1200, 1300, 1400, 1500, 1600 is formed when the transistor of a first type 100*a*, 100*b* formed over the first substrate 102 is bonded to the transistor of a second type 200 formed over the second substrate 202.

According to another embodiment of the present disclosure, an integrated circuit including complementary metal oxide semiconductor (CMOS) transistors 300, 400, 500, 600, 700, 800, 900, 1000, 1100, 1200, 1300, 1400, 1500, 1600 in which transistors of a first type 100*a*, 100*b* are formed on a first substrate 102, transistors of a second type 200 are formed on a second substrate 202. The transistors of a second type 200 formed over the second substrate 202 are bonded to the transistors of a first type 100*a*, 100*b* formed over the first substrate 102 to form the CMOS transistors 300, 400, 500, 600, 700, 800, 900, 1000, 1100, 1200, 1300, 1400, 1500, 1600.

Another embodiment is drawn to a method of making a complementary metal oxide semiconductor (CMOS) device 300, 400, 500, 600, 700, 800, 900, 1000, 1100, 1200, 1300, 1400, 1500, 1600 including forming first transistors 100*a*, 100*b* having a first conductivity type on a first substrate 102, forming second transistors 200 having a second conductivity type on a second substrate 202, and bonding transistors 100*a*, 100*b* having a first conductivity type on a first substrate 102 to over the second substrate 202 is bonded to the device formed over the first substrate 102 to second transistors 200 having a second conductivity type formed over the second substrate 202 to form CMOS transistors 300, 400, 500, 600, 700, 800, 900, 1000, 1100, 1200, 1300, 1400, 1500, 1600.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first transistor including a plurality of gate stacks and a metal contact between the plurality of gate stacks; and a second transistor bonded to the first transistor and electrically coupled to the first transistor by the metal contact, wherein the metal contact is between the plurality of gate stacks and the second transistor, wherein the second transistor comprises:

an interlayer dielectric (ILD) layer bonded to a dielectric layer of the first transistor; and a back end of the line (BEOL) metal contact in the ILD layer bonded to the metal contact of the first transistor, wherein an upper surface of the ILD layer is coplanar with an upper surface of the BEOL metal contact, and a hybrid bond interface between the first transistor and the second transistor is located at the upper surface of the ILD layer and the upper surface of the BEOL metal contact.

2. The semiconductor device of claim 1, wherein the first transistor further comprises a semiconductor layer including an active region between the plurality of gate stacks, and the metal contact contacts the active region between the plurality of gate stacks.

3. The semiconductor device of claim 1, wherein the first transistor further comprises a dielectric layer and the metal contact is in the dielectric layer.

4. The semiconductor device of claim 3, wherein the dielectric layer is located between the plurality of gate stacks and the second transistor.

5. The semiconductor device of claim 1, wherein the second transistor further comprises a gate stack and the BEOL metal contact is between the gate stack and the metal contact of the first transistor.

6. The semiconductor device of claim 1, wherein the second transistor further comprises an active region contact and the BEOL metal contact is between the active region contact and a gate stack of the plurality of gate stacks in the first transistor.

7. The semiconductor device of claim 1, wherein the first transistor comprises a gate all around metal oxide semiconductor field effect transistor.

8. The semiconductor device of claim 1, wherein the second transistor comprises a fin field effect transistor (FinFET).

9. The semiconductor device of claim 1, wherein the first transistor comprises a first type and the second transistor comprises a second type different than the first type.

10. The semiconductor device of claim 9, wherein the first transistor and the second transistor comprise complementary metal oxide semiconductor (CMOS) transistors.

11. A semiconductor device, comprising:

a fin-shaped field effect transistor (FinFET); and a gate-all-around field effect transistor (GAAFET) bonded to the FinFET, comprising:

a plurality of gate stacks; and a metal contact between the plurality of gate stacks and the FinFET and configured to electrically couple the GAAFET to the FinFET, wherein the GAAFET further comprises a semiconductor layer comprising an active region between the plurality of gate stacks, the metal contact contacts the active region of the semiconductor layer between the plurality of gate stacks, and the metal contact of the GAAFET comprises:

an inner portion contacting the active region of the GAAFET and having a first thickness; and an outer portion contacting the plurality of gate stacks and having a second thickness less than the first thickness.

12. The semiconductor device of claim 11, wherein the FinFET comprises:

an interlayer dielectric (ILD) layer; and an interconnect in the ILD layer bonded to the metal contact of the GAAFET.

13. The semiconductor device of claim 12, wherein the FinFET further comprises:

an active region electrically coupled to the interconnect of the FinFET;

a channel region adjacent the active region of the FinFET; and a gate stack on the channel region, wherein the metal contact of the GAAFET is located over the gate stack of the FinFET.

14. The semiconductor device of claim 12, wherein the GAAFET further comprises a dielectric layer bonded to the ILD layer of the FinFET, the metal contact is in the dielectric layer, and the metal contact and the dielectric layer are located between the plurality of gate stacks and the FinFET.

15. A method of forming a semiconductor device, the method comprising:

providing a first transistor including a plurality of gate stacks and a metal contact between the plurality of gate stacks;

providing a second transistor; and bonding the first transistor to the second transistor such that the metal contact is between the plurality of gate stacks and the second transistor and electrically couples the first transistor to the second transistor, wherein the first transistor further comprises a dielectric layer and the metal contact is in the dielectric layer, the second transistor comprises an interlayer dielectric (ILD) layer and a back end of the line (BEOL) metal contact in the ILD layer, the bonding of the first transistor to the second transistor comprises bonding the dielectric layer of the first transistor to the ILD layer of the second transistor and bonding the metal contact of the first transistor to the BEOL metal contact of the second transistor, and an upper surface of the ILD layer is coplanar with an upper surface of the BEOL metal contact, and a hybrid bond interface between the first transistor and the second transistor is located at the upper surface of the ILD layer and the upper surface of the BEOL metal contact.

16. The semiconductor device of claim 1, further comprising at least one redistribution layer between the first transistor and the second transistor.

17. The semiconductor device of claim 11, further comprising at least one redistribution layer between the GAAFET and the FinFET.

18. The semiconductor device of claim 1, wherein the first transistor comprises an NMOS device and the second transistor comprises a PMOS device.

19. The semiconductor device of claim 11, wherein the plurality of gate stacks comprise a liner layer, a wetting layer, an adhesion layer, and a metal layer.

20. The semiconductor device of claim 1, further comprising back end of the line (BEOL) metal routing configured to connect the first transistor and the second transistor to form an integrated circuit device.

* * * * *